(12) United States Patent
Lim et al.

(10) Patent No.: US 11,225,549 B2
(45) Date of Patent: Jan. 18, 2022

(54) COPOLYMER AND ORGANIC SOLAR CELL INCLUDING SAME

(71) Applicant: LG Chem, Ltd., Seoul (KR)

(72) Inventors: Bogyu Lim, Daejeon (KR); Ji Hoon Kim, Daejeon (KR); Songrim Jang, Daejeon (KR); Doowhan Choi, Daejeon (KR)

(73) Assignee: LG Chem, Ltd.

( * ) Notice: Subject to any disclaimer, the term of this patent is extended or adjusted under 35 U.S.C. 154(b) by 101 days.

(21) Appl. No.: 16/481,656

(22) PCT Filed: Jun. 22, 2018

(86) PCT No.: PCT/KR2018/007080
§ 371 (c)(1),
(2) Date: Jul. 29, 2019

(87) PCT Pub. No.: WO2019/009543
PCT Pub. Date: Jan. 10, 2019

(65) Prior Publication Data
US 2019/0390001 A1    Dec. 26, 2019

(30) Foreign Application Priority Data
Jul. 6, 2017 (KR) .................. 10-2017-0085866

(51) Int. Cl.
*C08G 61/12*   (2006.01)
*H01L 51/00*   (2006.01)
*H01L 51/50*   (2006.01)

(52) U.S. Cl.
CPC ........ *C08G 61/126* (2013.01); *H01L 51/0067* (2013.01); *H01L 51/0068* (2013.01);
(Continued)

(58) Field of Classification Search
CPC .............. C08G 61/126; C08G 2261/12; C08G 2261/3223; C08G 2261/3243;
(Continued)

(56) References Cited

U.S. PATENT DOCUMENTS 5,821,002 A    10/1998   Ohnishi et al.
9,156,947 B2 *   10/2015   Hsu .................. C08G 75/32
(Continued)

FOREIGN PATENT DOCUMENTS

JP   H0945478 A    2/1997
JP   2010084131 A   4/2010
(Continued)

OTHER PUBLICATIONS

Wang X, Su Q, Li Y, Cheng C, Xia Y, He L, Li H, Shu G, Wang F. Synthesis and photovoltaic properties of donor-acceptor conjugated polymers based on 4, 7-dithienyl-2, 1, 3-benzothiadiazole functionalized silole. Synthetic Metals. Oct. 1, 2016;220:433-9.
(Continued)

*Primary Examiner* — Devina Pillay
(74) *Attorney, Agent, or Firm* — Lerner, David, Littenberg, Krumholz & Mentlik, LLP

(57) ABSTRACT

The present specification provides a copolymer including: a repeating unit derived from a compound represented by Formula 1; a first conjugated monomer; and a second conjugated monomer different from the first conjugated monomer, and an organic solar cell including the same.

20 Claims, 4 Drawing Sheets

(52) U.S. Cl.
CPC ...... *H01L 51/0072* (2013.01); *H01L 51/0074* (2013.01); *C08G 2261/12* (2013.01); *C08G 2261/3223* (2013.01); *C08G 2261/3243* (2013.01); *C08G 2261/3246* (2013.01); *H01L 51/5064* (2013.01); *H01L 51/5072* (2013.01); *H01L 51/5092* (2013.01)

(58) Field of Classification Search
CPC .... C08G 2261/3246; C08G 2261/5064; C08G 2261/122; C08G 2261/91; C08G 2261/149; C08G 2261/312; C08G 2261/414; C08G 2261/146; C08G 2261/364; C08G 2261/344; C08G 2261/148; C08G 2261/1424; C08G 2261/1412; H01L 51/0067; H01L 51/0068; H01L 51/0072; H01L 51/0074; H01L 51/5072; H01L 51/5092; H01L 51/0036; H01L 51/4253; H01L 51/0043
See application file for complete search history.

(56) References Cited

U.S. PATENT DOCUMENTS

| | | | |
|---|---|---|---|
| 2011/0156018 A1 | 6/2011 | Moriwaki et al. | |
| 2015/0076418 A1 | 3/2015 | Blouin et al. | |
| 2016/0155947 A1* | 6/2016 | Kim | C08G 75/00 136/263 |
| 2016/0194439 A1* | 7/2016 | Qin | C08G 61/126 252/501.1 |
| 2018/0013069 A1* | 1/2018 | Yan | C08G 61/124 |

FOREIGN PATENT DOCUMENTS

| | | | | |
|---|---|---|---|---|
| JP | 2015518497 A | 7/2015 | | |
| KR | 20110057199 A | 5/2011 | | |
| KR | 20130090304 A | 8/2013 | | |
| KR | 20160043858 A | 4/2016 | | |
| TW | 201016746 A | 5/2010 | | |
| WO | WO-2014074028 A2 * | 5/2014 | ......... | H01L 51/0036 |
| WO | 2015013747 A1 | 2/2015 | | |
| WO | 2016065136 A1 | 4/2016 | | |

OTHER PUBLICATIONS

Klimovich IV, Prudnov FA, Inasaridze LN, Kuznetsov IE, Peregudov AS, Troshin PA. 5, 6-Bis (octyloxy)-2,1, 3-benzoxadiazole-based (X-DADAD) n polymers incorporating electron-donor building blocks used as photoactive materials in organic solar cells. Mendeleev Communications. 2017;2(27):207-9.

Tang CW. Two-layer organic photovoltaic cell. Applied physics letters. Jan. 13, 1986;48(2):183-5.

Yu G, Gao J, Hummelen JC, Wudl F, Heeger AJ. Polymer photovoltaic cells: enhanced efficiencies via a network of internal donor-acceptor heterojunctions. Science. Dec. 15, 1995;270(5243):1789-91.

Search Report from Taiwanese Office Action dated Apr. 26, 2019 for TW107122713.

International Search Report for PCT/KR2018/007080 dated Oct. 10, 2018.

\* cited by examiner

[Figure 1]
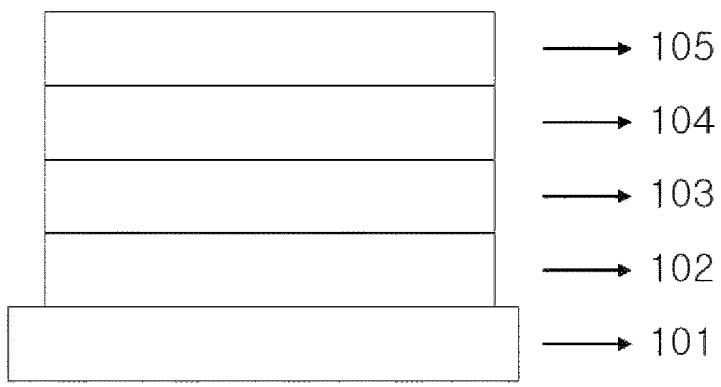
[Figure 2]
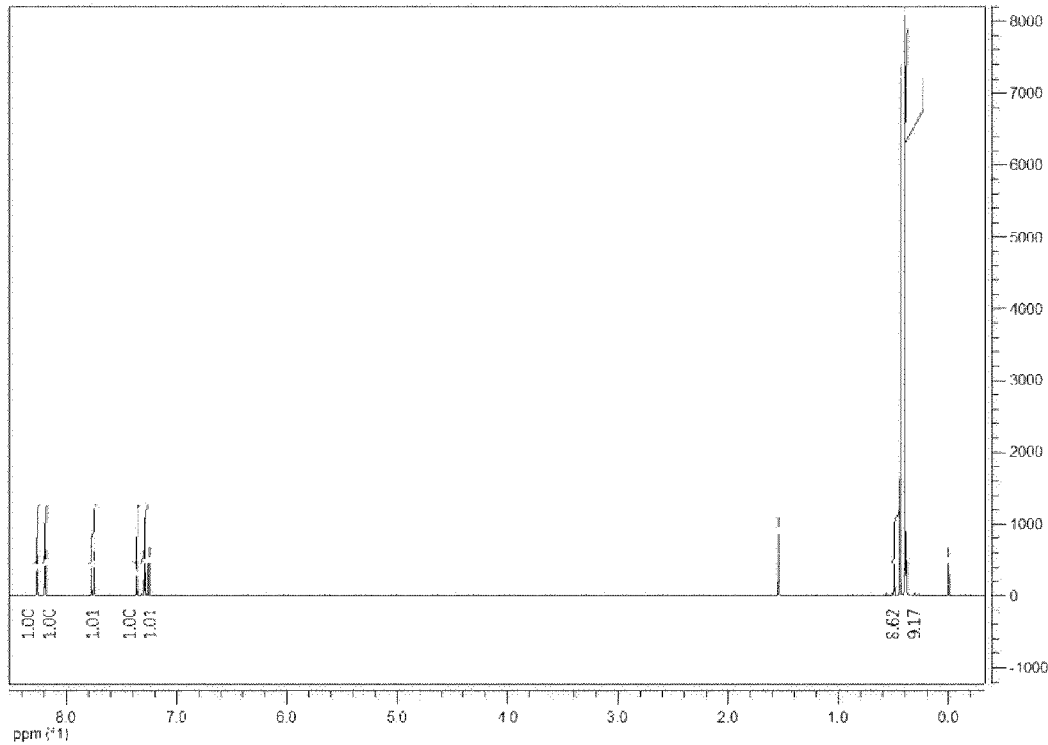

[Figure 3]
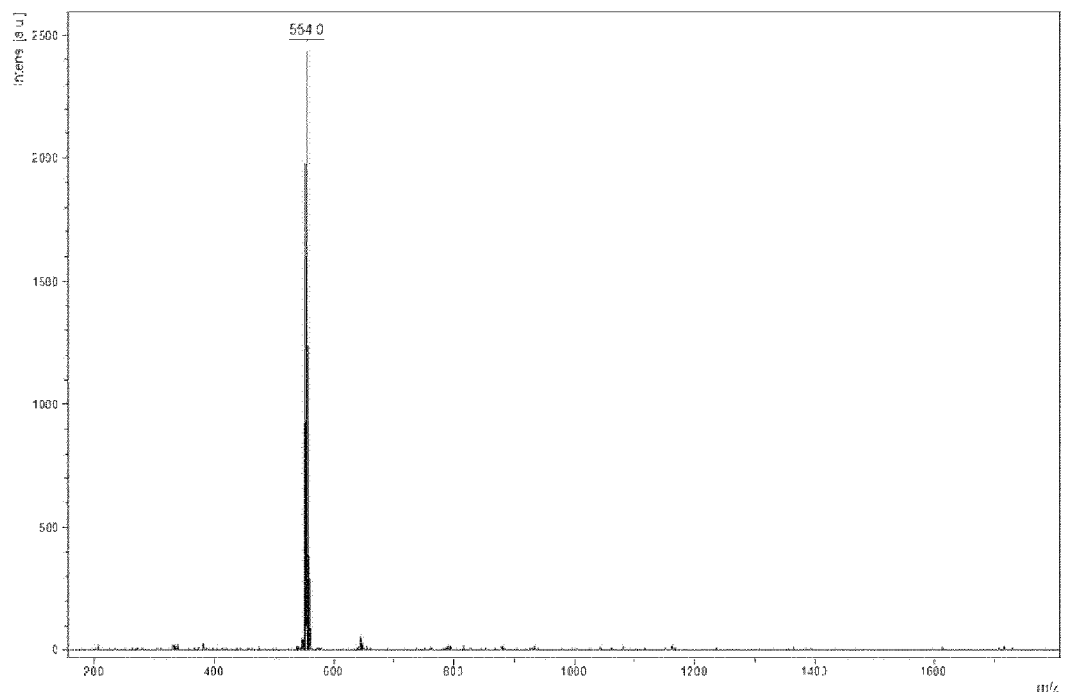
[Figure 4]
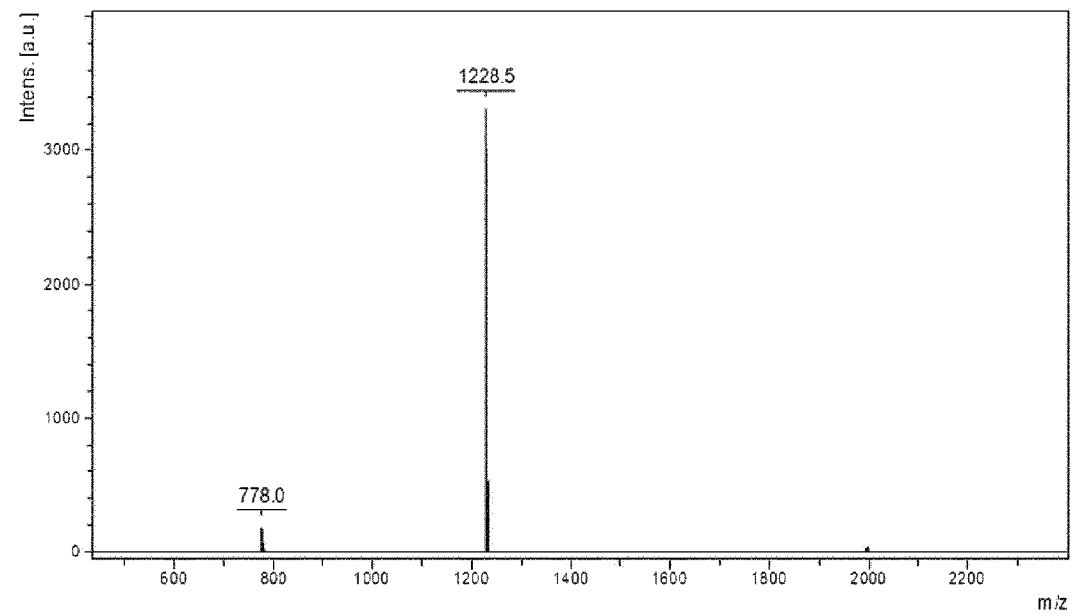

[Figure 5]
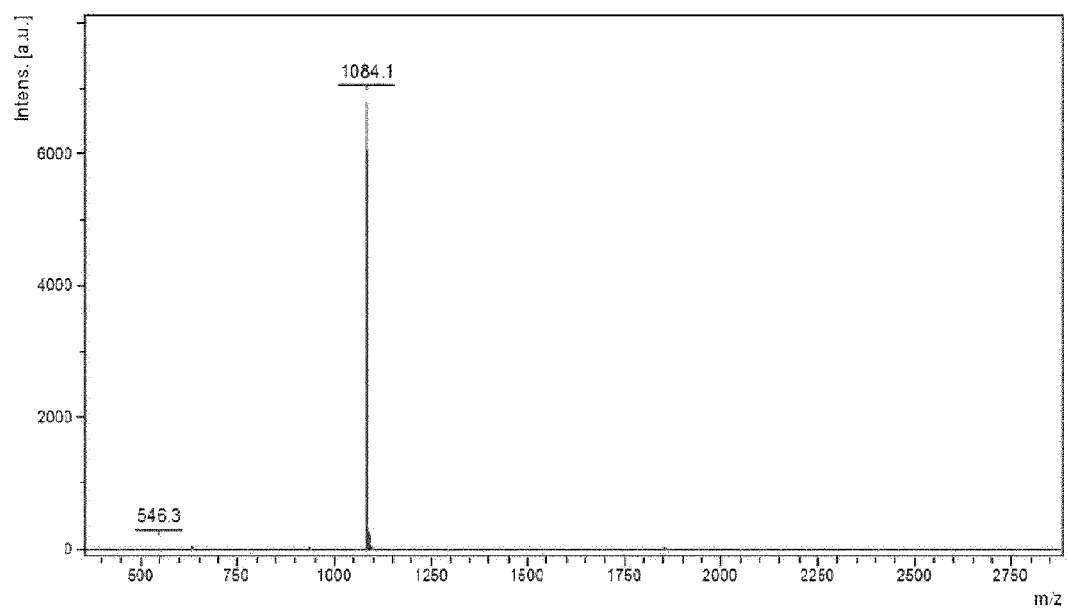
[Figure 6]
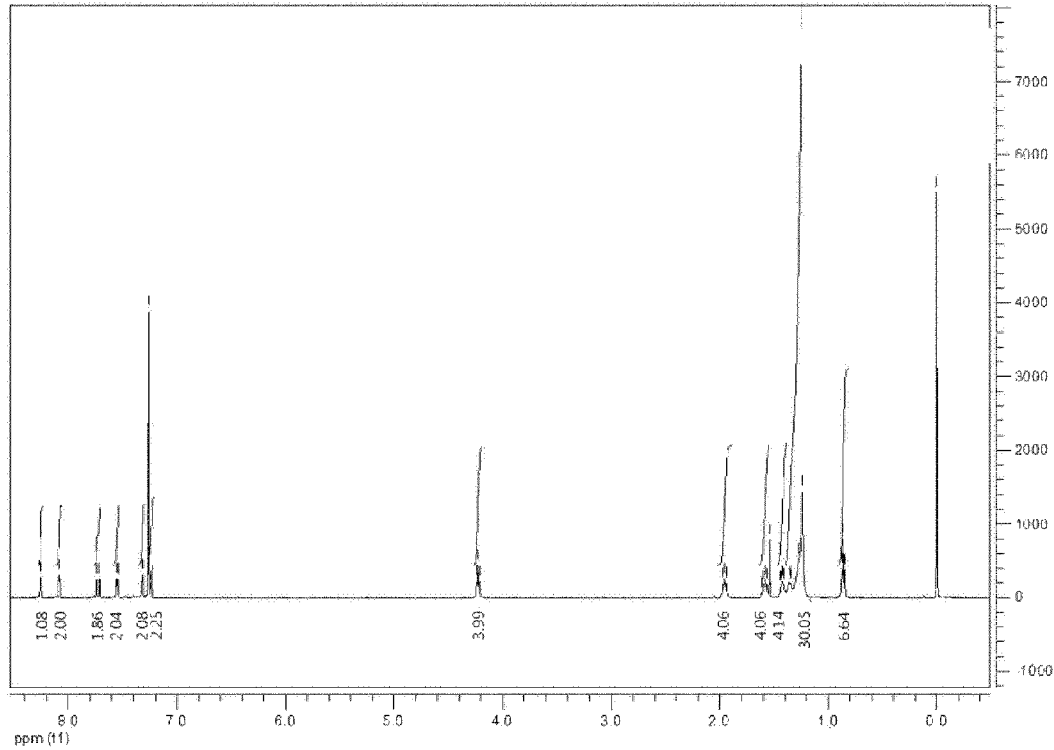

[Figure 7]
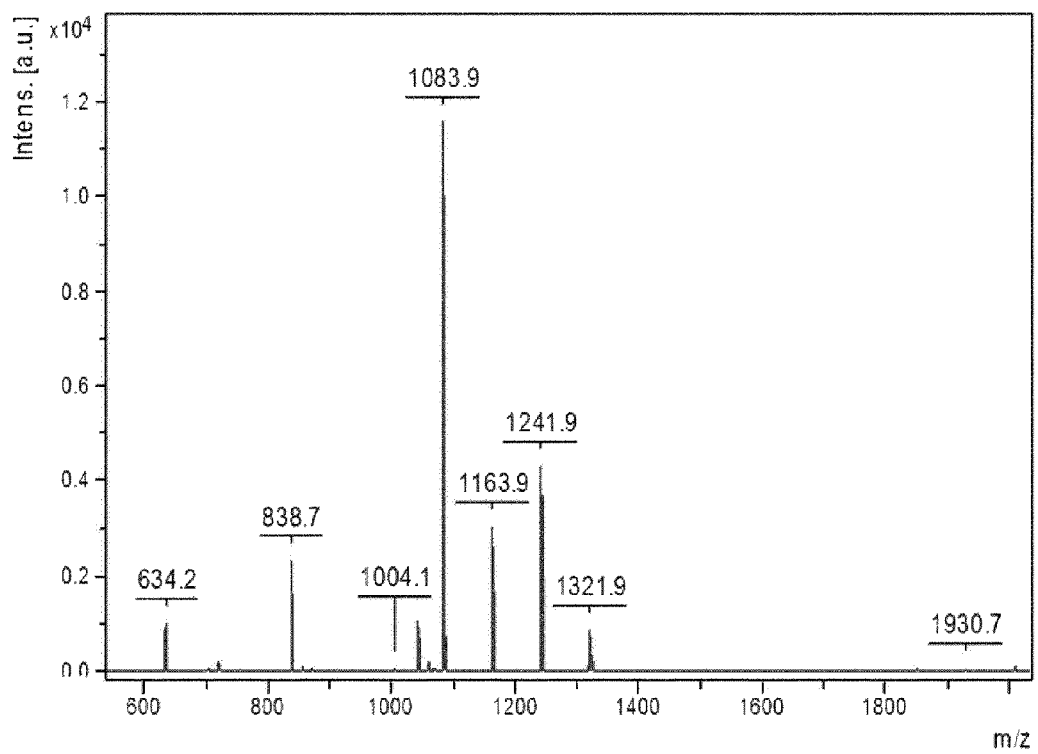

COPOLYMER AND ORGANIC SOLAR CELL INCLUDING SAME

CROSS-REFERENCE TO RELATED APPLICATIONS

The present application is a national phase entry under 35 U.S.C. § 371 of International Application No. PCT/KR2018/007080 filed Jun. 22, 2018, which claims priority from Korean Patent Application No. 10-2017-0085866 filed Jul. 6, 2017, all of which are incorporated herein by reference.

TECHNICAL FIELD

The present specification relates to a copolymer and an organic solar cell including the same.

BACKGROUND ART

An organic solar cell is a device which may directly convert solar energy into electric energy by applying a photovoltaic effect. A solar cell may be divided into an inorganic solar cell and an organic solar cell, depending on the materials constituting a thin film. Typical solar cells are made through a p-n junction by doping crystalline silicon (Si), which is an inorganic semiconductor. Electrons and holes generated by absorbing light diffuse to p-n junction points and move to an electrode while being accelerated by the electric field. The power conversion efficiency in this process is defined as the ratio of electric power given to an external circuit and solar power entering the solar cell, and the efficiency have reached approximately 24% when measured under a currently standardized virtual solar irradiation condition. However, since inorganic solar cells in the related art have already shown the limitation in economic feasibility and material demands and supplies, an organic semiconductor solar cell, which is easily processed and inexpensive and has various functionalities, has come into the spotlight as a long-term alternative energy source.

For the solar cell, it is important to increase efficiency so as to output as much electric energy as possible from solar energy. In order to increase the efficiency of the solar cell, it is important to generate as many excitons as possible inside a semiconductor, but it is also important to pull the generated charges to the outside without loss. One of the reasons for the charge loss is the dissipation of generated electrons and holes due to recombination. Various methods have been proposed to deliver generated electrons and holes to an electrode without loss, but additional processes are required in most cases, and accordingly, manufacturing costs may be increased.

DETAILED DESCRIPTION OF THE INVENTION

Technical Problem

An object of the present specification is to provide a copolymer and an organic solar cell including the same.

Technical Solution

The present specification provides a copolymer including: a repeating unit derived from a compound represented by the following Formula 1;

a first conjugated monomer; and a second conjugated monomer different from the first conjugated monomer.

[Formula 1]

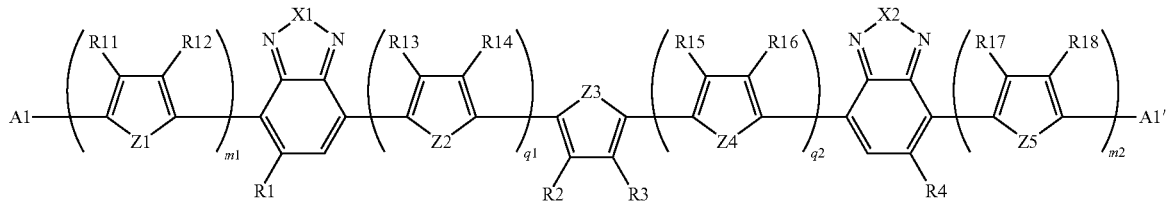

In Formula 1, m1 and m2 are the same as or different from each other, and are each independently an integer from 0 to 5, when m1 and m2 are each 2 or more, the structures in the parenthesis are the same as or different from each other, q1 and q2 are the same as or different from each other, and are each independently an integer from 1 to 5, when q1 and q2 are each 2 or more, the structures in the parenthesis are the same as or different from each other, A1 and A1' are the same as or different from each other, and are each independently a halogen group; a substituted or unsubstituted boron group; or —$SnR_aR_bR_c$, X1, X2, and Z1 to Z5 are the same as or different from each other, and are each independently S, O, Se, Te, NR, CRR', SiRR', PR, or GeRR', and $R_a$, $R_b$, $R_c$, R, R', R1 to R4, and R11 to R18 are the same as or different from each other, and are each independently hydrogen; deuterium; a halogen group; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heterocyclic group.

Another exemplary embodiment of the present specification provides a method for preparing a copolymer, the method including: allowing a first compound represented by the following Formula 1, a second compound represented by the following Formula 2, and a third compound represented by the following Formula 3 to react with one another.

a second electrode provided to face the first electrode; and an organic material layer having one or more layers provided between the first electrode and the second electrode and including a photoactive layer, in which one or more layers of the organic material layer include the copolymer.

[Formula 1]

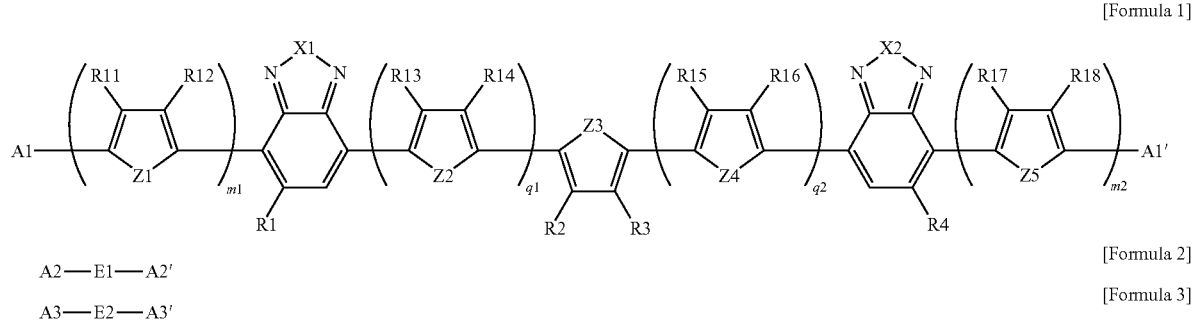

A2—E1—A2'      [Formula 2]

A3—E2—A3'      [Formula 3]

In Formulae 1 to 3, m1 and m2 are the same as or different from each other, and are each independently an integer from 0 to 5, when m1 and m2 are each 2 or more, the structures in the parenthesis are the same as or different from each other, q1 and q2 are the same as or different from each other, and are each independently an integer from 1 to 5, when q1 and q2 are each 2 or more, the structures in the parenthesis are the same as or different from each other, A1, A1', A2, A2', A3, and A3' are the same as or different from each other, and are each independently a halogen group; a substituted or unsubstituted boron group; or —Sn-$R_aR_bR_c$, E1 is a first conjugated monomer, E2 is a second conjugated monomer different from the first conjugated monomer, X1, X2, and Z1 to Z5 are the same as or different from each other, and are each independently S, O, Se, Te, NR, CRR', SiRR', PR, or GeRR', and $R_a$, $R_b$, $R_c$, R1 to R4, and R11 to R18 are the same as or different from each other, and are each independently hydrogen; deuterium; a halogen group; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heterocyclic group.

Still another exemplary embodiment of the present specification provides an organic solar cell including: a first electrode;

Advantageous Effects

A copolymer according to an exemplary embodiment of the present specification exhibits planarity and thus has excellent aggregation characteristics and crystallinity.

The copolymer according to an exemplary embodiment of the present specification may have effects of decreasing a band gap and/or increasing an amount of light absorbed. Accordingly, as the copolymer according to an exemplary embodiment of the present specification exhibits a high current value (Isc) when applied to an organic solar cell, the copolymer may exhibit excellent efficiency.

The copolymer according to an exemplary embodiment of the present specification implements high efficiency, and simultaneously, has appropriate solubility, and thus has an economic advantage in terms of time and/or costs during the manufacture of a device.

The copolymer according to an exemplary embodiment of the present specification may be used either alone or in mixture with other materials in an organic solar cell.

BRIEF DESCRIPTION OF DRAWINGS

FIG. 1 is a view illustrating an organic solar cell according to an exemplary embodiment of the present specification.

FIG. 2 is a view illustrating an NMR spectrum of Compound 1-d.

FIG. 3 is a view illustrating an MS spectrum of Compound 1-d.

FIG. 4 is a view illustrating an MS spectrum of Compound 1-e.

FIG. 5 is a view illustrating an MS spectrum of Compound 1-f.

FIG. 6 is a view illustrating an NMR spectrum of Compound 1-f.

FIG. 7 is a view illustrating an MS spectrum of Compound 1-g.

BEST MODE

Hereinafter, the present specification will be described in detail.

An exemplary embodiment of the present specification provides a copolymer including: a repeating unit derived from a compound represented by the Formula 1; a first conjugated monomer; and a second conjugated monomer different from the first conjugated monomer.

The repeating unit derived from the compound represented by Formula 1 includes a structure of thiophene having electron donor properties and benzothiadiazole having electron acceptor properties. Accordingly, planarity is excellent due to the intramolecular interaction between the thiophene and the benzothiadiazole, so that the crystallinity is improved.

Further, the repeating unit derived from the compound represented by Formula 1 has excellent crystallinity by having region-regularity in which R1 and R4 are substituted at predetermined positions.

The region-regularity in the present specification means that a substituent is provided in a predetermined direction in a structure in a polymer. For example, in Formula 1, the region-regularity means that R1 and R4 are substituted at a position relatively distant from a heterocyclic group having Z3.

In the present specification, the term "derived" means that a new bond is generated while a bond between at least two adjacent elements in a compound is broken, or hydrogen or a substituent is detached, and a unit derived from the compound may mean a unit which forms one or more of a main chain and a side chain in a copolymer. The unit may be included in a main chain in a copolymer to constitute the copolymer.

In the present specification, "repeating unit" means a structure in which one type of a plurality of monomers is bonded in a copolymer by polymerization as a structure in which a unit derived from the monomer is repeatedly included in the copolymer.

In an exemplary embodiment of the present specification, "a repeating unit derived from a compound represented by Formula 1" may be a repeating unit including the following structure in a main chain.

Examples of the substituents in the present specification will be described below, but are not limited thereto.

In the present specification,

means a site bonded to another substituent, a monomer, or a binding portion.

In the present specification, a monomer may mean a repeating unit included in a polymer.

Examples of the substituents in the present specification will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more are substituted, the two or more substituents may be the same as or different from each other.

In the present specification, the term "substituted or unsubstituted" means being substituted with one or two or more substituents selected from the group consisting of deuterium; a halogen group; a nitrile group; a nitro group; an imide group; an amide group; a carbonyl group; an ester group; a hydroxyl group; an alkyl group; a cycloalkyl group; an alkoxy group; an aryloxy group; an alkylthioxy group; an arylthioxy group; an alkylsulfoxy group; an arylsulfoxy group; an alkenyl group; a silyl group; a siloxane group; a boron group; an amine group; an arylphosphine group; a phosphine oxide group; an aryl group; and a heterocyclic group, or being substituted with a substituent to which two or more substituents among the exemplified substituents are linked, or having no substituent. For example, "the substituent to which two or more substituents are linked" may be a

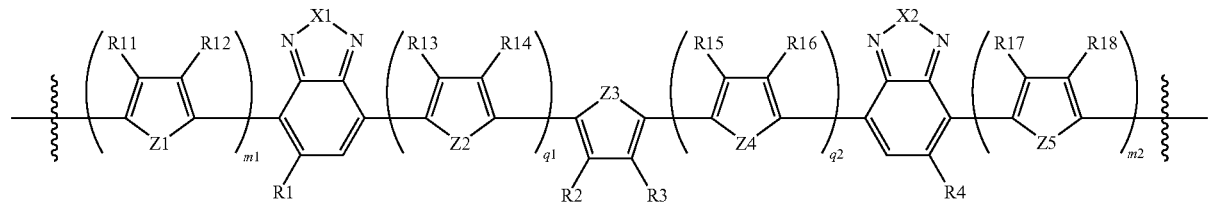

In the structure, Z1 to Z5, X1, X2, R1 to R4, R11 to R18, m1, m2, q1, and q2 are the same as those defined in Formula 1.

When one part "includes" one constituent element in the present specification, unless otherwise specifically described, this does not mean that another constituent element is excluded, but means that another constituent element may be further included.

When one member is disposed "on" another member in the present specification, this includes not only a case where the one member is brought into contact with another member, but also a case where still another member is present between the two members.

In the present specification, the "combination" means that the same types of structures are linked to one another, or different types of structures are linked to one another.

biphenyl group. That is, the biphenyl group may also be an aryl group, and may be interpreted as a substituent to which two phenyl groups are linked.

In the present specification, a halogen group may be fluorine, chlorine, bromine or iodine.

In the present specification, the number of carbon atoms of an imide group is not particularly limited, but is preferably 1 to 30.

In the present specification, for an amide group, the nitrogen of the amide group may be substituted with hydrogen, a straight-chained, branched, or cyclic alkyl group having 1 to 30 carbon atoms, or an aryl group having 6 to 30 carbon atoms.

In the present specification, the number of carbon atoms of a carbonyl group is not particularly limited, but is preferably 1 to 30.

In the present specification, for an ester group, the oxygen of the ester group may be substituted with a straight-chained, branched, or cyclic alkyl group having 1 to 25 carbon atoms, or an aryl group having 6 to 30 carbon atoms.

In the present specification, the alkyl group may be straight-chained or branched, and the number of carbon atoms thereof is not particularly limited, but is preferably 1 to 30. Specific examples thereof include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 4-methylhexyl, 5-methylhexyl, and the like, but are not limited thereto.

In the present specification, a cycloalkyl group is not particularly limited, but has preferably 3 to 30 carbon atoms, and specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, the alkoxy group may be straight-chained, branched, or cyclic. The number of carbon atoms of the alkoxy group is not particularly limited, but is preferably 1 to 30. Specific examples thereof include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy, and the like, but are not limited thereto.

In the present specification, an amine group may be selected from the group comprising of —NH$_2$; an alkylamine group; an N-arylalkylamine group; an arylamine group; an N-arylheteroarylamine group; an N-alkylheteroarylamine group; and a heteroarylamine group, and the number of carbon atoms thereof is not particularly limited, but is preferably 1 to 30. Specific examples of the amine group include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, an N-phenylnaphthylamine group, a ditolylamine group, an N-phenyltolylamine group, a triphenylamine group, and the like, but are not limited thereto.

In the present specification, an N-alkylarylamine group means an amine group in which a N of the amine group are substituted with an alkyl group and an aryl group.

In the present specification, an N-arylheteroarylamine group means an amine group in which a N of the amine group are substituted with an aryl group and a heteroaryl group.

In the present specification, an N-alkylheteroarylamine group means an amine group in which a N of the amine group are substituted with alkyl group and a heteroaryl group.

In the present specification, the alkyl group in the alkylamine group, the N-arylalkylamine group, the alkylthioxy group, the alkylsulfoxy group, and the N-alkylheteroarylamine group is the same as the above-described examples of the alkyl group. Specifically, examples of the alkylthioxy group include a methylthioxy group, an ethylthioxy group, a tert-butylthioxy group, a hexylthioxy group, an octylthioxy group, and the like, and examples of the alkylsulfoxy group include mesyl, an ethylsulfoxy group, a propylsulfoxy group, a butylsulfoxy group, and the like, but the examples are not limited thereto.

In the present specification, the alkenyl group may be straight-chained or branched, and the number of carbon atoms thereof is not particularly limited, but is preferably 2 to 30. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, specific examples of a silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but are not limited thereto.

In the present specification, a boron group may be —BR$_{100}$R$_{200}$, and R$_{100}$ and R$_{200}$ are the same as or different from each other, and may be each independently selected from the group comprising of hydrogen; deuterium; halogen; a nitrile group; a substituted or unsubstituted monocyclic or polycyclic cycloalkyl group having 3 to 30 carbon atoms; a substituted or unsubstituted straight-chained or branched alkyl group having 1 to 30 carbon atoms; a substituted or unsubstituted monocyclic or polycyclic aryl group having 6 to 30 carbon atoms; and a substituted or unsubstituted monocyclic or polycyclic heteroaryl group having 2 to 30 carbon atoms.

In the present specification, specific examples of a phosphine oxide group include a diphenylphosphine oxide group, dinaphthylphosphine oxide, and the like, but are not limited thereto.

In the present specification, an aryl group may be monocyclic or polycyclic.

When the aryl group is a monocyclic aryl group, the number of carbon atoms thereof is not particularly limited, but is preferably 6 to 30. Specific examples of the monocyclic aryl group include a phenyl group, a biphenyl group, a terphenyl group, and the like, but are not limited thereto.

When the aryl group is a polycyclic aryl group, the number of carbon atoms thereof is not particularly limited, but is preferably 10 to 30. Specific examples of the polycyclic aryl group include a naphthyl group, an anthracenyl group, a phenanthryl group, a pyrenyl group, a perylenyl group, a chrysenyl group, a fluorenyl group, and the like, but are not limited thereto.

In the present specification, the fluorenyl group may be substituted, and adjacent substituents may be bonded to each other to form a ring.

When the fluorenyl group is substituted, the fluorenyl group may be

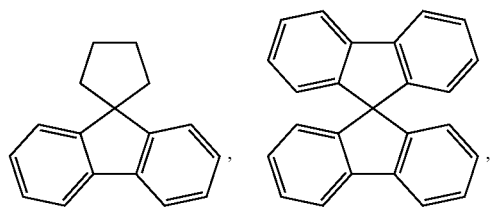

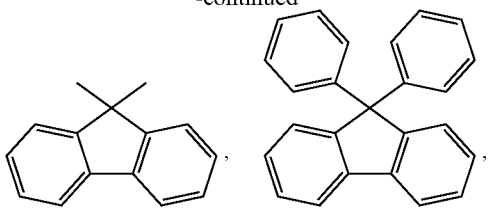

and the like. However, the fluorenyl group is not limited thereto.

In the present specification, the aryl group in the aryloxy group, the arylthioxy group, the arylsulfoxy group, the N-arylalkylamine group, the N-arylheteroarylamine group, and the arylphosphine group is the same as the above-described examples of the aryl group. Specifically, examples of the aryloxy group include a phenoxy group, a p-tolyloxy group, an m-tolyloxy group, a 3,5-dimethyl-phenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthryloxy group, a 2-anthryloxy group, a 9-anthryloxy group, a 1-phenanthryloxy group, a 3-phenanthryloxy group, a 9-phenanthryloxy group, and the like, examples of the arylthioxy group include a phenylthioxy group, a 2-methylphenylthioxy group, a 4-tert-butylphenylthioxy group, and the like, and examples of the arylsulfoxy group include a benzenesulfoxy group, a p-toluenesulfoxy group, and the like, but the examples are not limited thereto.

In the present specification, examples of the arylamine group include a substituted or unsubstituted monoarylamine group, a substituted or unsubstituted diarylamine group, or a substituted or unsubstituted triarylamine group. The aryl group in the arylamine group may be a monocyclic aryl group or a polycyclic aryl group. The arylamine group including two or more aryl groups may include a monocyclic aryl group, a polycyclic aryl group, or both a monocyclic aryl group and a polycyclic aryl group. For example, the aryl group in the arylamine group may be selected from the above-described examples of the aryl group.

In the present specification, a heterocyclic group includes one or more atoms other than carbon, that is, one or more heteroatoms, and specifically, the heteroatom may include one or more atoms selected from the group comprising of O, N, Se, S, and the like. The number of carbon atoms thereof is not particularly limited, but is preferably 2 to 30, and the heterocyclic group may be monocyclic or polycyclic. Examples of the heterocyclic group include a thiophene group, a furanyl group, a pyrrole group, an imidazolyl group, a thiazolyl group, an oxazolyl group, an oxadiazolyl group, a pyridyl group, a bipyridyl group, a pyrimidyl group, a triazinyl group, a triazolyl group, an acridyl group, a pyridazinyl group, a pyrazinyl group, a quinolinyl group, a quinazolinyl group, a quinoxalinyl group, a phthalazinyl group, a pyridopyrimidyl group, a pyridopyrazinyl group, a pyrazinopyrazinyl group, an isoquinolinyl group, an indolyl group, a carbazolyl group, a benzoxazolyl group, a benzimidazolyl group, a benzothiazolyl group, a benzocarbazolyl group, a benzothiophene group, a dibenzothiophene group, a benzofuranyl group, a phenanthrolinyl group (phenanthroline), a thiazolyl group, an isoxazolyl group, an oxadiazolyl group, a thiadiazolyl group, a phenothiazinyl group, a dibenzofuranyl group, and the like, but are not limited thereto.

In the present specification, examples of the heteroarylamine group include a substituted or unsubstituted monoheteroarylamine group, a substituted or unsubstituted diheteroarylamine group, or a substituted or unsubstituted triheteroarylamine group. The heteroarylamine group including two or more heteroaryl groups may include a monocyclic heteroaryl group, a polycyclic heteroaryl group, or both a monocyclic heteroaryl group and a polycyclic heteroaryl group. For example, the heteroaryl group in the heteroarylamine group may be selected from the above-described examples of the heterocyclic group.

In the present specification, examples of the heteroaryl group in the N-arylheteroarylamine group and the N-alkylheteroarylamine group are the same as the above-described examples of the heterocyclic group.

In an exemplary embodiment of the present specification, the copolymer includes a unit represented by the following Formula 1-1.

[Formula 1-1]

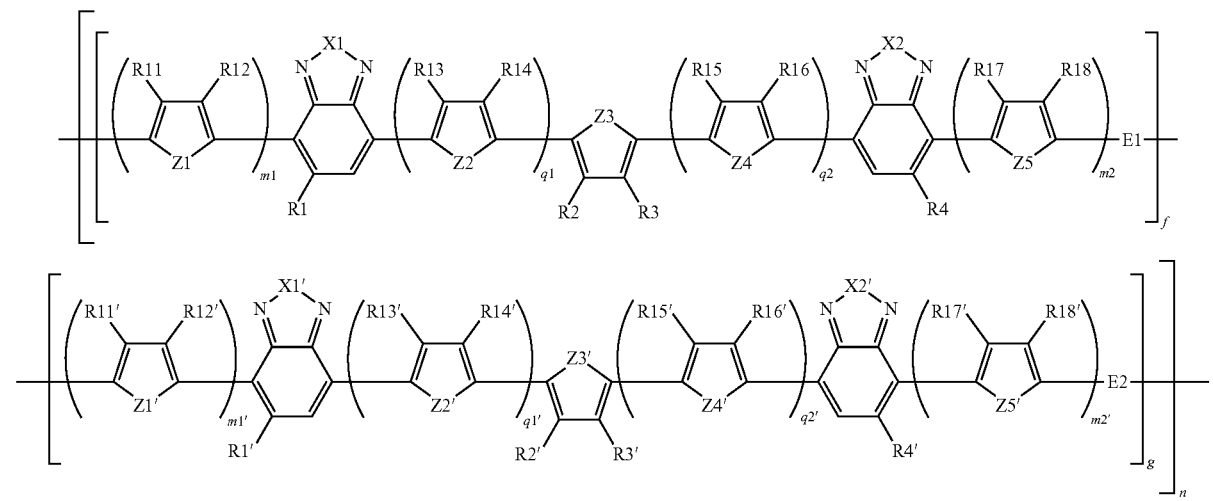

In Formula 1-1, m1, m2, m1', and m2' are the same as or different from each other, and are each independently an integer from 0 to 5, when m1, m2, m1', and m2' are each 2 or more, the structures in the parenthesis are the same as or different from each other, q1, q2, q1', and q2' are the same as or different from each other, and are each independently an integer from 1 to 5, when q1, q2, q1', and q2' are each 2 or more, the structures in the parenthesis are the same as or different from each other, X1, X2, X1', X2', Z1 to Z5, and Z1' to Z5' are the same as or different from each other, and are each independently S, O, Se, Te, NR, CRR', SiRR', PR, or GeRR', E1 is a first conjugated monomer, E2 is a second conjugated monomer, R, R', R1 to R4, R1' to R4', R11 to R18, and R11' to R18' are the same as or different from each other, and are each independently hydrogen; deuterium; a halogen group; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heterocyclic group, f is a mole fraction, and a real number of $0<f<1$, g is a mole fraction, and a real number of $0<g<1$, f+g=1, and n is the number of repeating units of the unit, and an integer from 1 to 10,000.

In the present specification, "a conjugated monomer" means that two or more multiple bonds exist in a structure of a compound with a single bond interposed therebetween and exhibit interaction. In this case, the conjugated monomer means both a first conjugated monomer and a second conjugated monomer.

In the present specification, a conjugated monomer may mean a repeating unit derived from a conjugated monomer included in a polymer.

In an exemplary embodiment of the present specification, the first conjugated monomer and the second conjugated monomer may be each independently one group of or a combination of two or more groups of a substituted or unsubstituted alkenylene group, a substituted or unsubstituted arylene group, and a substituted or unsubstituted divalent heterocyclic group.

In the present specification, the above-described description on the alkenyl group may be applied to the alkenylene group except for a divalent group.

In the present specification, the above-described description on the aryl group may be applied to the arylene group except for a divalent group.

In the present specification, the above-described description on the heterocyclic group may be applied to the divalent heterocyclic group except for a divalent group.

According to an exemplary embodiment of the present specification, the conjugated monomer includes an electron donor structure or an electron acceptor structure.

In an exemplary embodiment of the present specification, the first conjugated monomer and the second conjugated monomer each independently include any one of or a combination of two or more of the following structures.

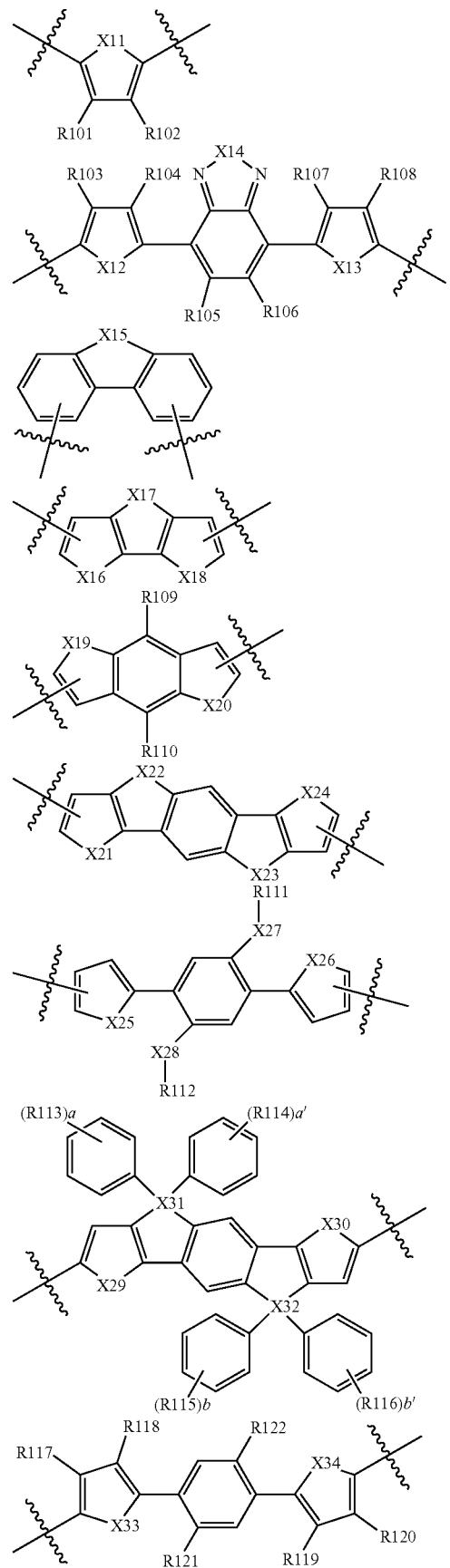

-continued

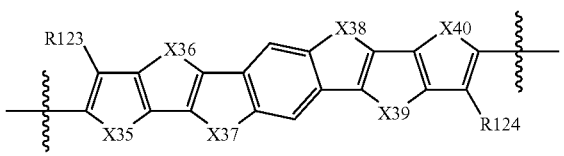

In the structures, a, a', b, and b' are each an integer from 1 to 5, when a, a', b, and b' are each 2 or more, the substituents in the parenthesis are the same as or different from each other, X11 to X30 and X33 to X40 are the same as or different from each other, and are each independently S, O, Se, Te, $NR_d$, $CR_dR_e$, $SiR_dR_e$, $PR_d$, or $GeR_dR_e$, X31 and X32 are the same as or different from each other, and are each independently C, Si, or Ge, and R101 to R124, $R_d$, and $R_e$ are the same as or different from each other, and are each independently hydrogen; deuterium; a halogen group; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heterocyclic group.

In an exemplary embodiment of the present specification, the first conjugated monomer and the second conjugated monomer are each any one of the following structures.

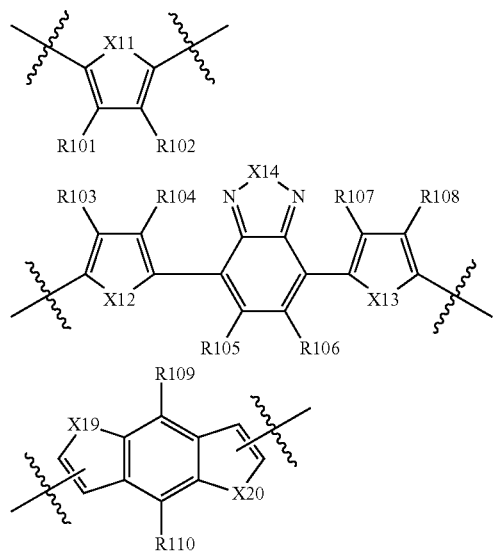

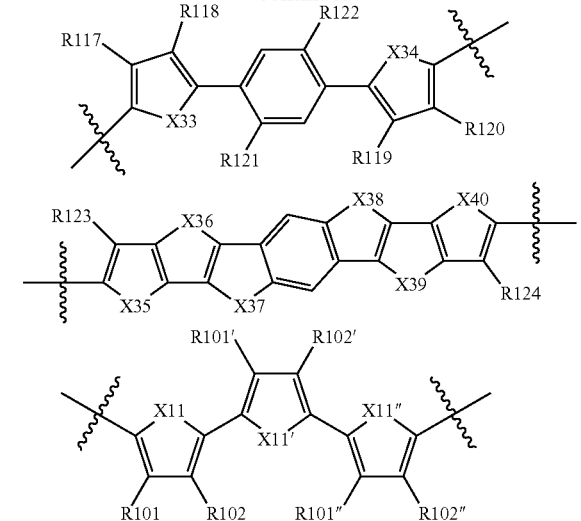

In the structures,

X11 to X14, X19, X20, X33 to X40, X11', and X11" are the same as or different from each other, and are each independently S, O, Se, Te, $NR_d$, $CR_dR_e$, $SiR_dR_e$, $PR_d$, or $GeR_dR_e$, and R101 to R110, R117 to R124, R101', R101", R102', R102", $R_d$, and $R_e$ are the same as or different from each other, and are each independently hydrogen; deuterium; a halogen group; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heterocyclic group.

In an exemplary embodiment of the present specification, X11 to X14, X19, X20, X33 to X40, X11', and X11" are the same as or different from each other, and are each independently S or $CR_dR_e$, and $R_d$ and $R_e$ are the same as those described above.

In an exemplary embodiment of the present specification, X11 to X14, X19, X20, X33 to X36, X39, X40, X11', and X11" are each S.

In an exemplary embodiment of the present specification, X37 and X38 are $CR_dR_e$, and $R_d$ and $R_e$ are a substituted or unsubstituted aryl group.

In an exemplary embodiment of the present specification, R101 to R110, R117 to R124, R101', R101", R102', and R102" are the same as or different from each other, and are each independently hydrogen; a halogen group; a substituted or unsubstituted alkyl group; a substituted or unsubstituted alkoxy group; or a substituted or unsubstituted heterocyclic group.

In an exemplary embodiment of the present specification, R101 and R102 are each hydrogen.

In an exemplary embodiment of the present specification, R101, R101', R101", R102, R102', and R102" are the same as or different from each other, and are each independently hydrogen; a substituted or unsubstituted alkyl group; or a substituted or unsubstituted alkoxy group.

In an exemplary embodiment of the present specification, R101, R101', R101", R102, R102', and R102" are the same as or different from each other, and are each independently hydrogen; an alkyl group having 1 to 15 carbon atoms; or a substituted or unsubstituted alkoxy group having 1 to 15 carbon atoms.

In an exemplary embodiment of the present specification, R103 to R108 are the same as or different from each other, and are each independently hydrogen; a substituted or unsubstituted alkyl group; or a substituted or unsubstituted alkoxy group.

In an exemplary embodiment of the present specification, R103 and R108 are the same as or different from each other, and are each independently a substituted or unsubstituted alkyl group.

In an exemplary embodiment of the present specification, R104 and R107 are hydrogen.

In an exemplary embodiment of the present specification, R105 and R106 are the same as or different from each other, and are each independently a substituted or unsubstituted alkoxy group.

In an exemplary embodiment of the present specification, R105 and R106 are the same as or different from each other, and are each independently a substituted or unsubstituted alkoxy group having 1 to 15 carbon atoms.

In an exemplary embodiment of the present specification, R109 and R110 are the same as or different from each other, and are each independently a substituted or unsubstituted heterocyclic group.

In an exemplary embodiment of the present specification, R109 and R110 are the same as or different from each other, and are each independently a heterocyclic group substituted with an alkyl group.

In an exemplary embodiment of the present specification, R109 and R110 are the same as or different from each other, and are each independently a thiophene group substituted with an alkyl group.

In an exemplary embodiment of the present specification, R121 and R122 are the same as or different from each other, and are each independently a halogen group.

In an exemplary embodiment of the present specification, R121 and R122 are fluorine.

In an exemplary embodiment of the present specification, R117 to R120 are the same as or different from each other, and are each independently hydrogen; or a substituted or unsubstituted alkyl group.

In an exemplary embodiment of the present specification, R117 and R120 are the same as or different from each other, and are each independently a substituted or unsubstituted alkyl group.

In an exemplary embodiment of the present specification, R117 and R120 are the same as or different from each other, and are each independently a substituted or unsubstituted alkyl group having 1 to 15 carbon atoms.

In an exemplary embodiment of the present specification, R117 and R120 are the same as or different from each other, and are each independently a branched alkyl group having 1 to 15 carbon atoms.

In an exemplary embodiment of the present specification, R118 and R119 are hydrogen.

In an exemplary embodiment of the present specification, R123 and R124 are hydrogen.

In an exemplary embodiment of the present specification, the first conjugated monomer and the second conjugated monomer are each any one of the following structures. That is, E1 and E2 are each any one of the following structures.

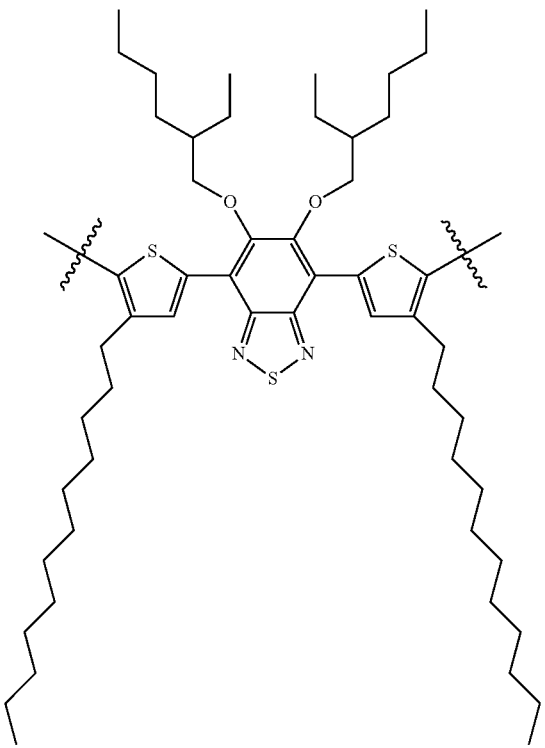

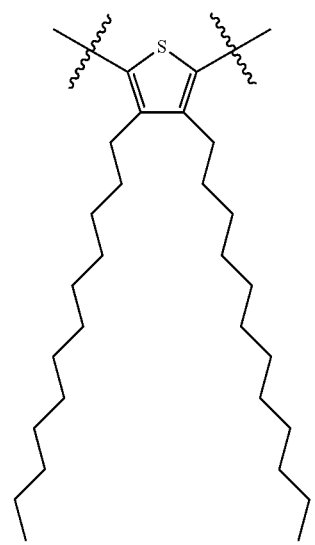

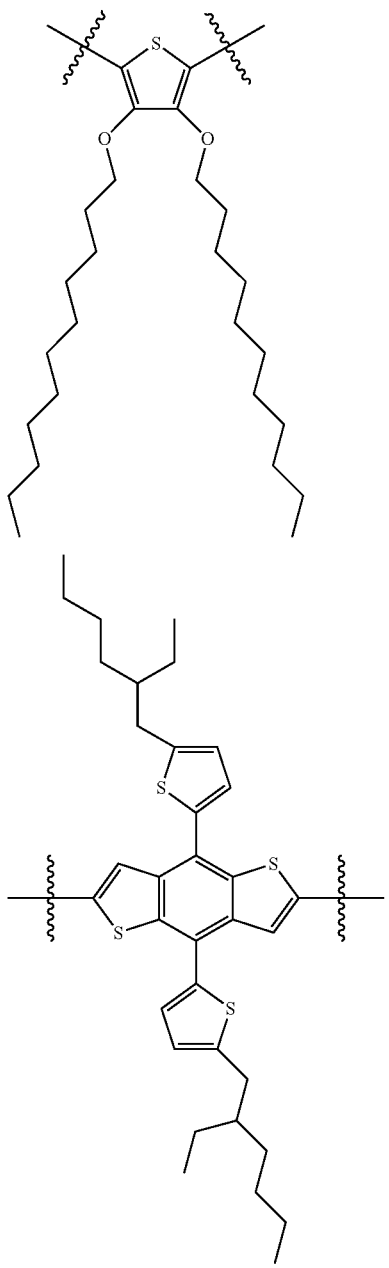
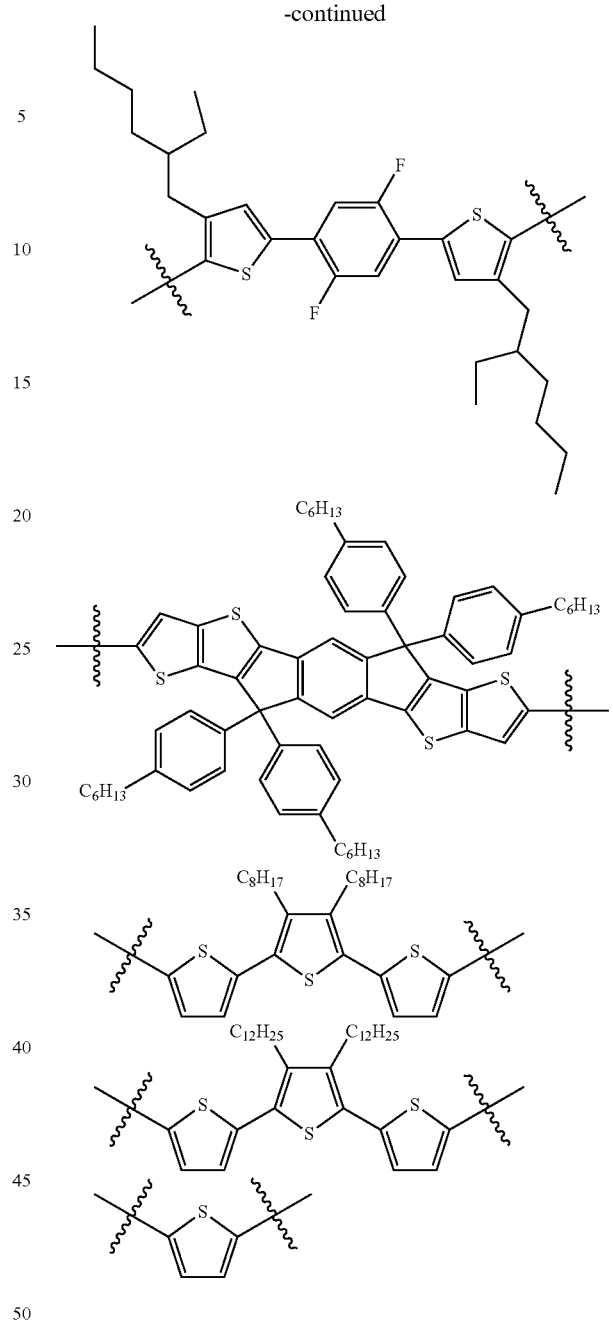
In an exemplary embodiment of the present specification, the copolymer includes a unit represented by the following Formula 1-2.
[Formula 1-2]
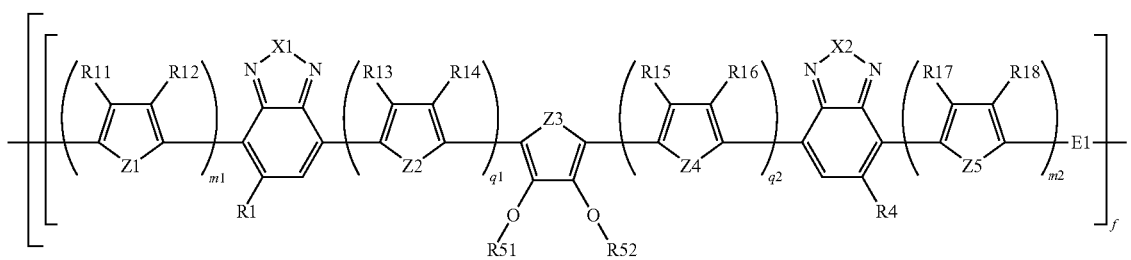

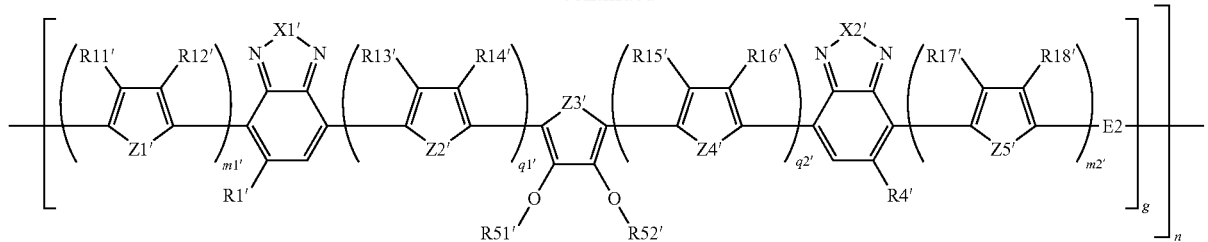

In Formula 1-2, f, g, n, m1, m2, m1', m2', q1, q2, q1', q2', X1, X2, X1', X2', Z1 to Z5, Z1' to Z5', E1, E2, R1, R4, R1', R4', R11 to R18, and R11' to R18' are the same as those defined in Formula 1-1, and R51, R51', R52, and R52' are the same as or different from each other, and are each independently a substituted or unsubstituted alkyl group; or a substituted or unsubstituted aryl group.

In an exemplary embodiment of the present specification, R51, R51', R52, and R52' are the same as or different from each other, and are each independently a substituted or unsubstituted alkyl group.

In an exemplary embodiment of the present specification, R51, R51', R52, and R52' are the same as or different from each other, and are each independently an alkyl group having 1 to 30 carbon atoms.

In an exemplary embodiment of the present specification, R51, R51', R52, and R52' are the same as or different from each other, and are each independently an alkyl group having 1 to 20 carbon atoms.

In an exemplary embodiment of the present specification, R51, R51', R52, and R52' are the same as each other, and are each independently an alkyl group having 1 to 15 carbon atoms.

In an exemplary embodiment of the present specification, R1 to R4 and R11 to R18 are the same as or different from each other, and are each independently hydrogen; a halogen group; a substituted or unsubstituted alkyl group; a substituted or unsubstituted alkoxy group; a substituted or unsubstituted aryl group; or a substituted or unsubstituted heterocyclic group.

In an exemplary embodiment of the present specification, R1 to R4 and R11 to R18 are the same as or different from each other, and are each independently hydrogen; a halogen group; or a substituted or unsubstituted alkoxy group.

In an exemplary embodiment of the present specification, R1 and R4 are the same as or different from each other, and are each independently a halogen group.

In an exemplary embodiment of the present specification, R1 and R4 are fluorine.

In an exemplary embodiment of the present specification, R2 and R3 are each a substituted or unsubstituted alkoxy group.

In an exemplary embodiment of the present specification, R2 and R3 are each a substituted or unsubstituted alkoxy group having 1 to 30 carbon atoms.

In an exemplary embodiment of the present specification, R2 and R3 are each a substituted or unsubstituted alkoxy group having 1 to 20 carbon atoms.

In an exemplary embodiment of the present specification, R2 and R3 are each an alkoxy group having 1 to 15 carbon atoms.

In an exemplary embodiment of the present specification, R11 to R18 are hydrogen.

In an exemplary embodiment of the present specification, Z1 to Z5 and Z1' to Z5' are S.

In an exemplary embodiment of the present specification, X1 and X2 are S.

In an exemplary embodiment of the present specification, R1' to R4' and R11' to R18' are the same as or different from each other, and are each independently hydrogen; a halogen group; a substituted or unsubstituted alkyl group; a substituted or unsubstituted alkoxy group; a substituted or unsubstituted aryl group; or a substituted or unsubstituted heterocyclic group.

In an exemplary embodiment of the present specification, R1' to R4' and R11' to R18' are the same as or different from each other, and are each independently hydrogen; a halogen group; or a substituted or unsubstituted alkoxy group.

In an exemplary embodiment of the present specification, R1' and R4' are the same as or different from each other, and are each independently a halogen group.

In an exemplary embodiment of the present specification, R1' and R4' are fluorine.

In an exemplary embodiment of the present specification, R2' and R3' are a substituted or unsubstituted alkoxy group.

In an exemplary embodiment of the present specification, R2' and R3' are each a substituted or unsubstituted alkoxy group having 1 to 30 carbon atoms.

In an exemplary embodiment of the present specification, R2' and R3' are each a substituted or unsubstituted alkoxy group having 1 to 20 carbon atoms.

In an exemplary embodiment of the present specification, R2' and R3' are each an alkoxy group having 1 to 15 carbon atoms.

In an exemplary embodiment of the present specification, R11' to R18' are hydrogen.

In an exemplary embodiment of the present specification, m1, m2, m1', m2', q1, q2, q1', and q2' are each 1.

In an exemplary embodiment of the present specification, the copolymer includes any one of the following structures.

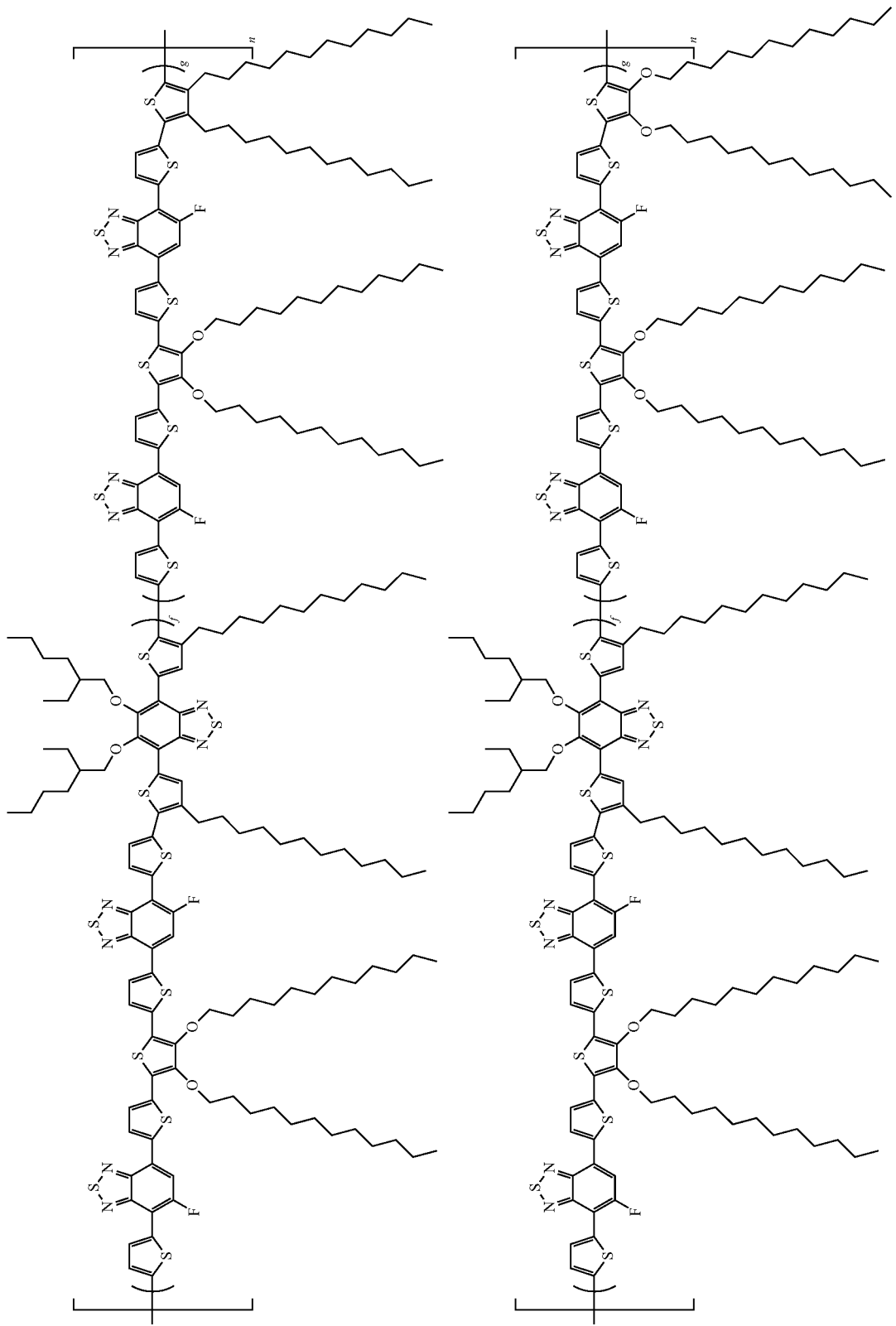

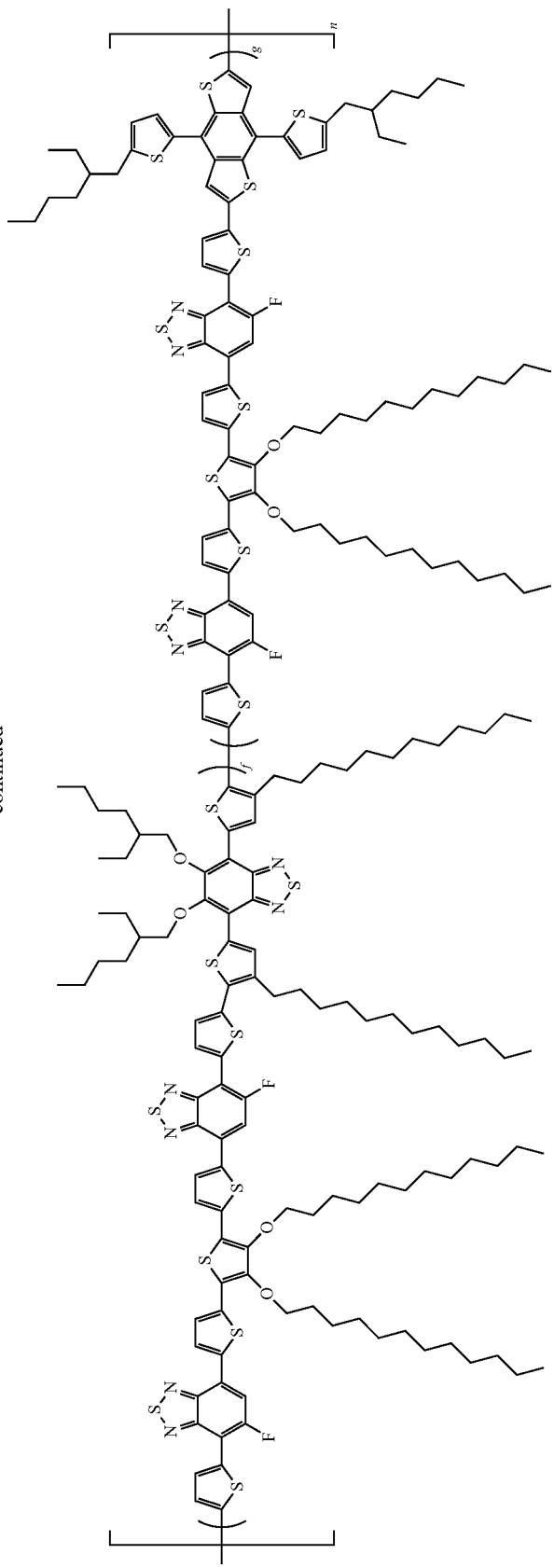
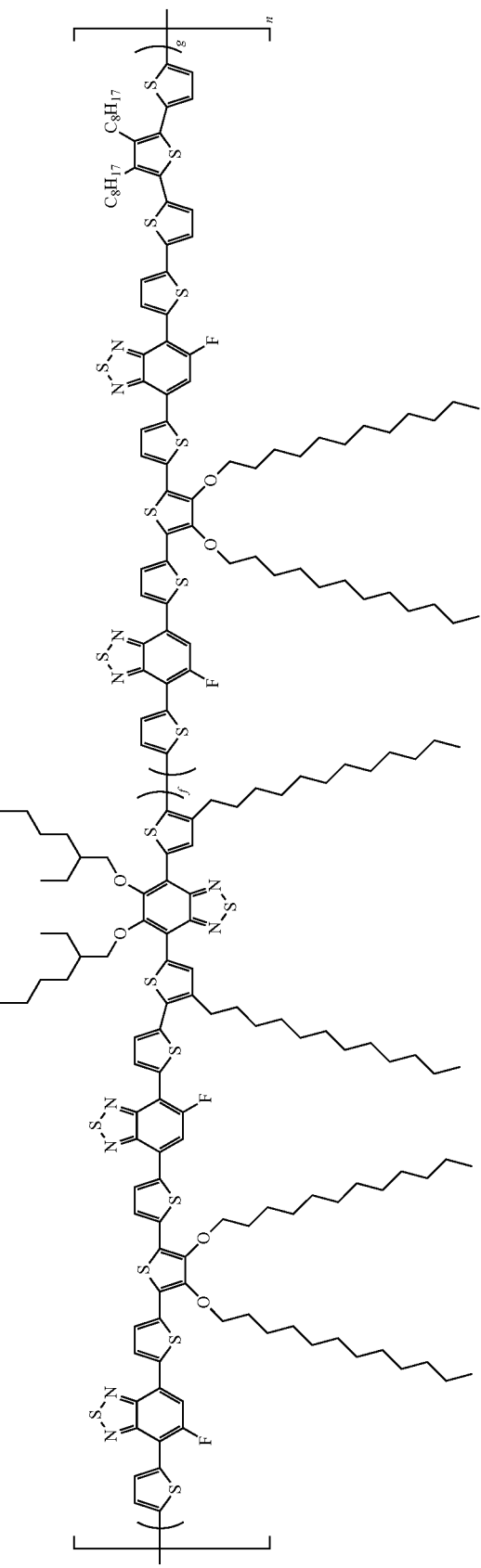

-continued
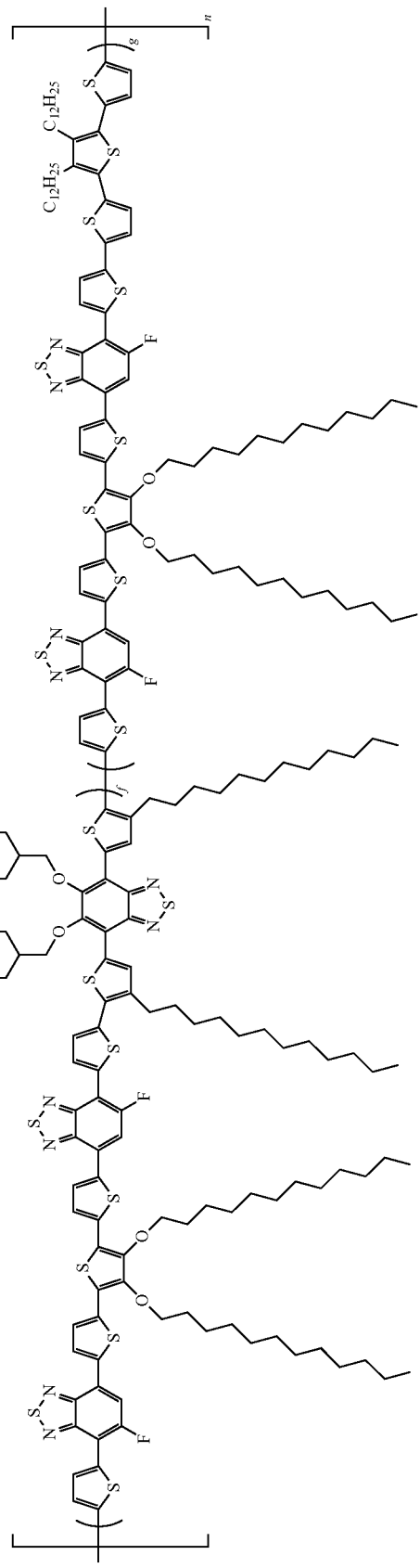
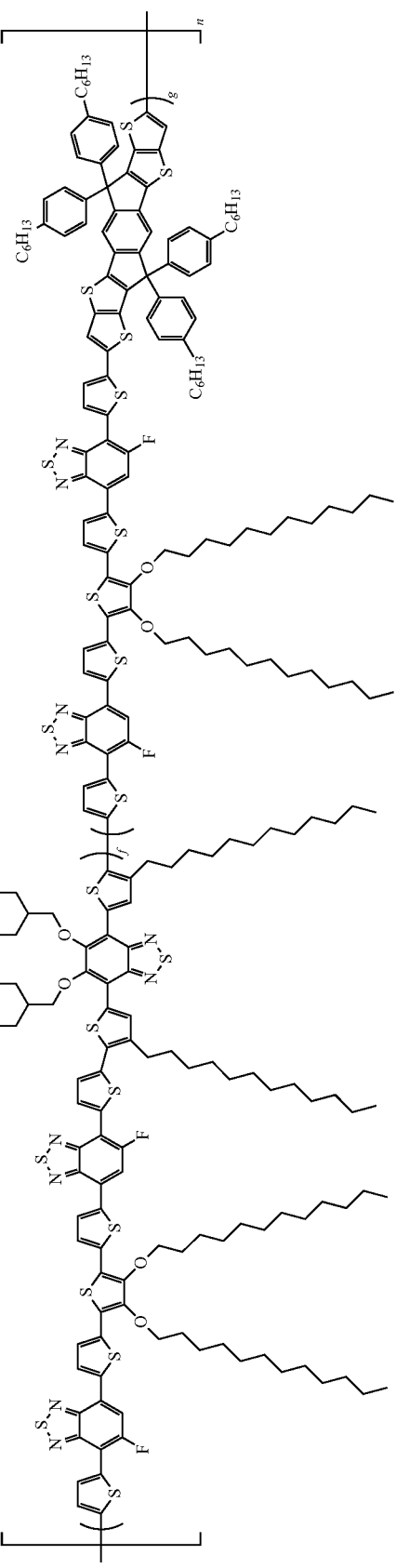

-continued
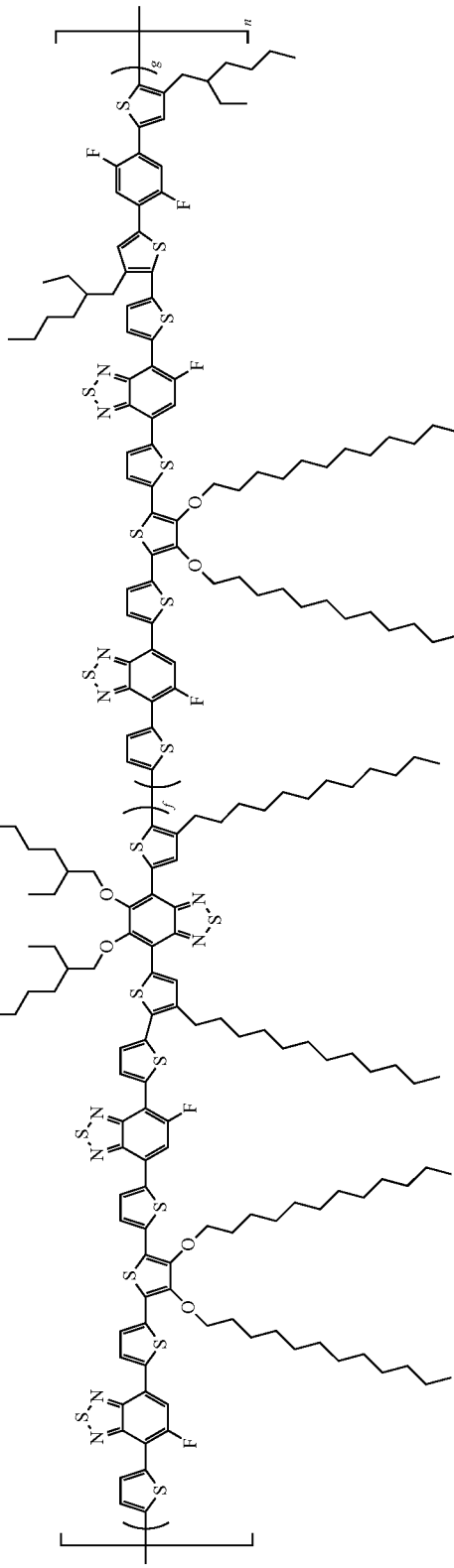
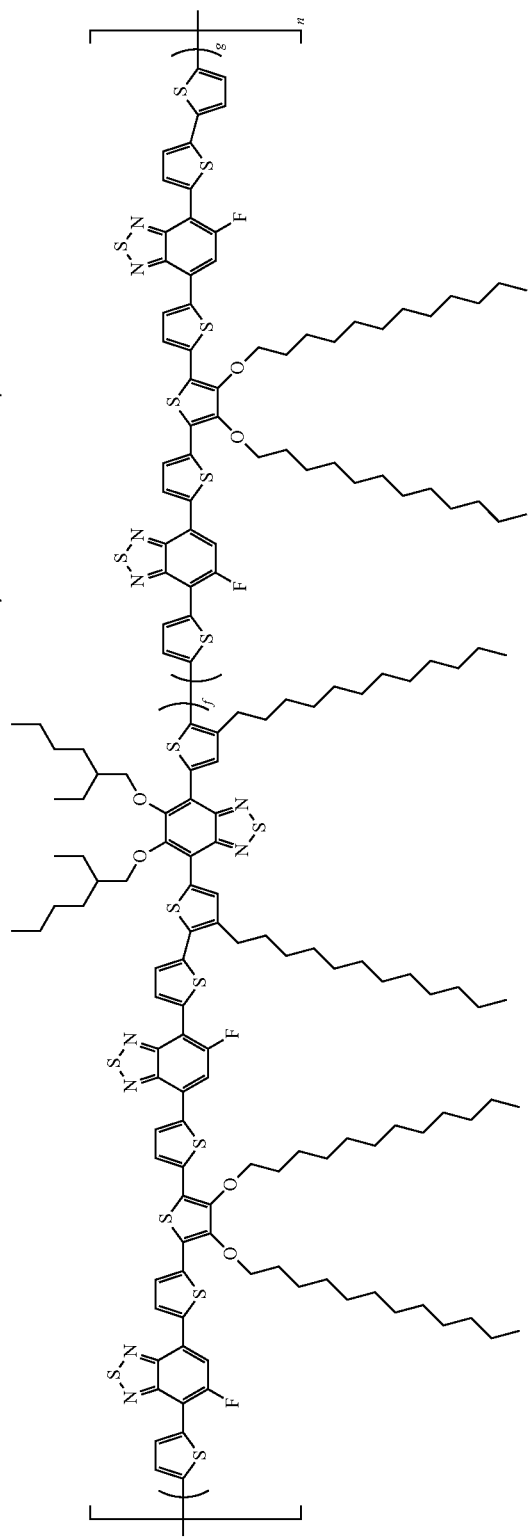

-continued
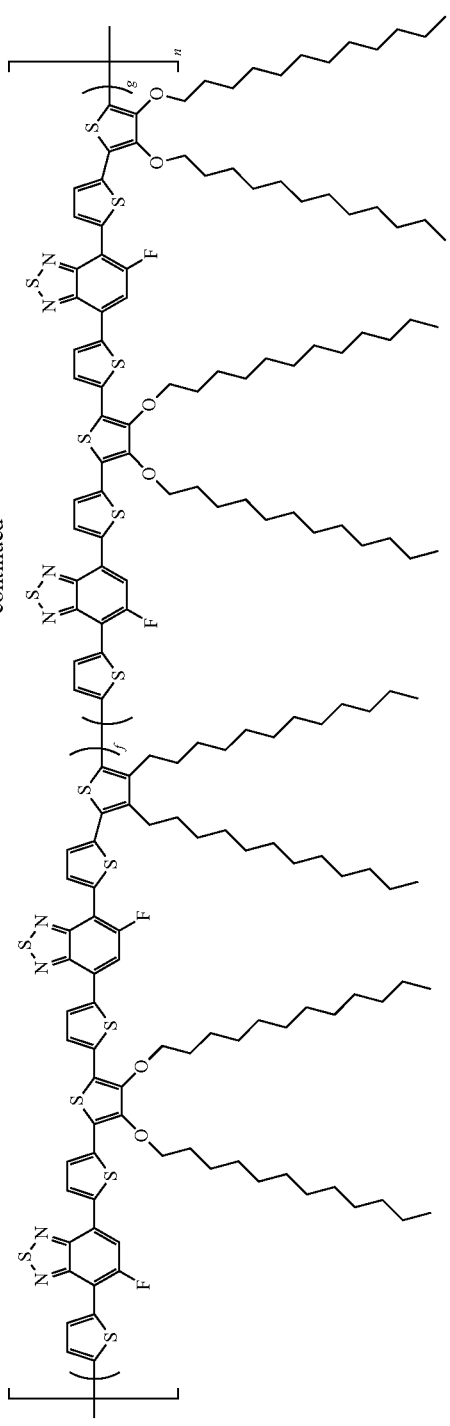
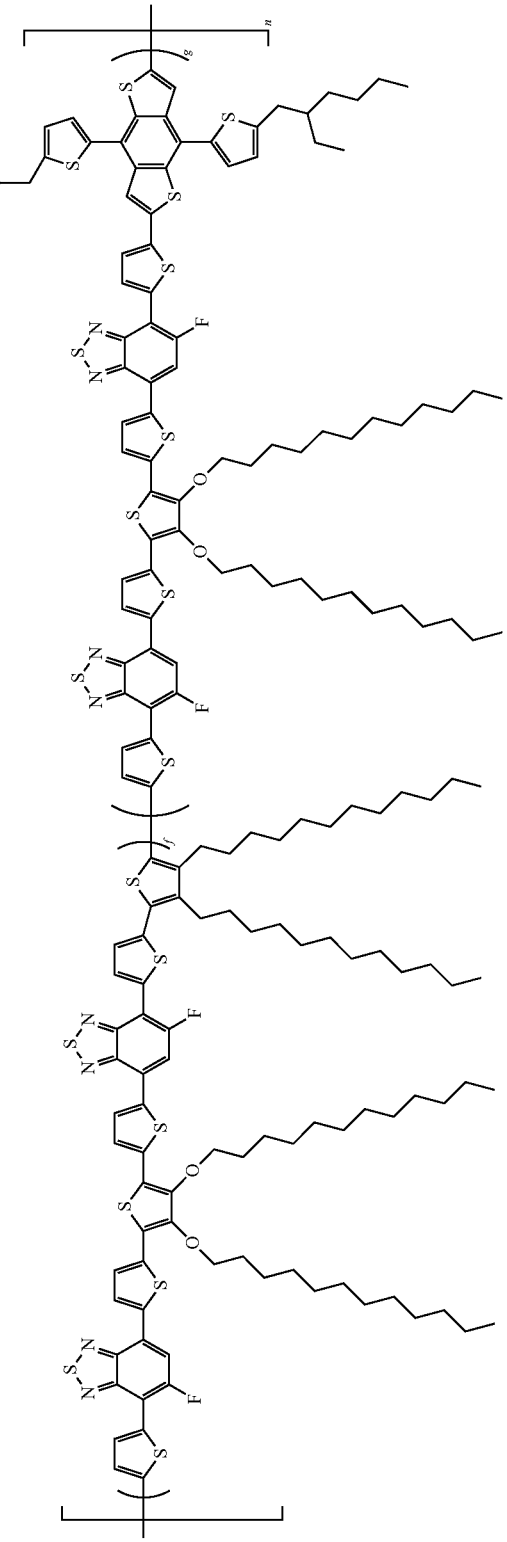

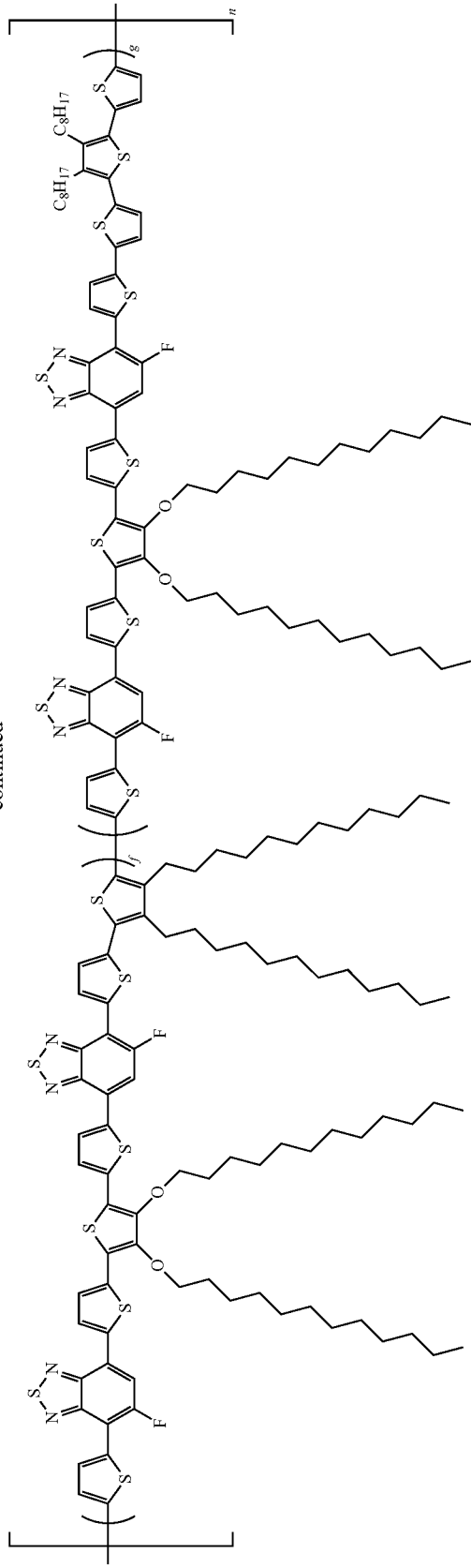
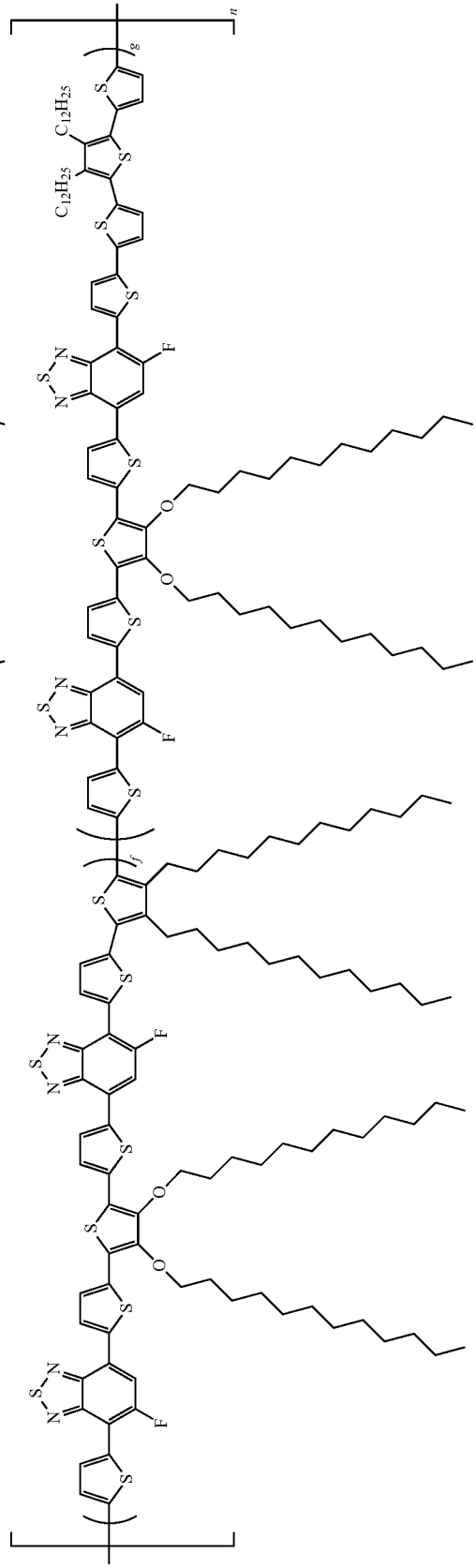

-continued
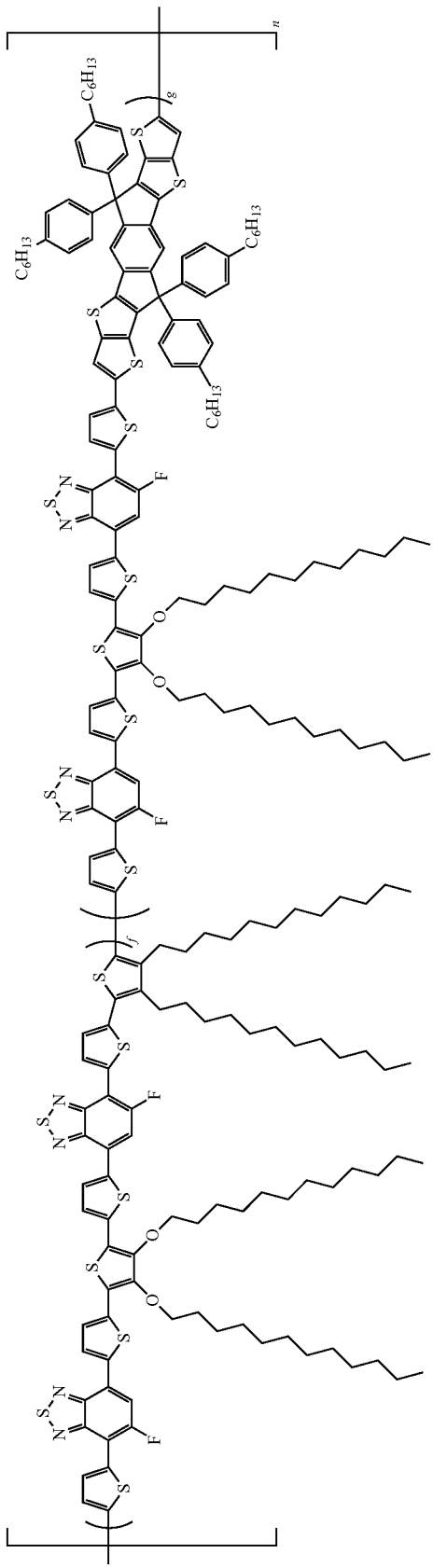
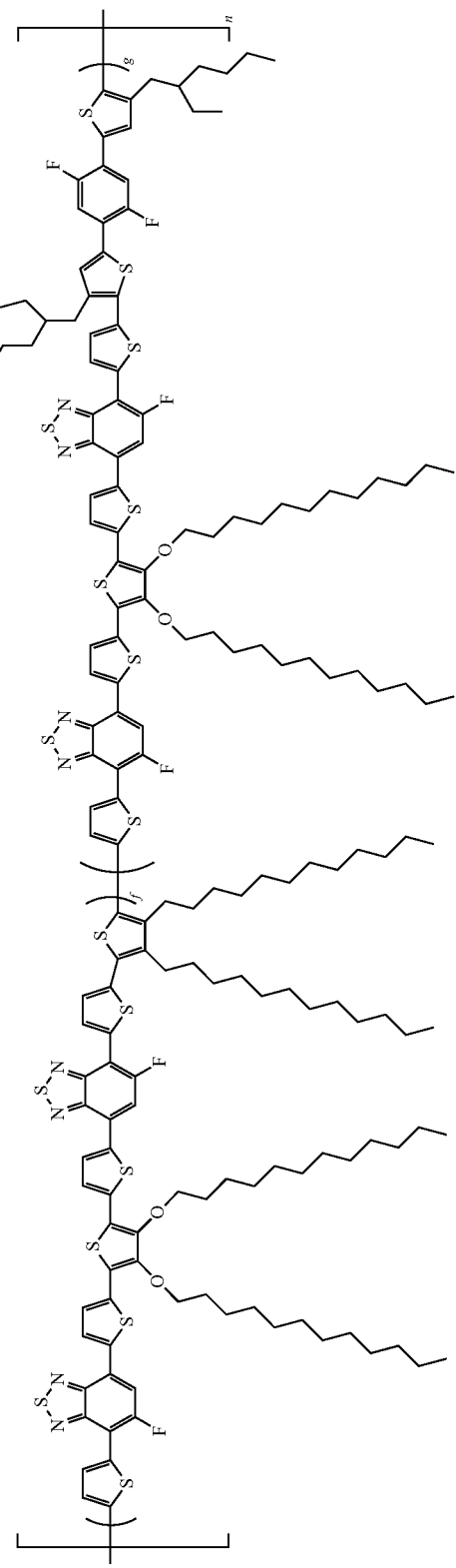

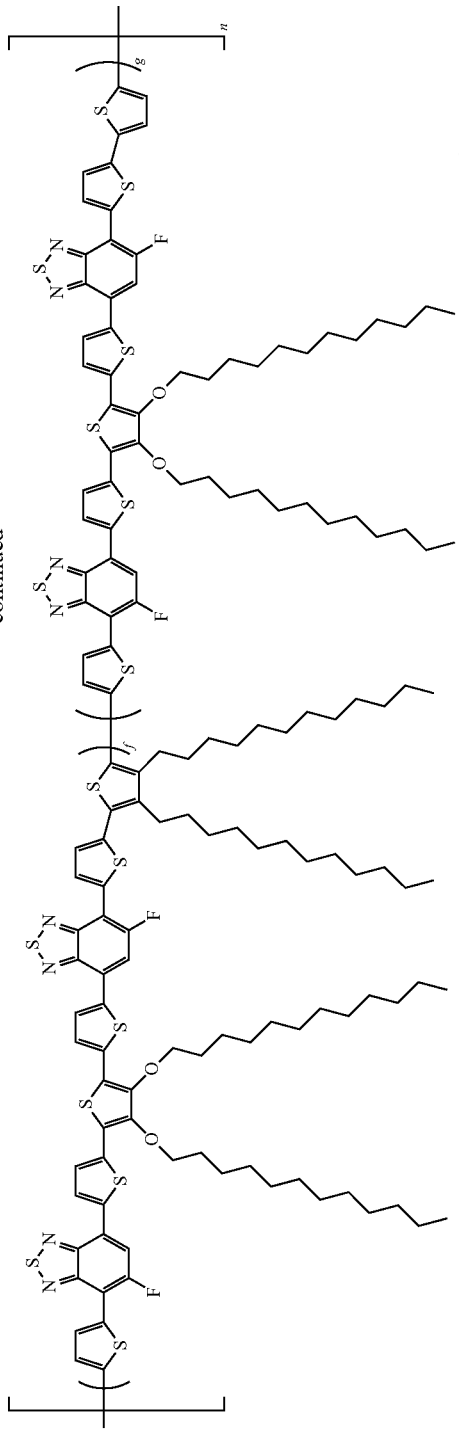
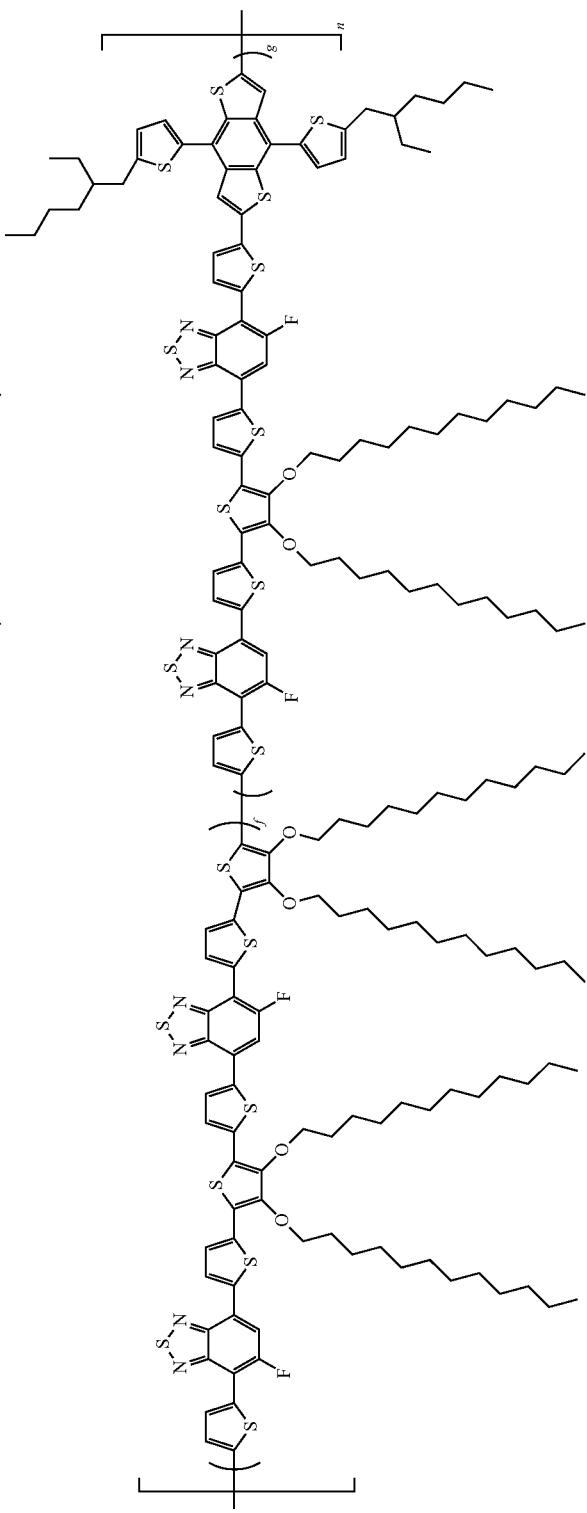

-continued
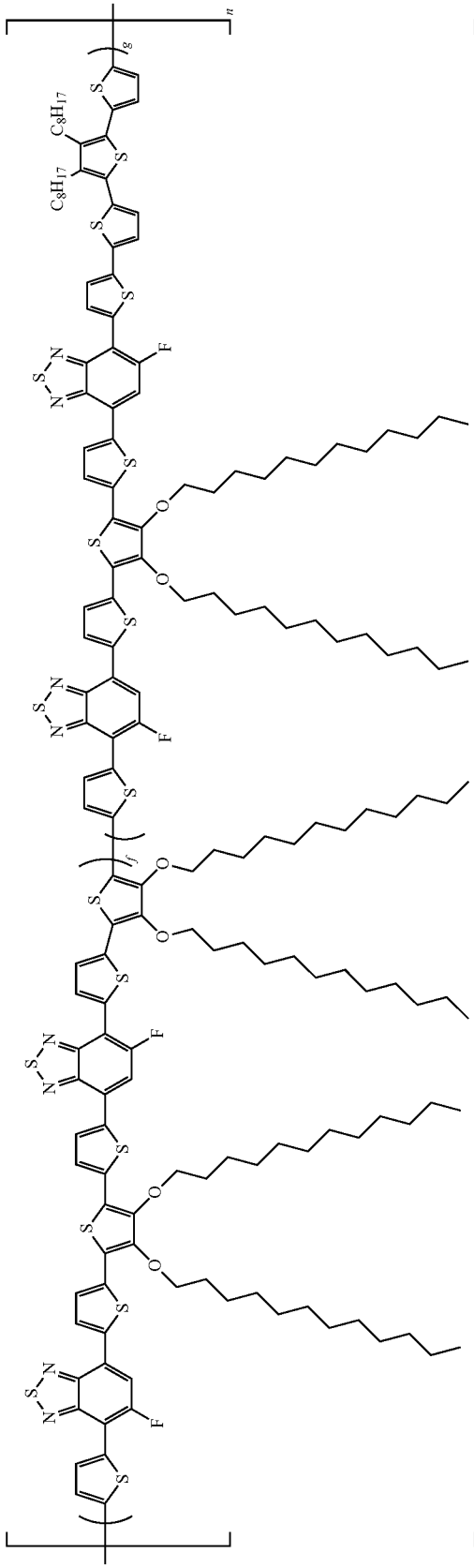
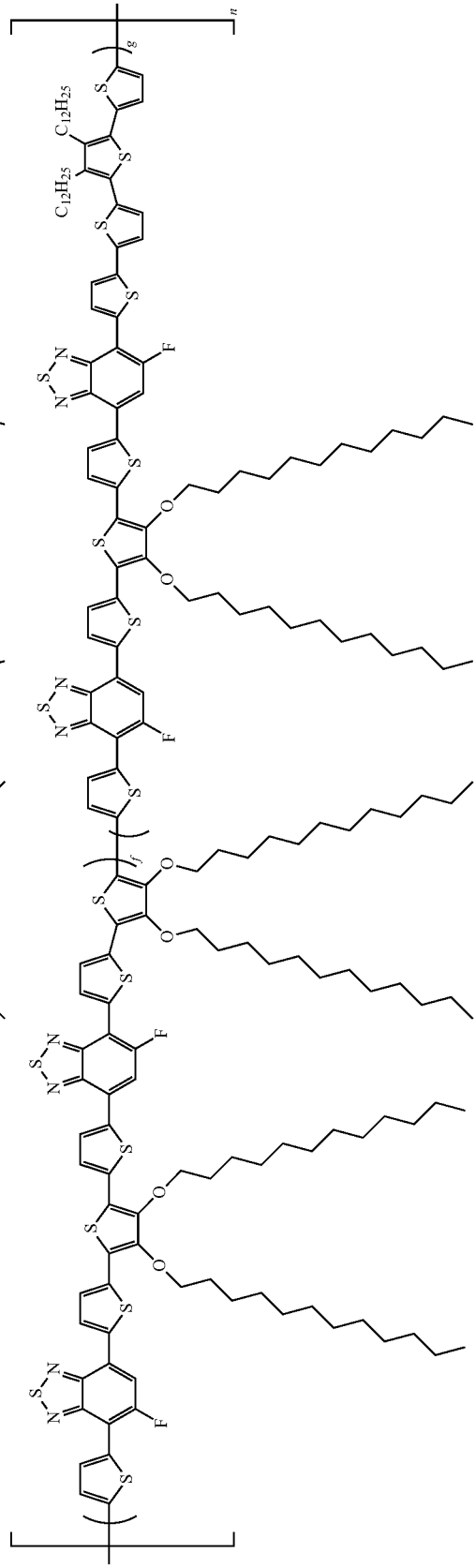

-continued
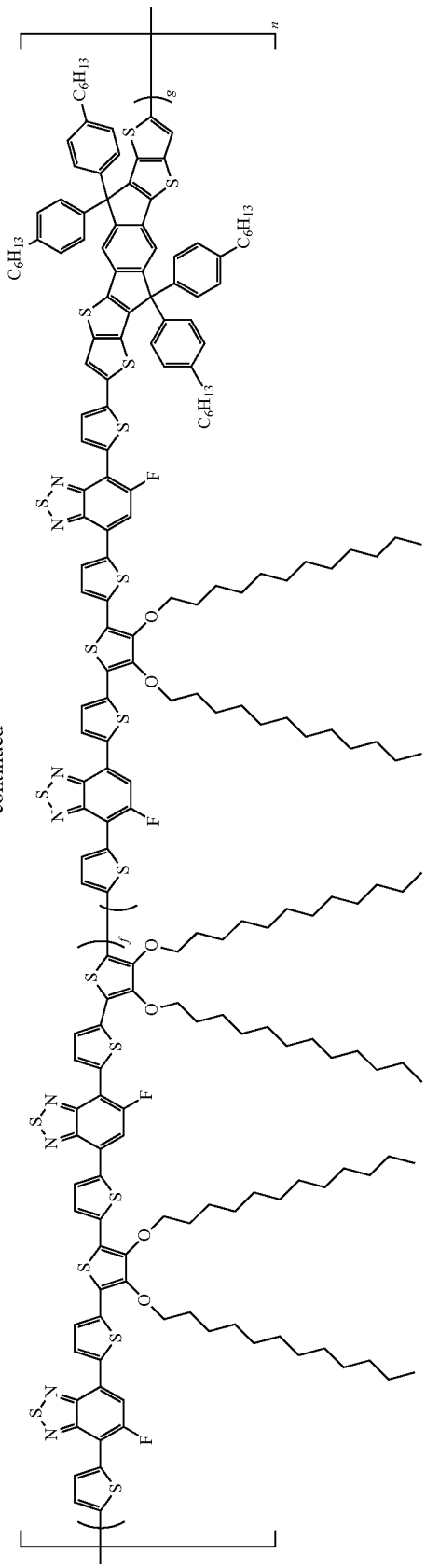 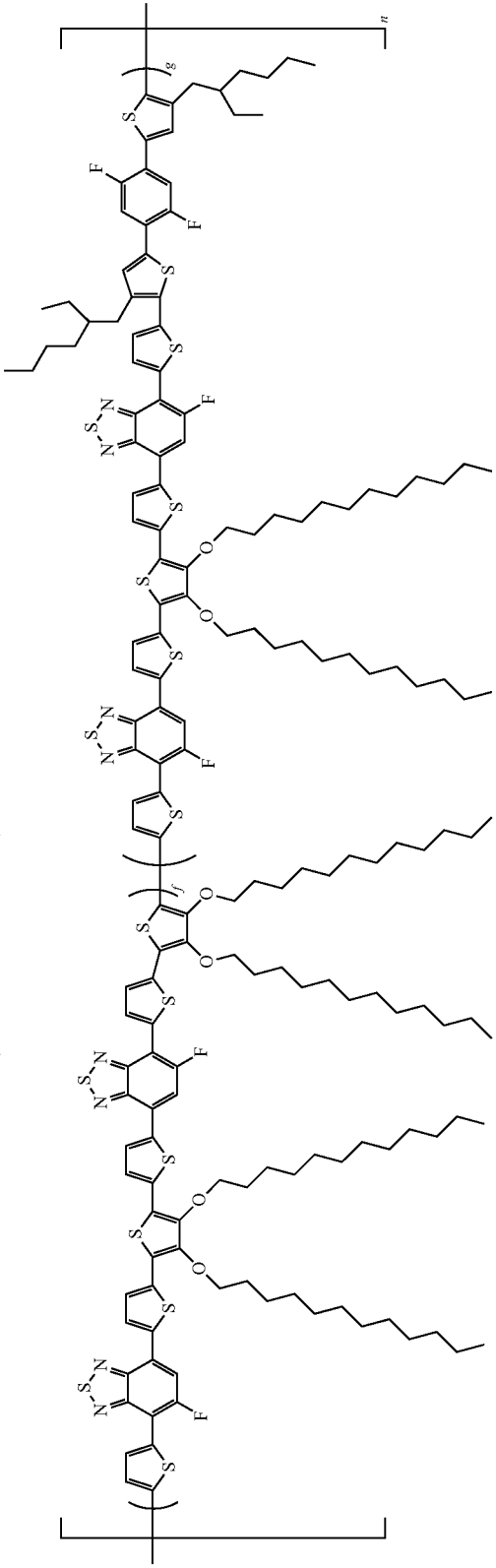

-continued
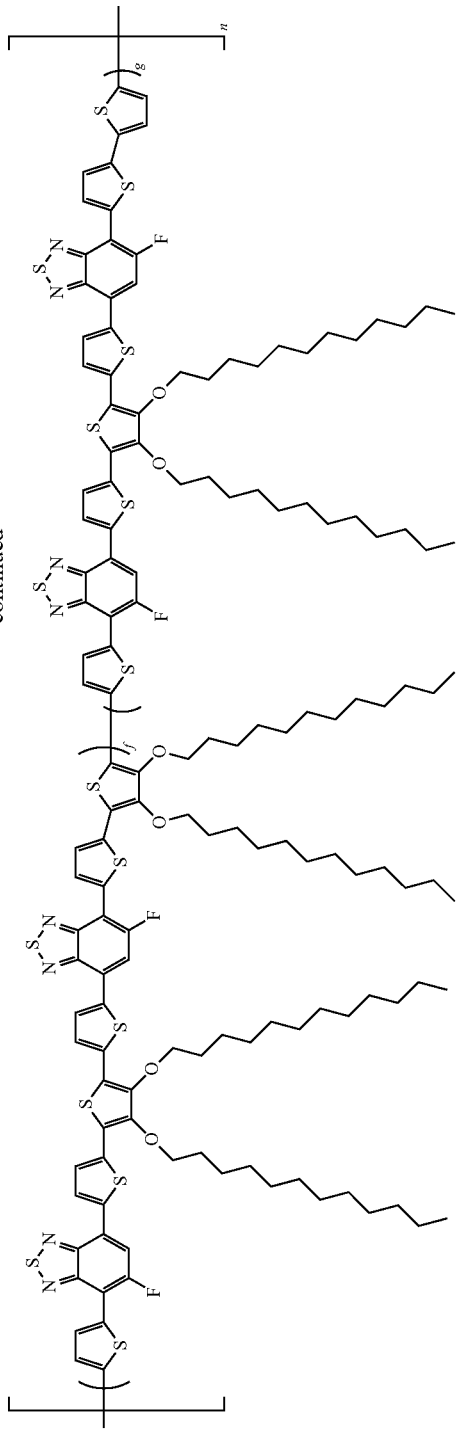
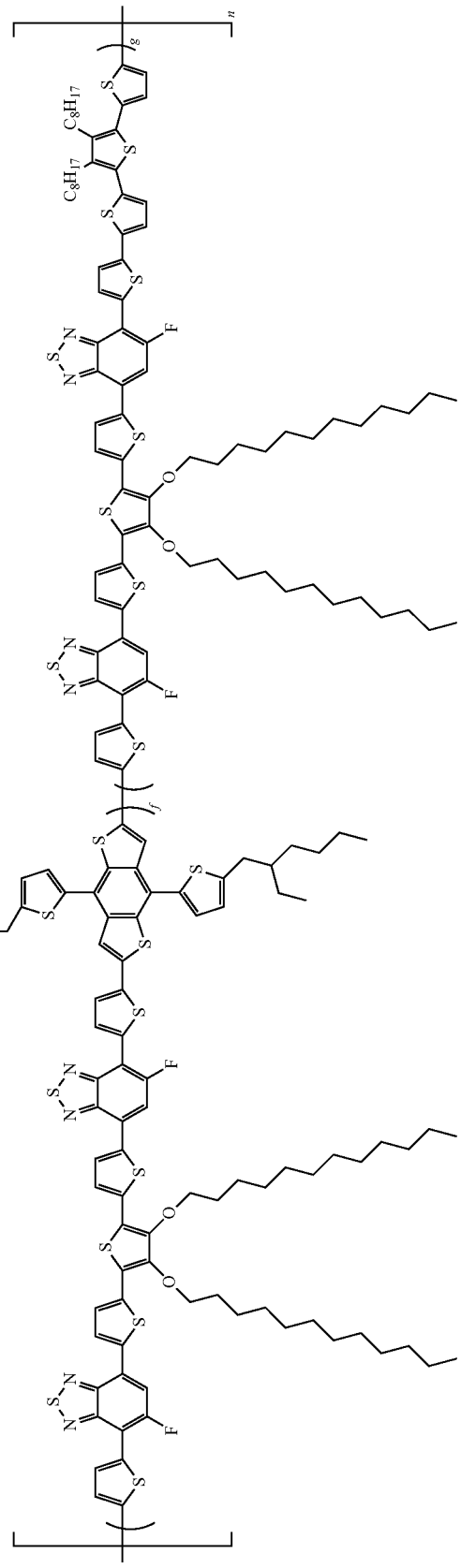

-continued
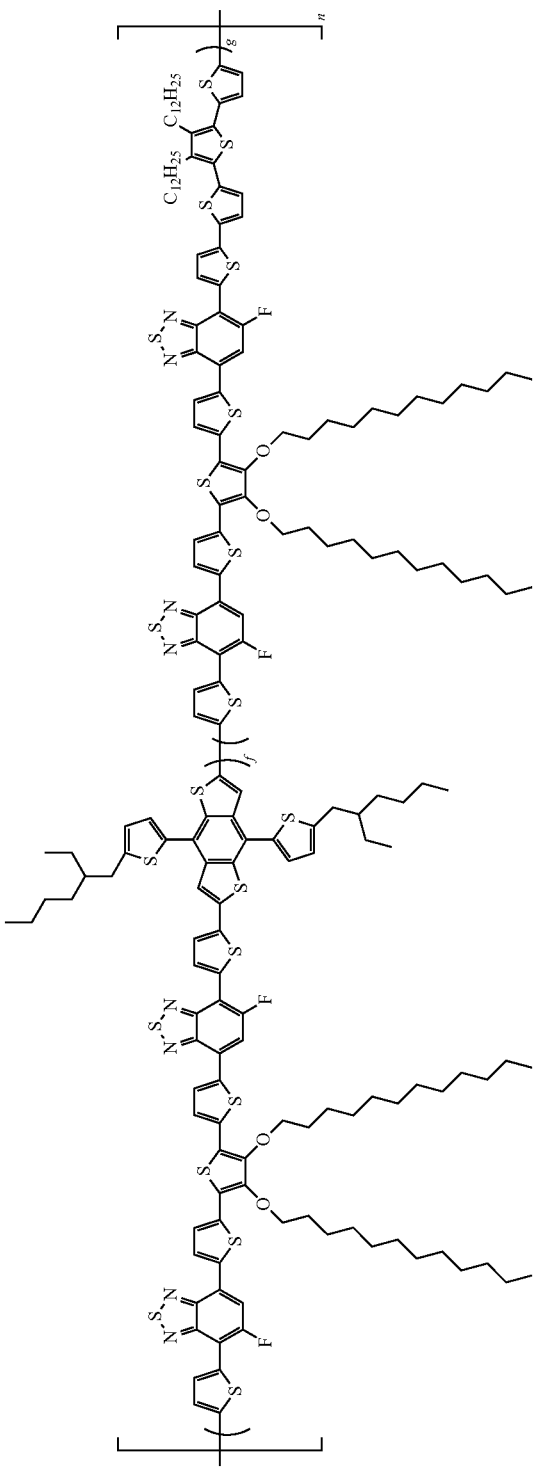
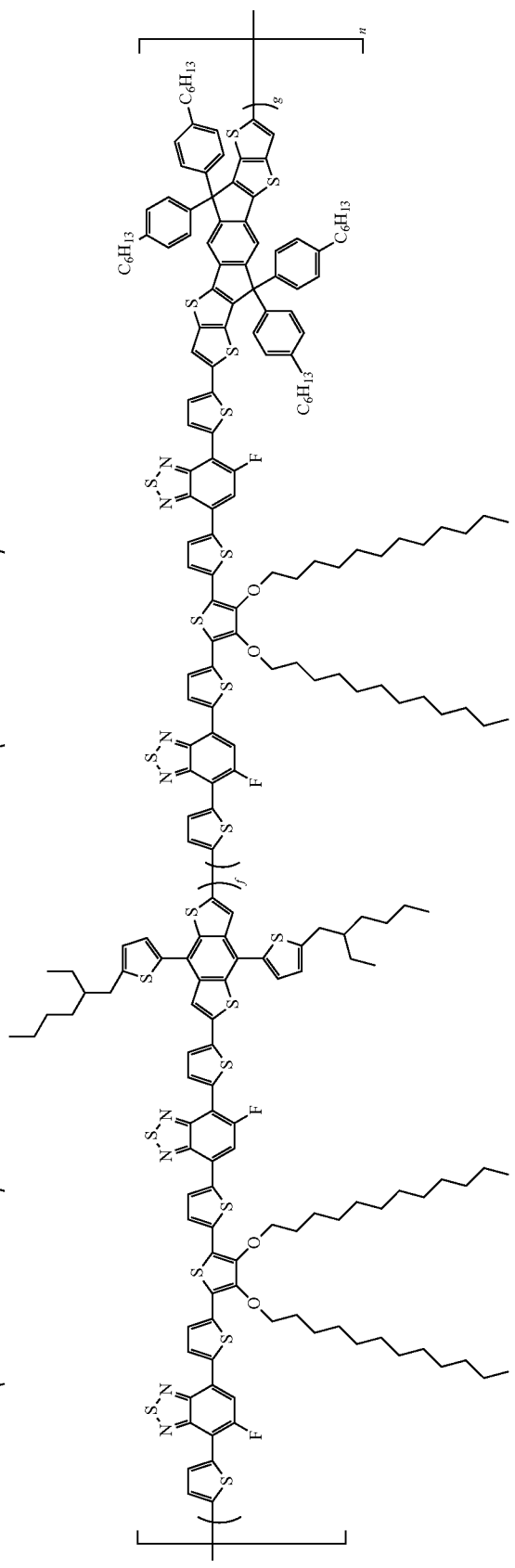

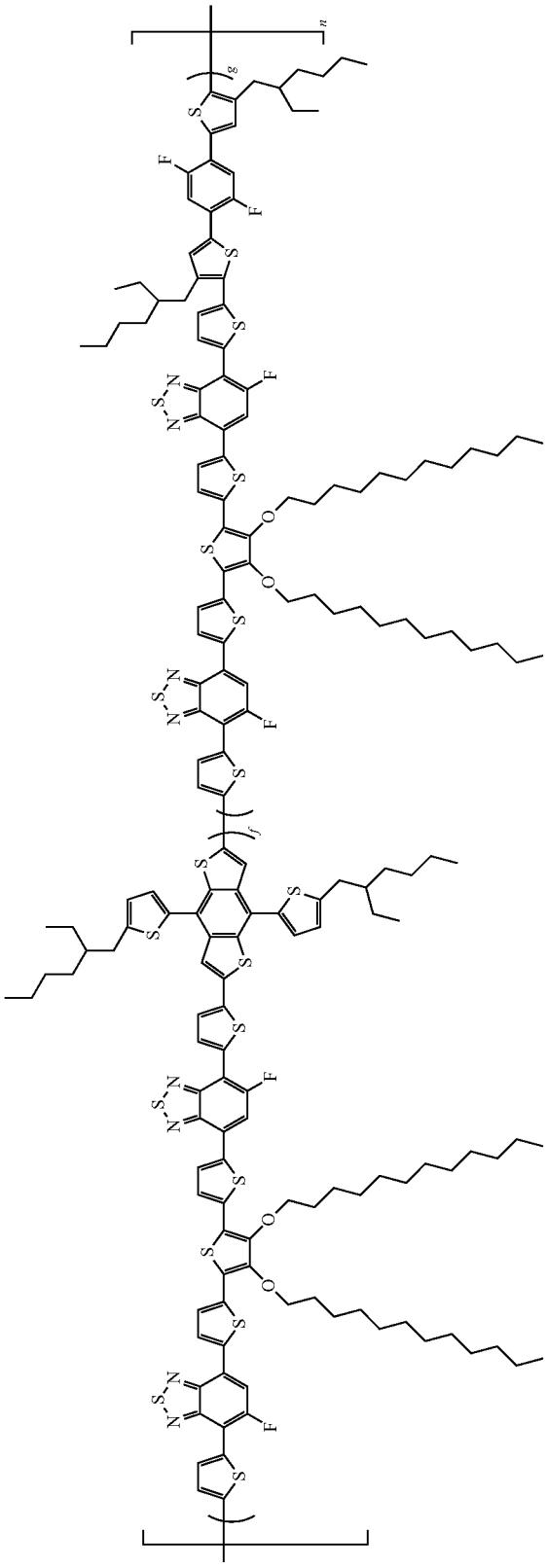
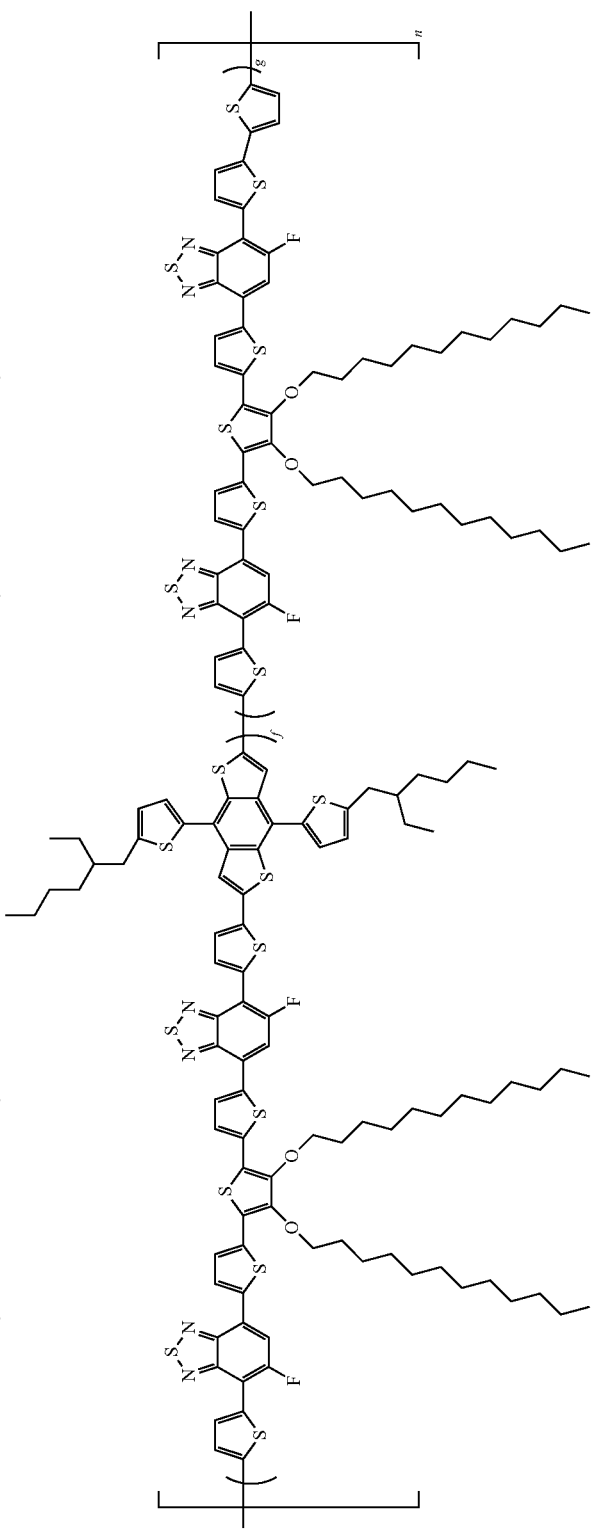

-continued
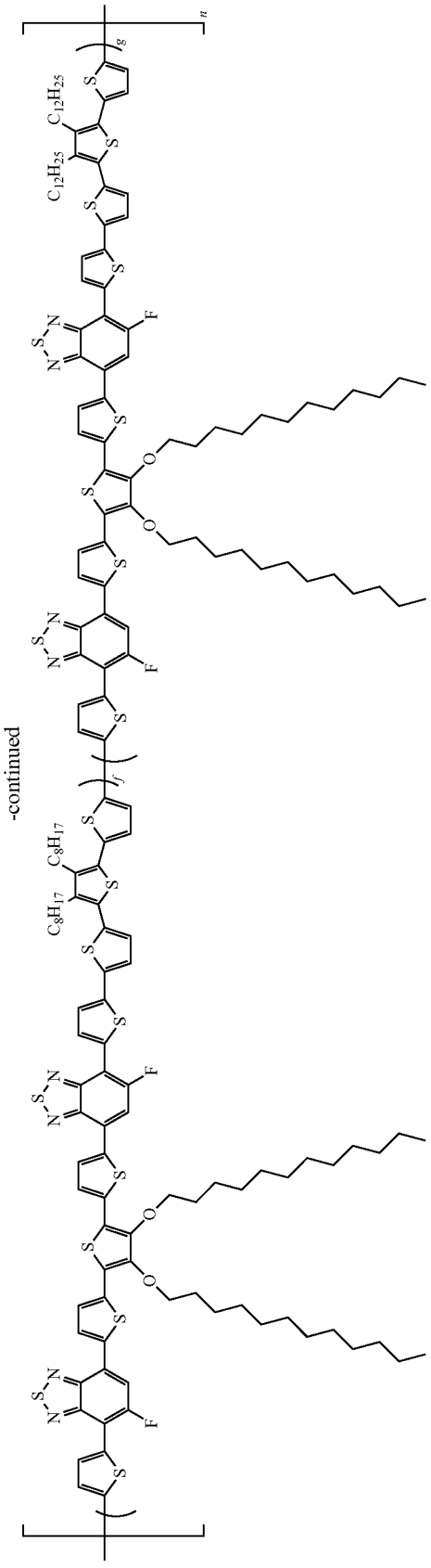
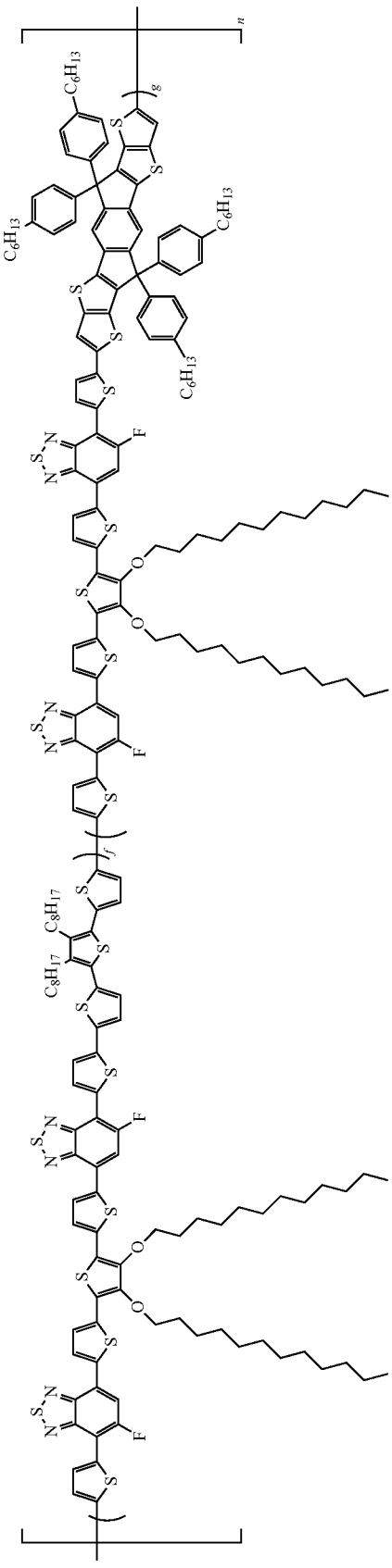

-continued
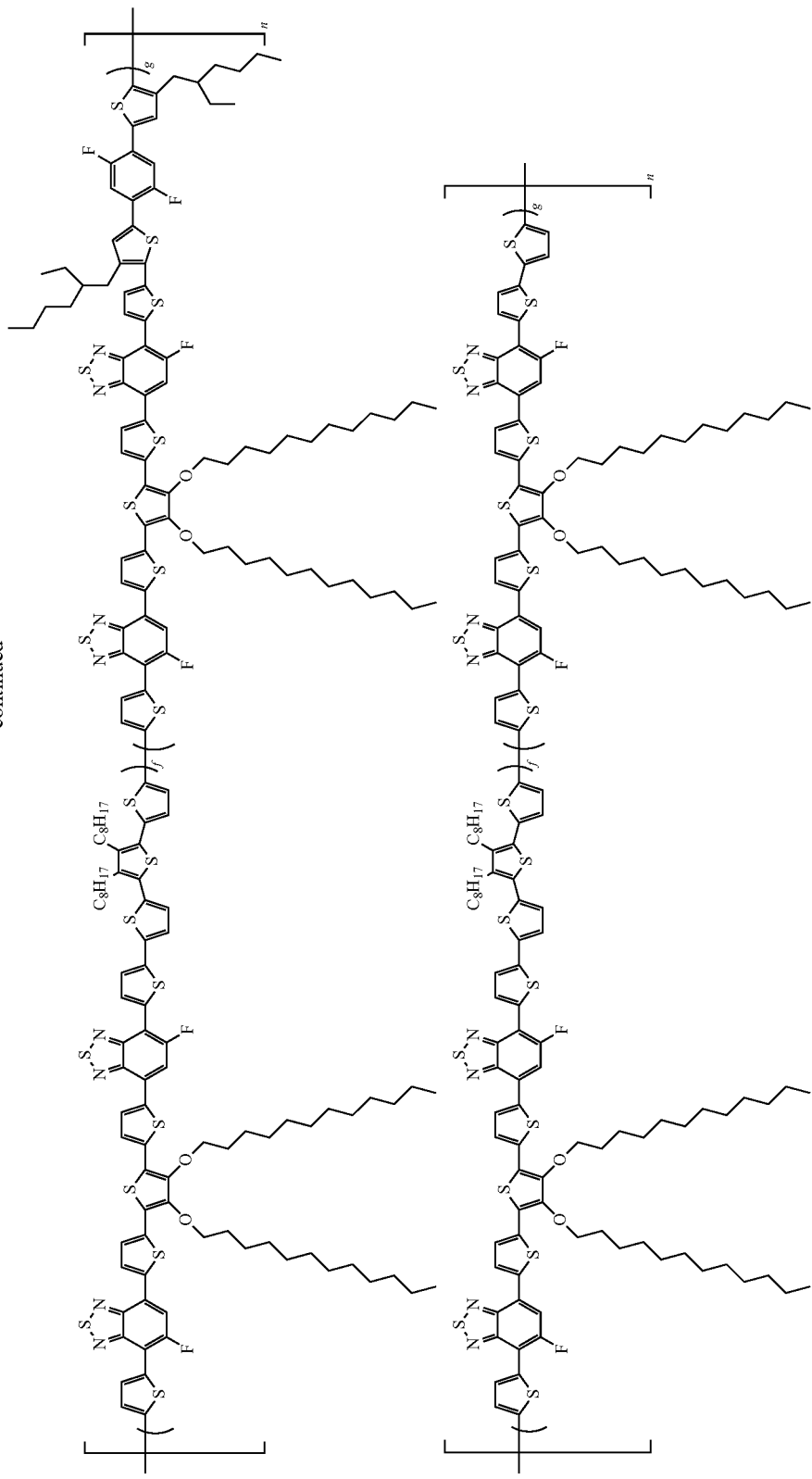

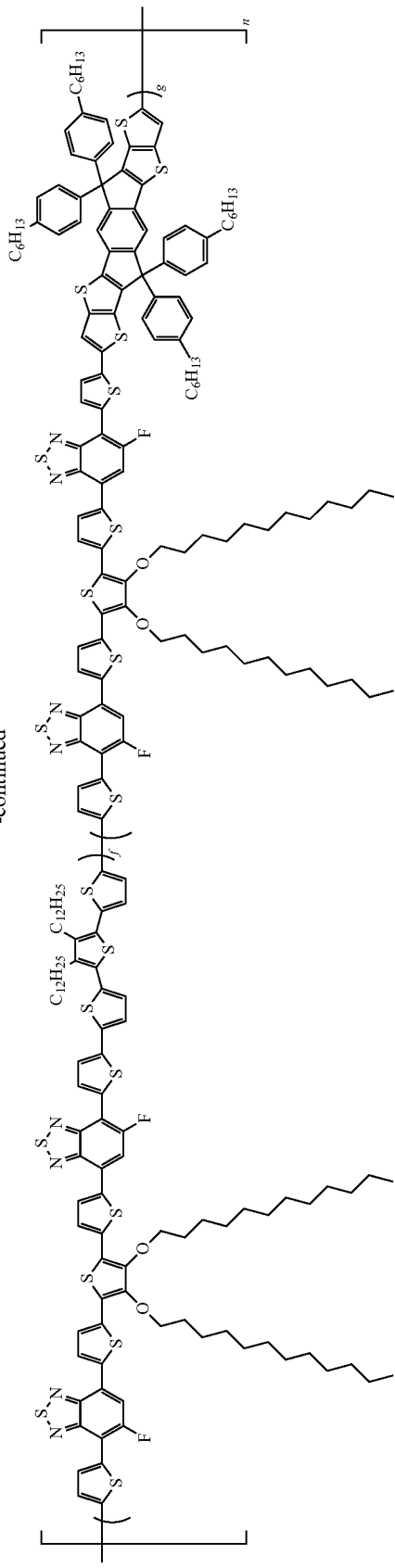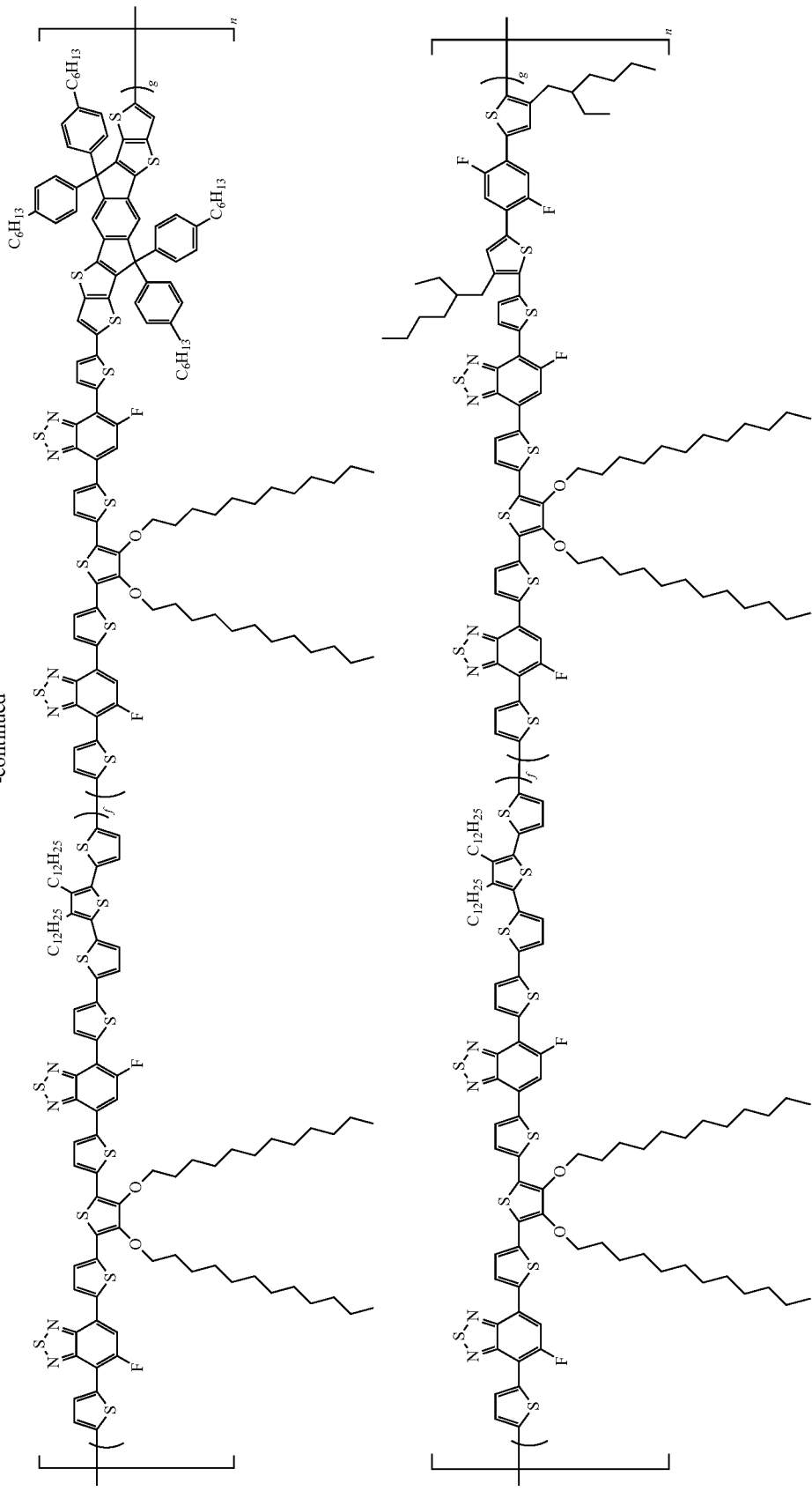

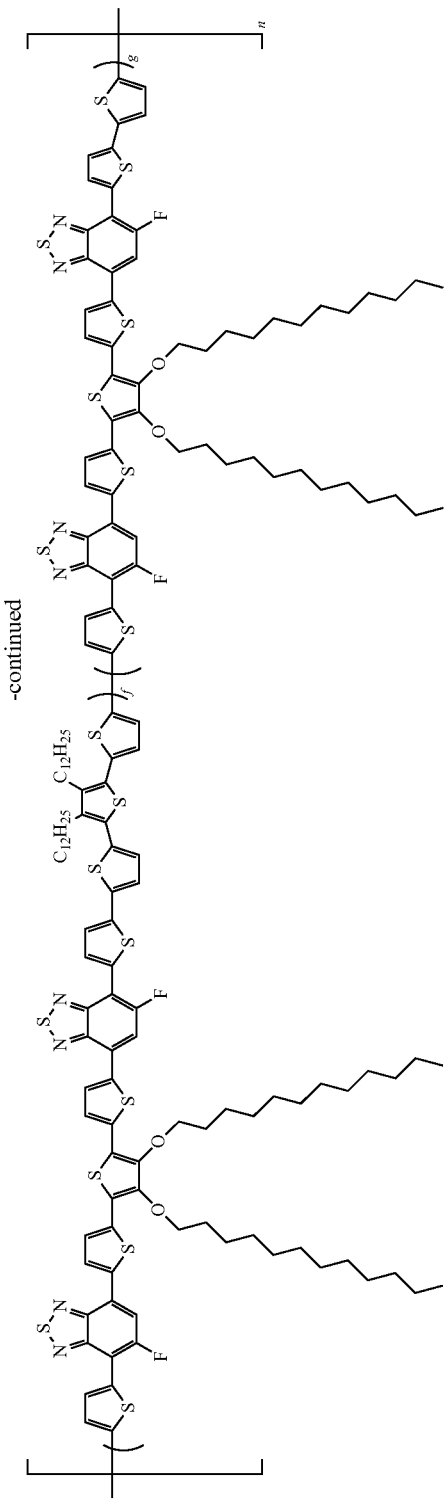
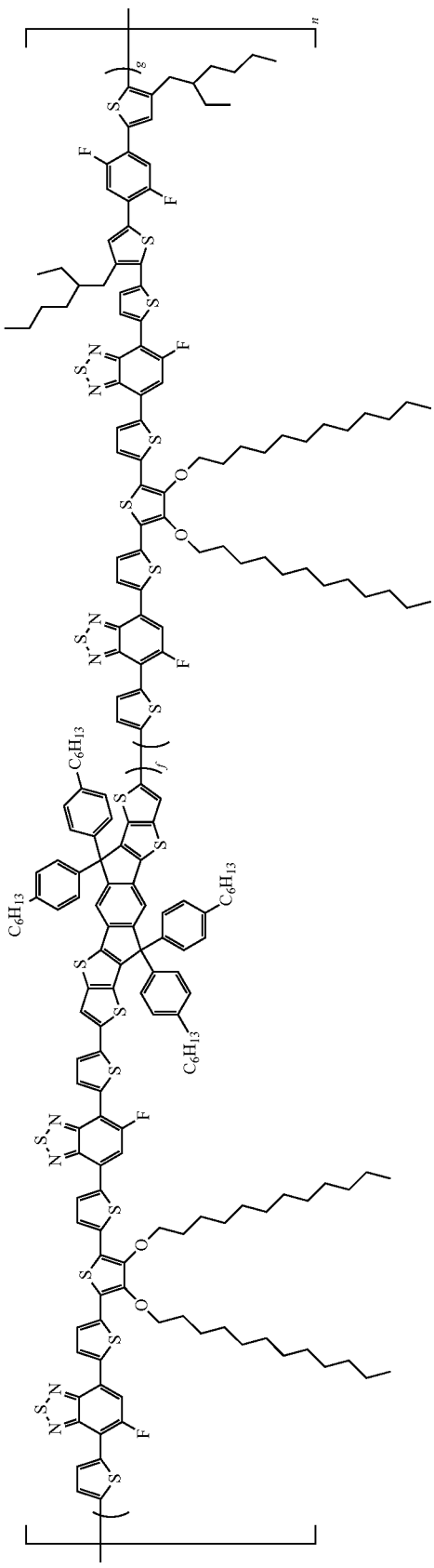

-continued
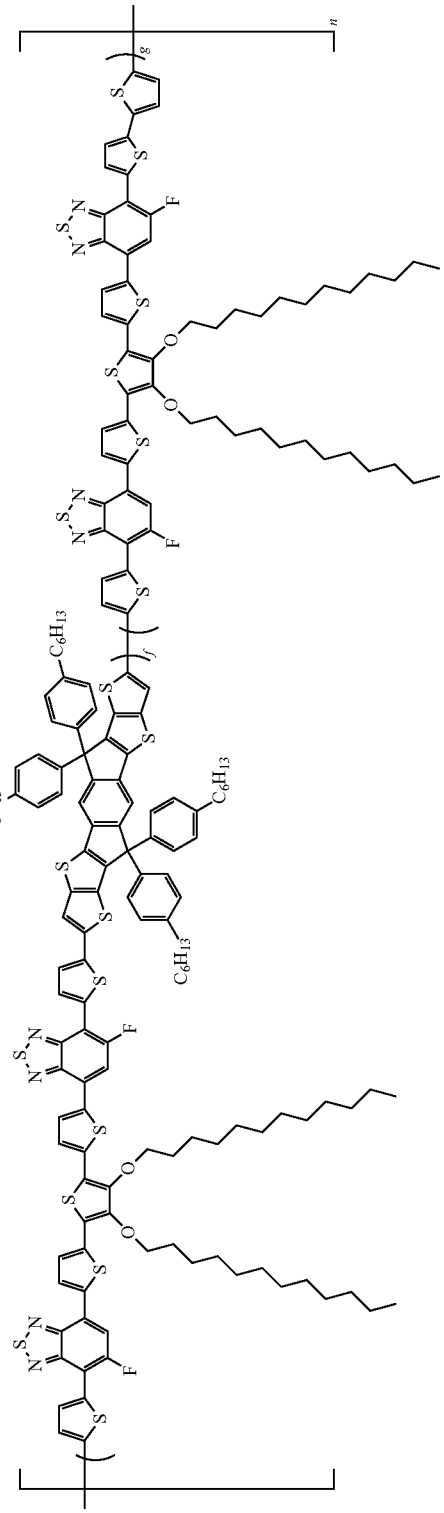
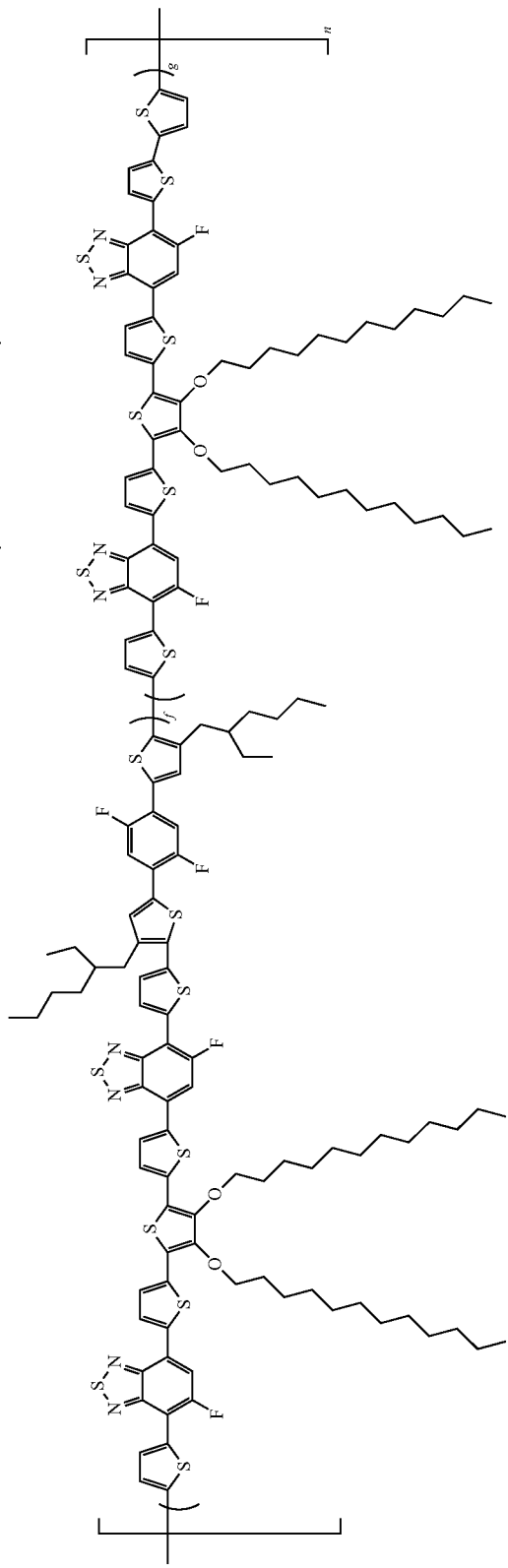

In the structures, f is a mole fraction, and a real number of 0<f<1, g is a mole fraction, and a real number of 0<g<1, f+g=1, and n is the number of repeating units in the structures, and an integer from 1 to 10,000.

In an exemplary embodiment of the present specification, f and g are the same as or different from each other, and are each a real number from 0.3 to 0.7, and f+g=1.

In an exemplary embodiment of the present specification, f is 0.3, and g is 0.7.

In an exemplary embodiment of the present specification, f is 0.7, and g is 0.3.

In an exemplary embodiment of the present specification, an end group of the copolymer is a substituted or unsubstituted aryl group or a substituted or unsubstituted heterocyclic group. Specifically, in an exemplary embodiment of the present specification, the end group of the copolymer is a thiophene group or a substituted or unsubstituted phenyl group.

In an exemplary embodiment of the present specification, the copolymer has a number average molecular weight of 2,000 g/mol to 30,000,000 g/mol. Preferably, the copolymer has a number average molecular weight of 5,000 g/mol to 10,000,000 g/mol. More preferably, the copolymer has a number average molecular weight of 10,000 g/mol to 5,000,000 g/mol.

In an exemplary embodiment of the present specification, the copolymer may have a molecular weight distribution (PDI) of 1 to 100. Preferably, the copolymer has a molecular weight distribution of 1 to 3.

Another exemplary embodiment of the present specification provides a method for preparing a copolymer, the method including: allowing a first compound represented by the following Formula 1, a second compound represented by the following Formula 2, and a third compound represented by the following Formula 3 to react with one another.

when q1 and q2 are each 2 or more, the structures in the parenthesis are the same as or different from each other, A1, A1', A2, A2', A3, and A3' are the same as or different from each other, and are each independently a halogen group; a substituted or unsubstituted boron group; or —Sn-$R_aR_bR_c$, E1 is a first conjugated monomer, E2 is a second conjugated monomer different from the first conjugated monomer, X1, X2, and Z1 to Z5 are the same as or different from each other, and are each independently S, O, Se, Te, NR, CRR', SiRR', PR, or GeRR', and $R_a$, $R_b$, $R_c$, R, R', R1 to R4, and R11 to R18 are the same as or different from each other, and are each independently hydrogen; deuterium; a halogen group; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heterocyclic group.

In an exemplary embodiment of the present specification, A1, A1', A2, A2', A3, and A3' are the same as or different from each other, and are each independently a halogen group; or —$SnR_aR_bR_c$, and $R_a$, $R_b$, and $R_c$ are the same as those described above.

In an exemplary embodiment of the present specification, A1, A1', A2, A2', A3, and A3' are the same as or different from each other, and are each independently bromine or —$SnR_aR_bR_c$, and $R_a$, $R_b$, and $R_c$ are a methyl group.

[Formula 1]

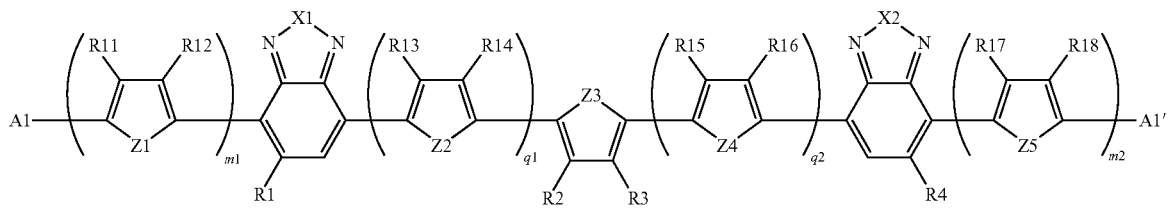

[Formula 2]

A2—E1—A2'

[Formula 3]

A3—E2—A3'

In Formulae 1 to 3, m1 and m2 are the same as or different from each other, and are each independently an integer from 0 to 5, when m1 and m2 are each 2 or more, the structures in the parenthesis are the same as or different from each other, q1 and q2 are the same as or different from each other, and are each independently an integer from 1 to 5, In an exemplary embodiment of the present specification, Formula 1 in the method for preparing a copolymer is the same as Formula 1 of the above-described copolymer.

In an exemplary embodiment of the present specification, E1 of Formula 2 and E2 of Formula 3 are the same as those defined in the copolymer. For example, E1 and E2 are different from each other, and are each any one of the following structures.

59
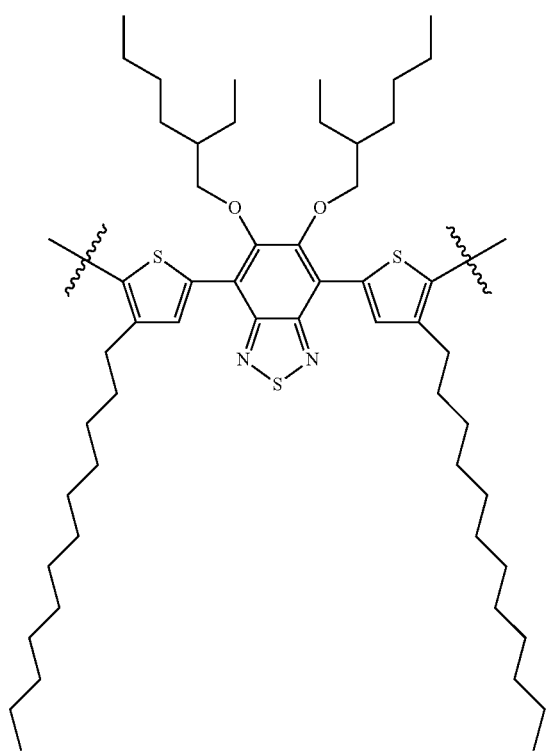
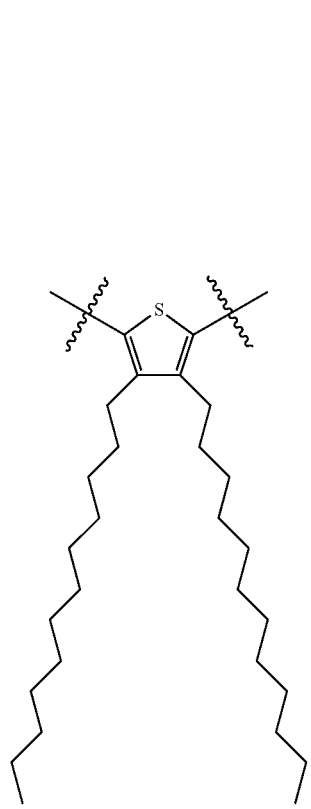
60
-continued
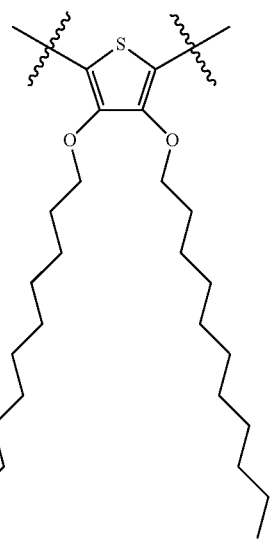
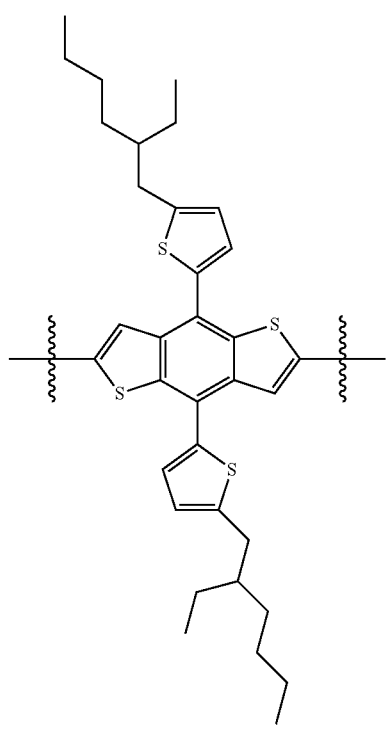

-continued

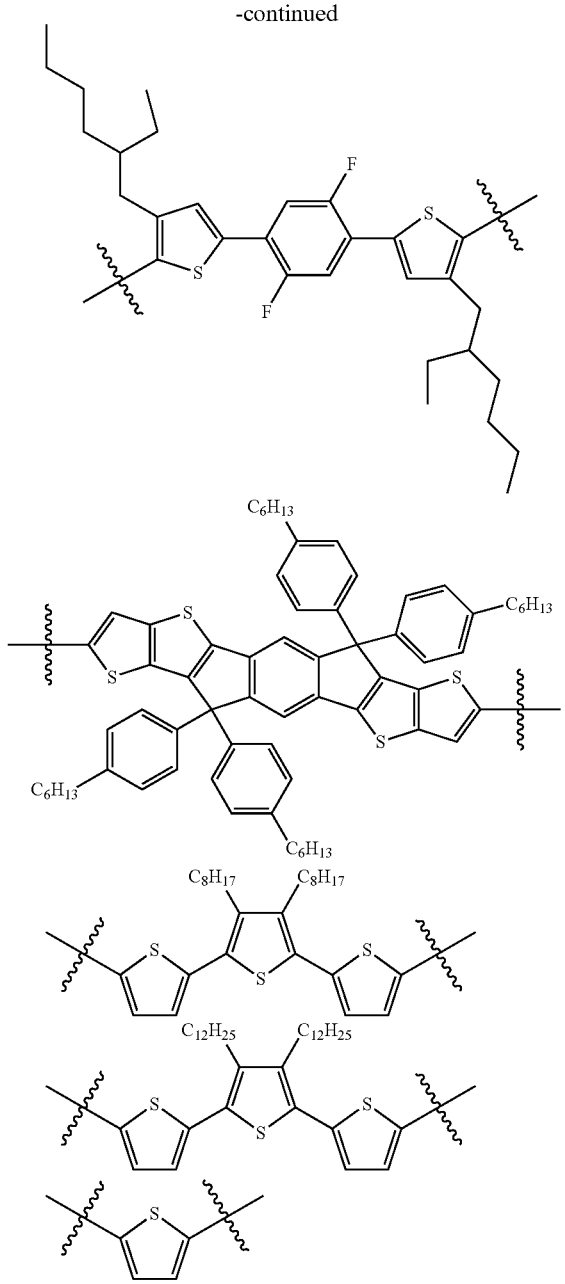

In an exemplary embodiment of the present specification, the method for preparing a copolymer includes: dissolving a first compound, a second compound, and a third compound in a solvent.

In an exemplary embodiment of the present specification, the solvent may be chlorobenzene, dichlorobenzene, or trichlorobenzene.

In an exemplary embodiment of the present specification, the content of the second compound in the solution is 0.3 mol to 0.7 mol based on 1 mol of the first compound.

In an exemplary embodiment of the present specification, the content of the third compound in the solution is 0.3 mol to 0.7 mol based on 1 mol of the first compound.

In an exemplary embodiment of the present specification, the solution means a solution in which the first compound, the second compound, and the third compound are dissolved in the solvent.

In an exemplary embodiment of the present specification, the method for preparing a copolymer includes: dissolving a first compound, a second compound, and a third compound in the first solvent, and then refluxing the solution at 90° C. to 150° C.

An exemplary embodiment of the present specification provides an organic solar cell including: a first electrode; a second electrode provided to face the first electrode; and an organic material layer having one or more layers provided between the first electrode and the second electrode and including a photoactive layer, in which one or more layers of the organic material layer include the copolymer.

FIG. 1 is a view illustrating an organic solar cell including a substrate 101, a first electrode 102, a hole transport layer 103, a photoactive layer 104, and a second electrode 105 according to an exemplary embodiment of the present specification.

In an exemplary embodiment of the present specification, the organic solar cell may further include an additional organic material layer. The organic solar cell may reduce the number of organic material layers by using an organic material which simultaneously has various functions.

In an exemplary embodiment of the present specification, the organic solar cell includes a first electrode, a photoactive layer, and a second electrode. The organic solar cell may further include a substrate, a hole transport layer, and/or an electron transport layer.

In an exemplary embodiment of the present specification, the photoactive layer includes the copolymer.

In an exemplary embodiment of the present specification, the organic material layer includes a hole transport layer, a hole injection layer, or a layer which simultaneously transports and injects holes, and the hole transport layer, the hole injection layer, or the layer which simultaneously transports and injects holes includes the copolymer.

In another exemplary embodiment, the organic material layer includes an electron injection layer, an electron transport layer, or a layer which simultaneously injects and transports electrons, and the electron injection layer, the electron transport layer, or the layer which simultaneously injects and transports electrons includes the copolymer.

In an exemplary embodiment of the present specification, the first electrode is an anode, and the second electrode is a cathode. In another exemplary embodiment of the present specification, the first electrode is a cathode, and the second electrode is an anode.

In an exemplary embodiment of the present specification, in the organic solar cell, a cathode, a photoactive layer, and an anode may be arranged in this order, and an anode, a photoactive layer, and a cathode may be arranged in this order, but the arrangement order is not limited thereto.

In another exemplary embodiment, in the organic solar cell, an anode, a hole transport layer, a photoactive layer, an electron transport layer, and a cathode may also be arranged in this order, and a cathode, an electron transport layer, a photoactive layer, a hole transport layer, and an anode may also be arranged in this order, but the arrangement order is not limited thereto.

In an exemplary embodiment of the present specification, the photoactive layer includes an electron donor and an electron acceptor, and the electron donor includes the copolymer.

In an exemplary embodiment of the present specification, a material for the electron acceptor may be selected from the group comprising of fullerene, fullerene derivatives, bathocuproine, semi-conducting elements, semi-conducting compounds, and combinations thereof. Specifically, the material for the electron acceptor may be phenyl $C_{60}$-butyric acid methyl ester ($PC_{60}BM$), phenyl $C_{61}$-butyric acid methyl ester ($PC_{61}BM$), or phenyl $C_{71}$-butyric acid methyl ester ($PC_{71}BM$).

In an exemplary embodiment of the present specification, the electron donor and the electron acceptor constitute a bulk heterojunction (BHJ). A material for the electron donor and a material for the electron acceptor may be mixed at a ratio (w/w) of 1:10 to 10:1. Specifically, the material for the electron donor and the material for the electron acceptor may be mixed at a ratio (w/w) of 1:1 to 1:10, and more specifically, the material for the electron donor and the material for the electron acceptor may be mixed at a ratio (w/w) of 1:1 to 1:5. If necessary, the material for the electron donor and the material for the electron acceptor may be mixed at a ratio (w/w) of 1:1 to 1:3.

In an exemplary embodiment of the present specification, the photoactive layer has a bilayer thin film structure including an n-type organic material layer and a p-type organic material layer, and the p-type organic material layer includes the copolymer.

In the present specification, the substrate may be a glass substrate or a transparent plastic substrate having excellent transparency, surface smoothness, ease of handling, and waterproofing properties, but is not limited thereto, and the substrate is not limited as long as the substrate is typically used in the organic solar cell. Specific examples thereof include glass or polyethylene terephthalate (PET), polyethylene naphthalate (PEN), polypropylene (PP), polyimide (PI), triacetyl cellulose (TAC), and the like, but are not limited thereto.

The first electrode may be a material which is transparent and has excellent conductivity, but is not limited thereto. Examples thereof include: a metal such as vanadium, chromium, copper, zinc, and gold, or an alloy thereof; a metal oxide such as zinc oxide, indium oxide, indium tin oxide (ITO), and indium zinc oxide (IZO); a combination of a metal and an oxide, such as ZnO:Al or $SnO_2$:Sb; a conductive polymer, such as poly(3-methylthiophene), poly[3,4-(ethylene-1,2-dioxy)thiophene] (PEDOT), polypyrrole, and polyaniline; and the like, but are not limited thereto.

A method of forming the first electrode is not particularly limited, but the first electrode may be formed, for example, by being applied onto one surface of a substrate, or by being coated in the form of a film, using a method such as sputtering, e-beam, thermal deposition, spin coating, screen printing, inkjet printing, doctor blade, or gravure printing.

When the first electrode is formed on a substrate, the first electrode may be subjected to processes of cleaning, removing moisture, and hydrophilic modification.

For example, a patterned ITO substrate is sequentially cleaned with a cleaning agent, acetone, and isopropyl alcohol (IPA), and then dried on a hot plate at 100° C. to 150° C. for 1 to 30 minutes, preferably at 120° C. for 10 minutes in order to remove moisture, and when the substrate is completely cleaned, the surface of the substrate is hydrophilically modified.

Through the surface modification described above, the junction surface potential may be maintained at a level suitable for a surface potential of a photoactive layer.

Further, during the modification, a polymer thin film may be easily formed on the first electrode, and the quality of the thin film may also be improved.

Examples of a pre-treatment technology for a first electrode include a) a surface oxidation method using a parallel flat plate-type discharge, b) a method of oxidizing the surface by ozone produced by using UV rays in a vacuum state, c) an oxidation method using oxygen radicals produced by plasma, and the like.

One of the methods may be selected according to the state of the first electrode or the substrate. However, although any method is used, it is preferred to commonly prevent oxygen from being separated from the surface of the first electrode or the substrate, and maximally inhibit moisture and organic materials from remaining. In this case, it is possible to maximize a substantial effect of the pre-treatment.

As a specific example, it is possible to use a method of oxidizing the surface by ozone produced by using UV. In this case, a patterned ITO substrate after being ultrasonically cleaned is baked on a hot plate and dried well, and then introduced into a chamber, and the patterned ITO substrate may be cleaned by ozone generated by allowing an oxygen gas to react with UV light by operating a UV lamp.

However, the surface modification method of the patterned ITO substrate in the present specification need not be particularly limited, and any method may be used as long as the method is a method of oxidizing a substrate.

The second electrode may be a metal having a low work function, but is not limited thereto. Specific examples thereof include: a metal such as magnesium, calcium, sodium, potassium, titanium, indium, yttrium, lithium, gadolinium, aluminum, silver, tin, and lead, or an alloy thereof; and a multi-layer structured material, such as LiF/Al, $LiO_2$/Al, LiF/Fe, Al:Li, Al:$BaF_2$, and Al:$BaF_2$:Ba, but are not limited thereto.

The second electrode may be deposited and formed in a thermal evaporator showing a vacuum degree of $5\times10^{-7}$ torr or less, but the forming method is not limited to this method.

A material for the hole transport layer and/or a material for the electron transport layer serve to efficiently transfer electrons and holes separated from a photoactive layer to an electrode, and the materials are not particularly limited.

The material for the hole transport layer may be poly(3,4-ethylenedioxythiophene) doped with poly(styrenesulfonic acid) (PEDOT:PSS) and molybdenum oxide ($MoO_x$); vanadium oxide ($V_2O_5$); nickel oxide (NiO); tungsten oxide ($WO_x$); and the like, but is not limited thereto.

The material for the electron transport layer may be electron-extracting metal oxides, and specific examples thereof include: metal complexes of 8-hydroxyquinoline; complexes including $Alq_3$; metal complexes including Liq; LiF; Ca; titanium oxide ($TiO_x$); zinc oxide (ZnO); cesium carbonate ($Cs_2CO_3$); and the like, but are not limited thereto.

The photoactive layer may be formed by dissolving a photoactive material such as an electron donor and/or an electron acceptor in an organic solvent, and then applying the solution by a method such as spin coating, dip coating, screen printing, spray coating, doctor blade, and brush painting, but the forming method is not limited thereto.

MODE FOR INVENTION

Preparation Example 1. Preparation of Compound 1-g (1) Preparation of Compound 1-b

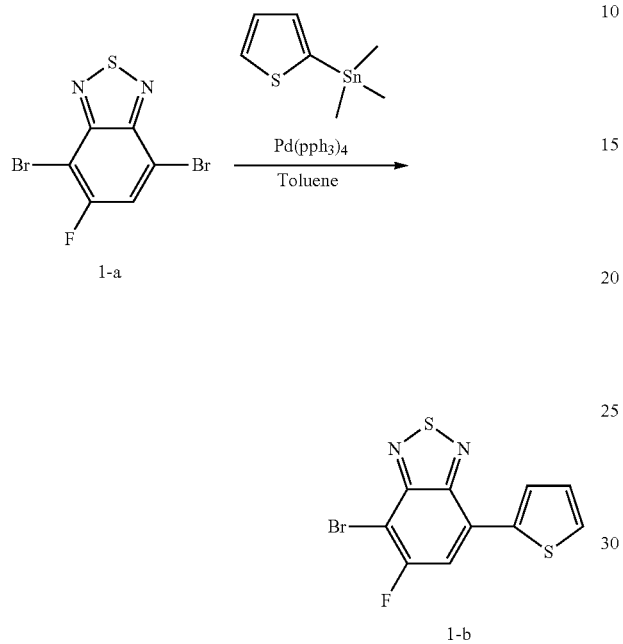

Compound 1-a (10 g, 32.1 mmol), 2-(trimethylstannyl) thiophene (8.15 g, 33.0 mmol), and a tetrakis(triphenylphosphine)palladium(0) catalyst (Pd(PPh$_3$)$_4$) (0.74 g, 0.64 mmol) were put into 150 mL of toluene, and were allowed to react with one another at 110° C. for 24 hours. After reaction, an extraction was performed with dichloromethane, the remaining water was removed over magnesium sulfate (MgSO$_4$), and then the solvent was removed under reduced pressure. 9.51 g of Compound 1-b was obtained by subjecting the remaining product to silica column (eluent: hexane) (Yield: 94%).

(2) Preparation of Compound 1-d

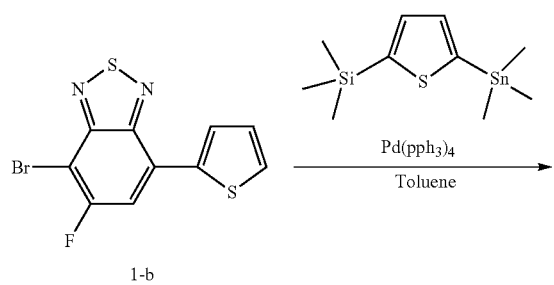

Compound 1-b (9 g, 28.56 mmol), 2-trimethylstannyl-5-trimethylsilane-thiophene (9.41 g, 29.5 mmol), and a tetrakis (triphenylphosphine)palladium(0) catalyst (Pd(PPh$_3$)$_4$) (0.65 g, 0.56 mmol) were put into 120 mL of toluene, and were allowed to react with one another at 110° C. for 24 hours. After reaction, an extraction was performed with dichloromethane, the remaining water was removed over magnesium sulfate (MgSO$_4$), and then the solvent was removed under reduced pressure. 10.0 g of Compound 1-c was obtained by subjecting the remaining product to silica column (eluent: hexane) (Yield: 90%).

After Compound 1-c (9.76 g, 25.00 mmol) was dissolved in 200 mL of tetrahydrofuran (THF), 2 M lithium diisopropylamide (LDA)(15.0 mL, 30.00 mmol) was slowly injected thereinto at −78° C., and then the resulting mixture was stirred for 2 hours. Trimethyltin chloride (Me$_3$SnCl)(33 mL, 33 mmol) was added thereto at the same temperature, and the resulting mixture was slowly warmed to room temperature, and then allowed to react at room temperature for 3 hours. After reaction, an extraction was performed with dichloromethane, the remaining water was removed over magnesium sulfate (MgSO$_4$), and then the solvent was removed under reduced pressure, and the residue was recrystallized by using dichloromethane and methanol to obtain 12.2 g of Compound 1-d (Yield: 88%).

FIG. 2 is a view illustrating an NMR spectrum of Compound 1-d.

FIG. 3 is a view illustrating an MS spectrum of Compound 1-d.

(3) Preparation of Compound 1-e

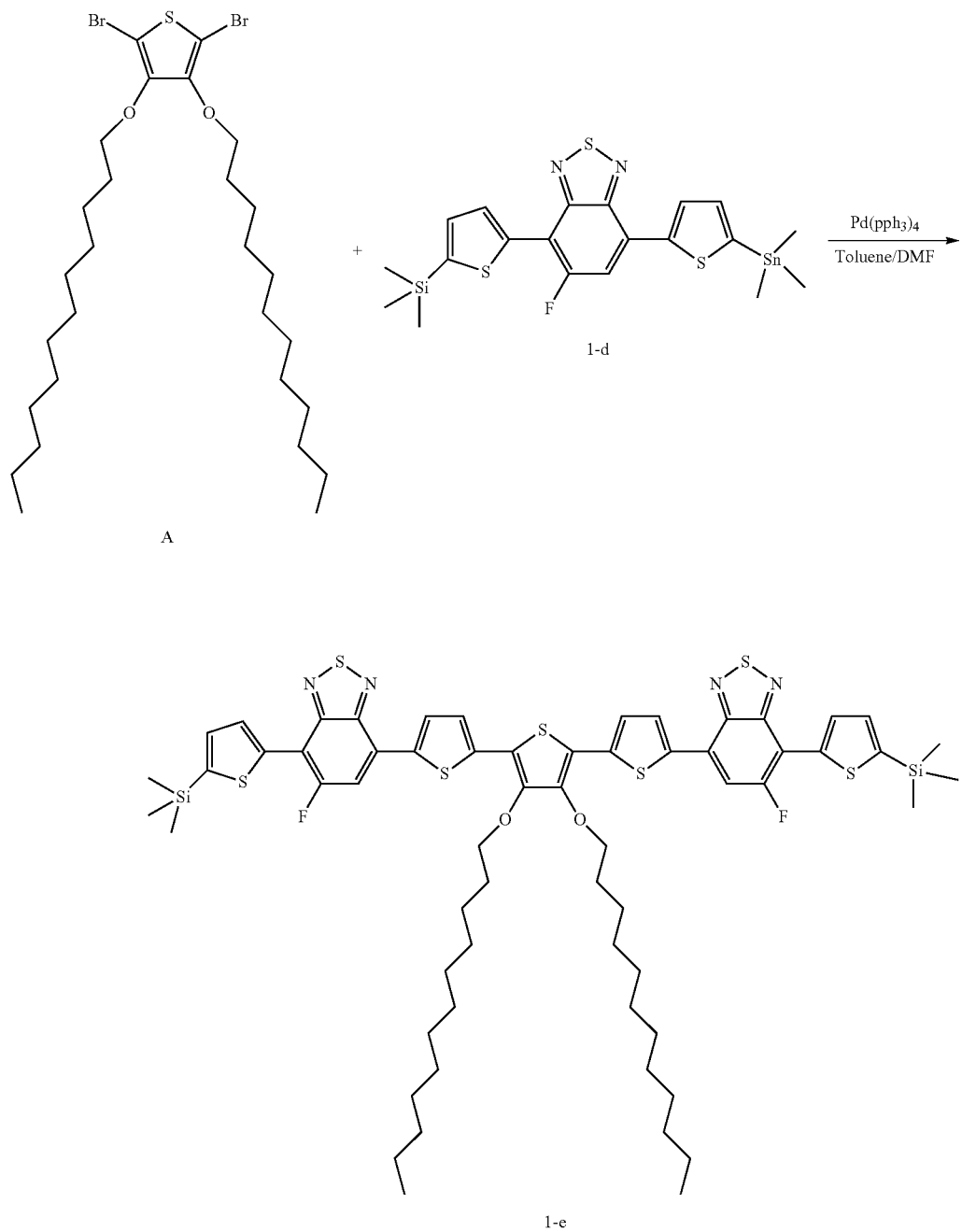

Compound A (2.75 g, 4.5 mmol) and Compound 1-d (5.53 g, 10 mmol) were dissolved in 75 mL of toluene and 25 mL of dimethylformamide (DMF), a tetrakis(triphenylphosphine)palladium(0) catalyst (Pd(PPh$_3$)$_4$) (0.2427 g, 0.21 mmol) was put thereinto, and the resulting mixture was allowed to react at each of 90° C., 100° C., and 110° C. for 48 hours by gradually heating the mixture. The residue produced when the mixture was cooled was precipitated in methanol, and the precipitate was filtered, and then washed with water. Thereafter, the solvent was evaporated through a drying process, the remaining product was purified through flash chromatography using methylene chloride and chloroform, and then recrystallized by using methylene chloride and methanol to obtain a blue solid. Thereafter, the solid was washed with methanol and dried under a vacuum condition for 24 hours to obtain 4.71 g of Compound 1-e (Yield: 85%).

FIG. 4 is a view illustrating an MS spectrum of Compound 1-e.

(4) Preparation of Compound 1-f

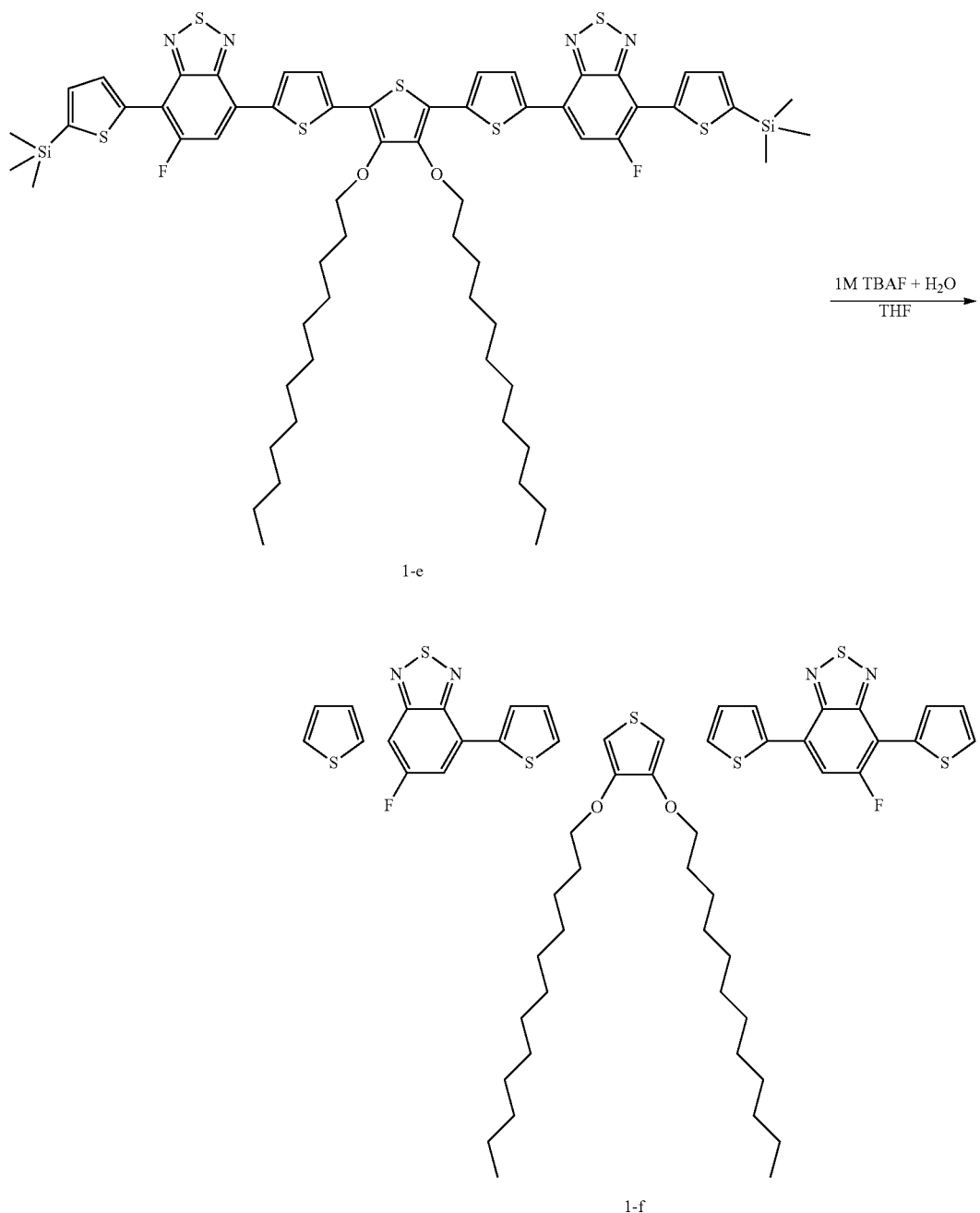

Compound 1-e (4.5 g, 3.66 mmol) was dissolved in 300 mL of tetrahydrofuran (THF) under nitrogen atmosphere at room temperature, and a product produced by adding dropwise a tetrahydrofuran solution (1.0 M, 10 mL, 10 mmol, including 5% $H_2O$) in which tetrabutylammonium fluoride (TBAF) is dissolved thereto was refluxed for 2 hours. Thereafter, 50 mL of ether and an aqueous sodium hydrogen carbonate ($NaHCO_3$) solution were added thereto, and the resulting mixture was stirred for 10 minutes. Thereafter, the mixture was washed by using an aqueous sodium chloride (NaCl) solution, and the solvent was evaporated under a vacuum condition. The remaining product was purified through flash chromatography using chloroform, and then recrystallized by using chloroform to obtain a dark violet solid. Thereafter, the solid was washed through water, methanol, hexane, ethyl acetate, and acetone, and then dried under a vacuum condition for 24 hours to obtain 3.15 g of Compound 1-f (Yield: 79%).

FIG. 5 is a view illustrating an MS spectrum of Compound 1-f.

FIG. 6 is a view illustrating an NMR spectrum of Compound 1-f.

(5) Preparation of Compound 1-g

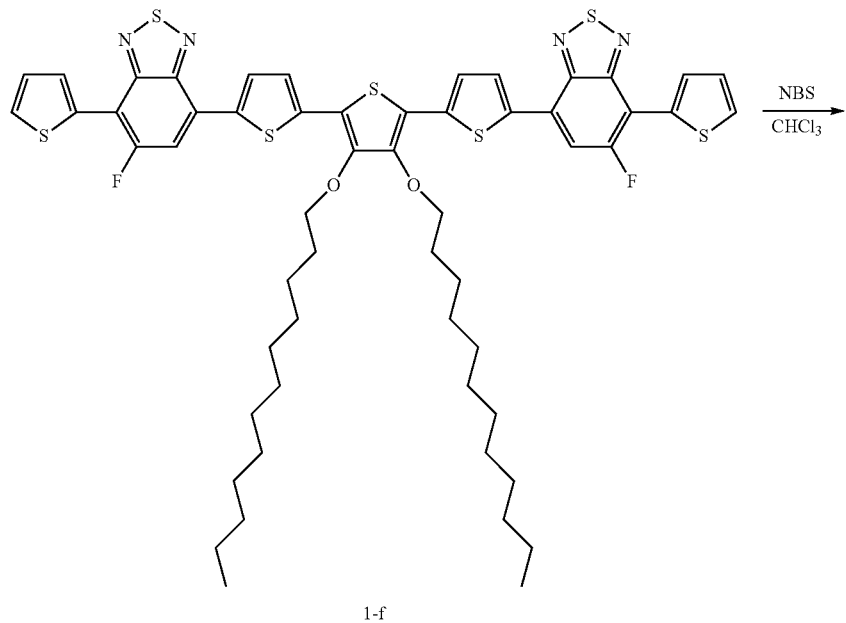

1-f

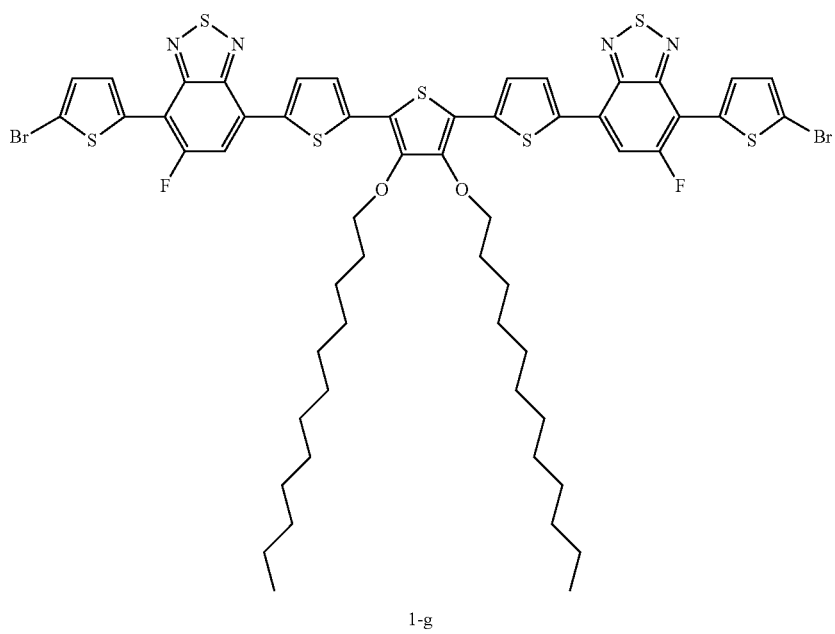

1-g

Compound 1-f (2.95 g, 2.72 mmol) and N-bromosuccinimide (NBS) (0.99 g, 5.58 mmol) were put into 300 mL of chloroform (CHCl$_3$) at 0° C., and the resulting mixture was stirred at room temperature for 24 hours. Thereafter, the solvent was evaporated, and purification was performed through flash chromatography (eluent (hexane to hexane: methylene chloride)) using the residue to obtain 2.1 g of Compound 1-g (Yield: 62%).

FIG. 7 is a view illustrating an MS spectrum of Compound 1-g.

Preparation Example 2-1. Preparation of Copolymer 1
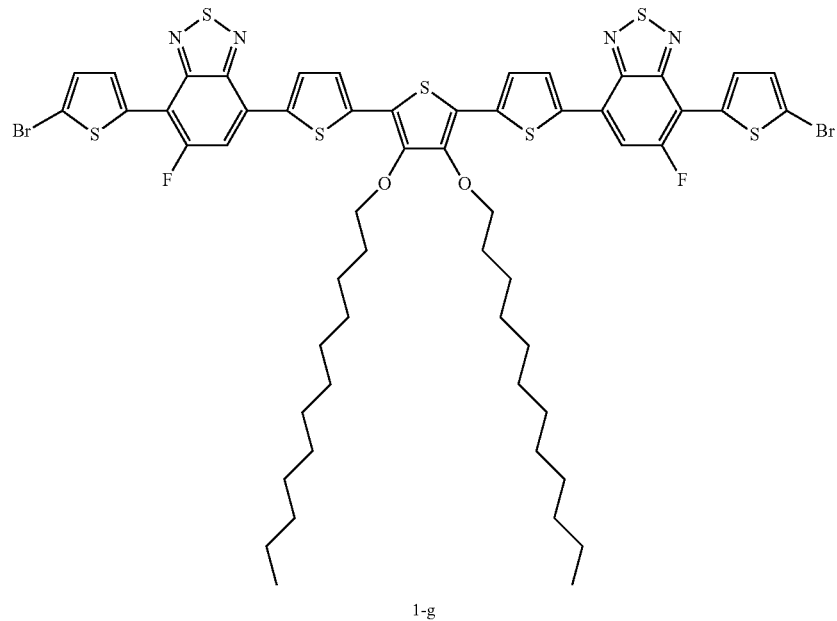
1-g
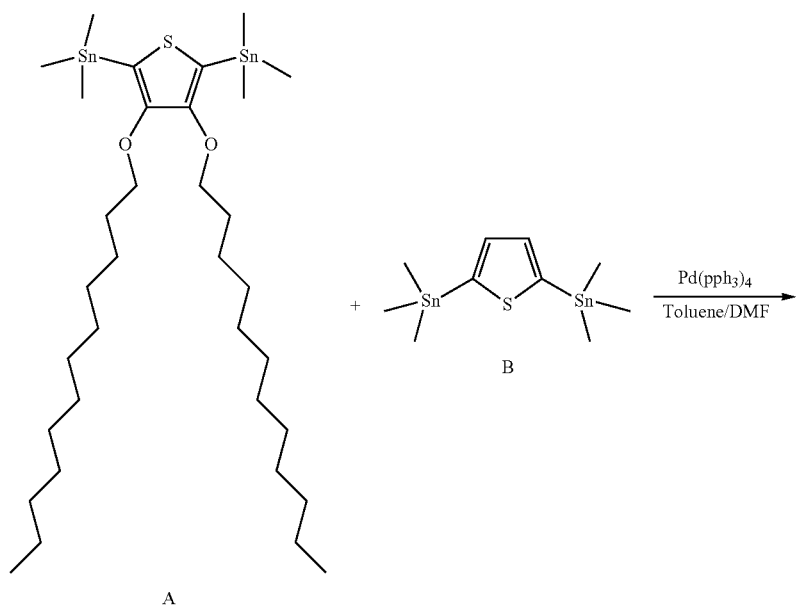

-continued

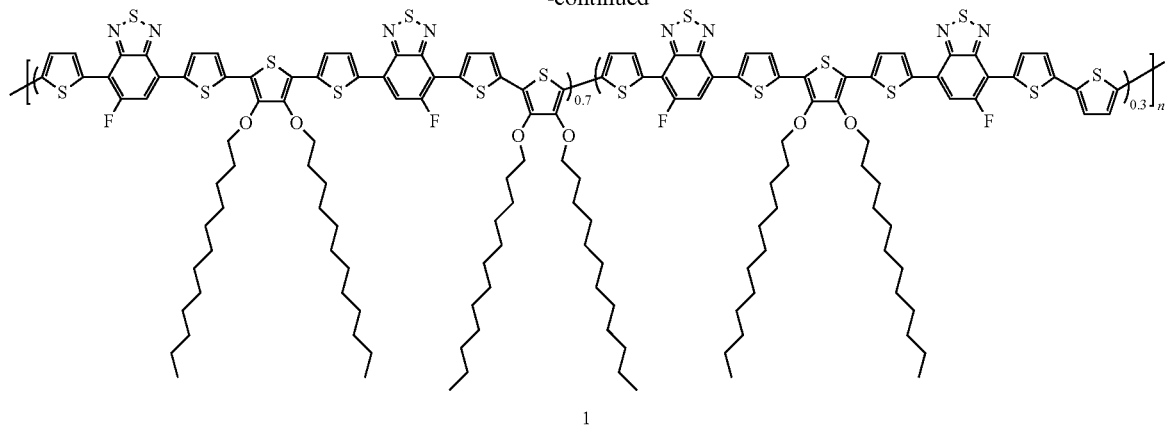

10 mL of chlorobenzene (CB), Compound 1-g (0.6217 g, 0.5 mmol), Compound A (0.2724 g, 0.35 mmol), and Compound B (0.061 g, 0.15 mmol) were put into a 100 mL flask under a nitrogen (N$_2$) atmosphere, and nitrogen-bubbled for 30 minutes. Thereafter, a tetrakis(triphenylphosphine)palladium(0) catalyst (Pd(PPh$_3$)$_4$) (0.11 g, 0.01 mmol) was put thereinto, and the resulting mixture was stirred at 110° C. for 72 hours. After 0.5 mL of Br-benzotrifluoride was added thereto, the resulting mixture was stirred for 24 hours, and cooled to room temperature. Thereafter, the product was poured into chloroform and allowed to pass through a short silica column, and a precipitate was filtered by pouring the resulting product into a mixed solution (180 mL of methanol+20 mL of HCl (concentration of 2 M)). Thereafter, the product was subjected to soxhlet extraction in an order of methanol, acetone, hexane, methylene chloride, and chloroform. An extract extracted with chloroform was put into methanol to form a precipitate. The produced precipitate was collected, purified, and dried under a vacuum condition to obtain 0.52 g of Copolymer 1. In this case, the number average molecular weight thereof was measured to confirm that Copolymer 1 had been prepared (Number average molecular weight: 29,000 g/mol, PDI: 1.34, Yield: 73%).

Preparation Examples 2-2 to 2-36

Copolymers were prepared in the same manner as in Preparation Example 2-1, except that in Preparation Example 2-1, Compound A and Compound B were modified as in the following Table.

TABLE 1

| | Reactant 1 | Reactant 2 | Yield | Number average molecular weight (g/mol) | PDI |
|---|---|---|---|---|---|
| Preparation Example 2-1 | A | B | 73% | 29,000 | 1.34 |
| Preparation Example 2-2 | A | C | 68% | 24,600 | 1.52 |
| Preparation Example 2-3 | A | D | 83% | 25,300 | 1.45 |
| Preparation Example 2-4 | A | E | 58% | 19,500 | 1.39 |
| Preparation Example 2-5 | A | F | 60% | 32,500 | 1.26 |
| Preparation Example 2-6 | A | G | 77% | 42,300 | 1.49 |
| Preparation Example 2-7 | A | H | 63% | 37,300 | 1.42 |
| Preparation Example 2-8 | A | I | 83% | 28,400 | 1.61 |
| Preparation Example 2-9 | B | C | 91% | 32,800 | 1.57 |
| Preparation Example 2-10 | B | D | 81% | 36,800 | 1.46 |
| Preparation Example 2-11 | B | E | 71% | 32,300 | 1.32 |
| Preparation Example 2-12 | B | F | 43% | 29,100 | 1.19 |
| Preparation Example 2-13 | B | G | 51% | 21,300 | 1.38 |
| Preparation Example 2-14 | B | H | 83% | 32,600 | 1.47 |
| Preparation Example 2-15 | B | I | 79% | 26,300 | 1.38 |
| Preparation Example 2-16 | C | D | 85% | 38,200 | 1.63 |
| Preparation Example 2-17 | C | E | 81% | 24,200 | 1.53 |
| Preparation Example 2-18 | C | F | 92% | 18,300 | 1.56 |
| Preparation Example 2-19 | C | G | 57% | 21,200 | 1.45 |
| Preparation Example 2-20 | C | H | 86% | 27,300 | 1.53 |
| Preparation Example 2-21 | C | I | 75% | 14,200 | 1.43 |
| Preparation Example 2-22 | D | E | 77% | 32,500 | 1.28 |
| Preparation Example 2-23 | D | F | 83% | 30,200 | 1.62 |
| Preparation Example 2-24 | D | G | 42% | 21,500 | 1.15 |
| Preparation Example 2-25 | D | H | 79% | 13,200 | 1.29 |
| Preparation Example 2-26 | D | I | 69% | 17,200 | 1.30 |
| Preparation Example 2-27 | E | F | 85% | 24,300 | 1.47 |
| Preparation Example 2-28 | E | G | 39% | 10,200 | 1.14 |
| Preparation Example 2-29 | E | H | 82% | 40,200 | 1.39 |

TABLE 1-continued
| | Reactant 1 | Reactant 2 | Yield | Number average molecular weight (g/mol) | PDI |
|---|---|---|---|---|---|
| Preparation Example 2-30 | E | I | 68% | 25,800 | 1.37 |
| Preparation Example 2-31 | F | G | 73% | 31,000 | 1.42 |
| Preparation Example 2-32 | F | H | 82% | 28,600 | 1.58 |
| Preparation Example 2-33 | F | I | 77% | 24,200 | 1.39 |
| Preparation Example 2-34 | G | H | 74% | 18,700 | 1.49 |
| Preparation Example 2-35 | G | I | 88% | 20,300 | 1.53 |
| Preparation Example 2-36 | H | I | 71% | 27,200 | 1.48 |
In Table 1, A to I are each the following compound.
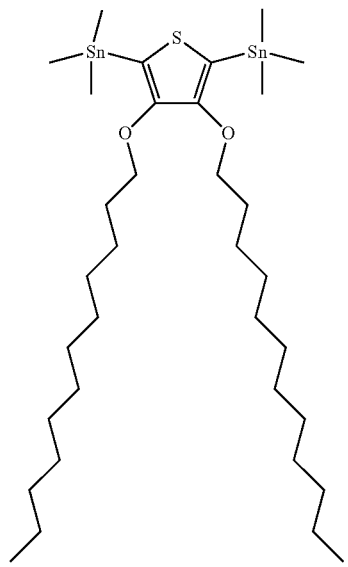
A
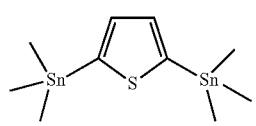
B
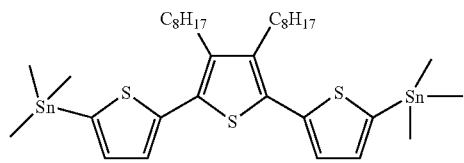
C
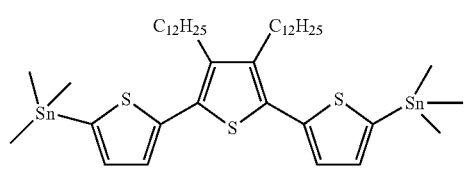
D
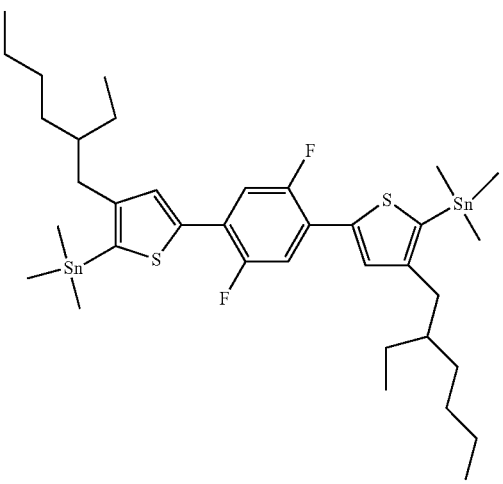
E
F -continued G
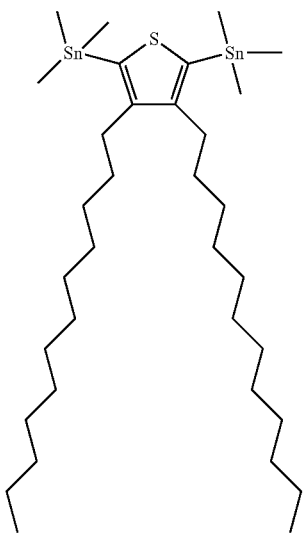

H

I
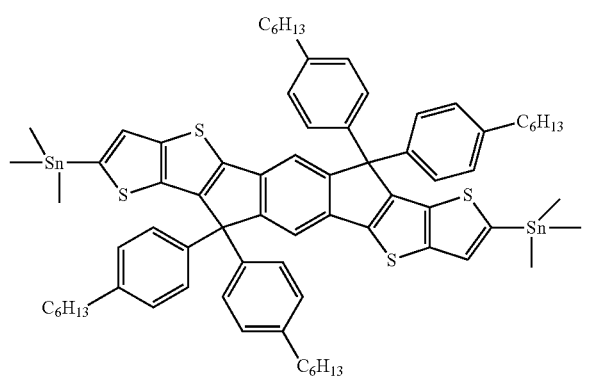

Example 1

A composite solution was prepared by using Copolymer 1 prepared in the Preparation Example 1 as a donor and PCBM as an acceptor to dissolve Copolymer 1 and PCBM at a ratio of 1:2 in chlorobenzene (CB). In this case, the concentration thereof was adjusted to 2.0 wt %, and the organic solar cell was made to have a structure of ITO/ZnO/a photoactive layer/MoO$_3$/Ag. A glass substrate coated with ITO was ultrasonically washed using distilled water, acetone, and 2-propanol, and the ITO surface was treated with ozone for 10 minutes, followed by spin-coating a ZnO precursor solution and a heat treatment at 120° C. for 10 minutes. Thereafter, the composite solution was filtered with a 0.45 μm PP syringe filter, and then spin-coated to form a photoactive layer. Thereafter, MoO$_3$ was deposited onto the photoactive layer to a thickness of 5 nm to 20 nm at a rate of 0.4 Å/s in a thermal evaporator, thereby preparing a hole transport layer. Thereafter, Ag was deposited onto the hole transport layer to a thickness of 10 nm at a rate of 1 Å/s in the thermal evaporator, thereby manufacturing an organic solar cell.

Example 2

An organic solar cell was manufactured in the same manner as in Example 1, except that the copolymer prepared in Preparation Example 2-3 was used instead of Copolymer 1 in Example 1.

Example 3

An organic solar cell was manufactured in the same manner as in Example 1, except that the copolymer prepared in Preparation Example 2-4 was used instead of Copolymer 1 in Example 1.

Example 4

An organic solar cell was manufactured in the same manner as in Example 1, except that the copolymer prepared in Preparation Example 2-5 was used instead of Copolymer 1 in Example 1.

Example 5

An organic solar cell was manufactured in the same manner as in Example 1, except that the copolymer prepared in Preparation Example 2-6 was used instead of Copolymer 1 in Example 1.

Example 6

An organic solar cell was manufactured in the same manner as in Example 1, except that the copolymer prepared in Preparation Example 2-9 was used instead of Copolymer 1 in Example 1.

Example 7

An organic solar cell was manufactured in the same manner as in Example 1, except that the copolymer prepared in Preparation Example 2-10 was used instead of Copolymer 1 in Example 1.

Example 8

An organic solar cell was manufactured in the same manner as in Example 1, except that the copolymer prepared in Preparation Example 2-14 was used instead of Copolymer 1 in Example 1.

Example 9

An organic solar cell was manufactured in the same manner as in Example 1, except that the copolymer prepared in Preparation Example 2-19 was used instead of Copolymer 1 in Example 1.

The photoelectric conversion characteristics of the organic solar cells manufactured in Examples 1 to 9 were measured under the condition of 100 mW/cm² (AM 1.5), and the results are shown in the following Table 2.

TABLE 2

| | $V_{oc}$ (V) | $J_{sc}$ (mA/cm²) | FF | η (%) |
|---|---|---|---|---|
| Example 1 | 0.810 | 8.123 | 0.420 | 2.76 |
| Example 2 | 0.852 | 10.267 | 0.501 | 4.38 |
| Example 3 | 0.914 | 7.120 | 0.552 | 3.59 |
| Example 4 | 0.735 | 8.258 | 0.537 | 3.26 |
| Example 5 | 0.872 | 11.195 | 0.593 | 5.79 |
| Example 6 | 0.835 | 12.288 | 0.650 | 6.67 |
| Example 7 | 0.759 | 11.951 | 0.610 | 5.53 |
| Example 8 | 0.892 | 9.481 | 0.590 | 4.99 |
| Example 9 | 0.911 | 11.326 | 0.61 | 6.30 |

In Table 2, $V_{oc}$, $J_{sc}$, FF, and η mean an open-circuit voltage, a short-circuit current, a fill factor, and energy conversion efficiency, respectively. The open-circuit voltage and the short-circuit current are an X axis intercept and a Y axis intercept, respectively, in the fourth quadrant of the voltage-current density curve, and as the two values are increased, the efficiency of the solar cell is preferably increased. In addition, the fill factor is a value obtained by dividing the area of a rectangle, which may be drawn within the curve, by the product of the short-circuit current and the open-circuit voltage. The energy conversion efficiency may be obtained when these three values are divided by the intensity of the irradiated light, and the higher value is preferred.

EXPLANATION OF REFERENCE NUMERALS AND SYMBOLS

101: Substrate
102: First electrode
103: Hole transport layer
104: Photoactive layer
105: Second electrode

The invention claimed is:

1. A copolymer comprising:
   a repeating unit derived from a compound represented by the following Formula 1-2:

[Formula 1-2]

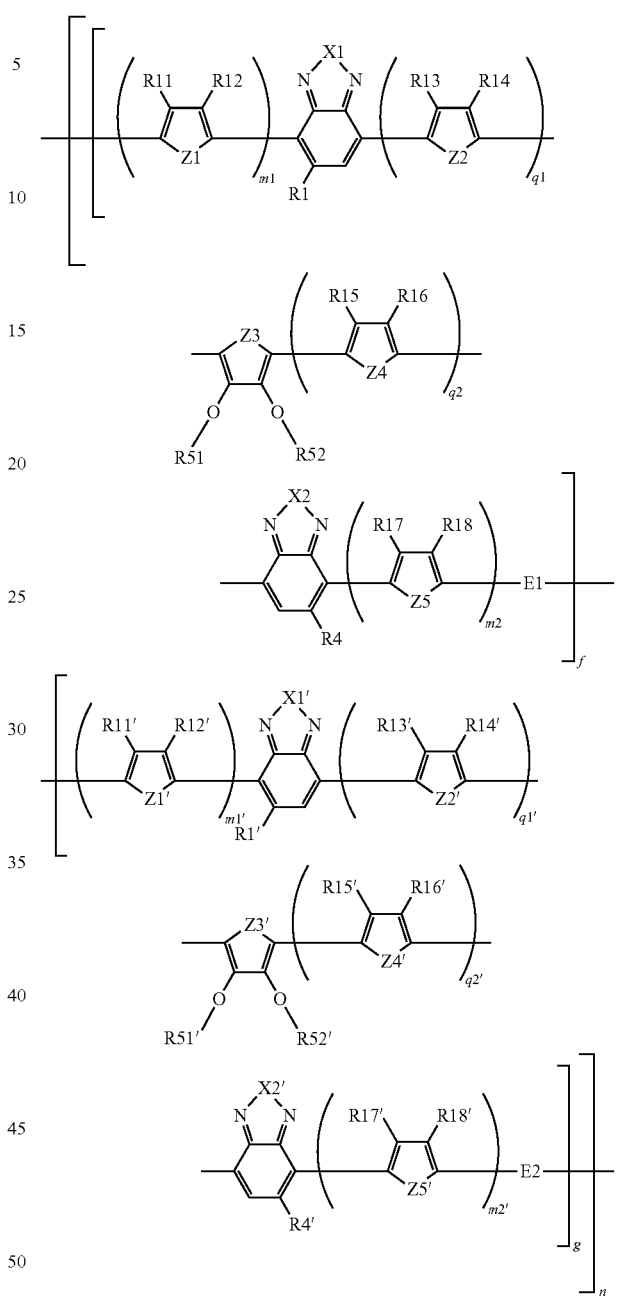

in Formula 1-2,
m1, m2, m1', and m2' are the same as or different from each other, and are each independently an integer from 1 to 5,
when m1, m2, m1'and m2' are each 2 or more, each of

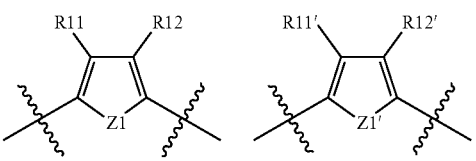

-continued

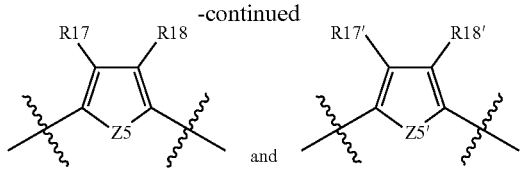

is the same as or different from each other, q1, q2, q1', and q2' are the same as or different from each other, and are each independently an integer from 1 to 5, when q1, q2, and q1', and q2' are each 2 or more, each of

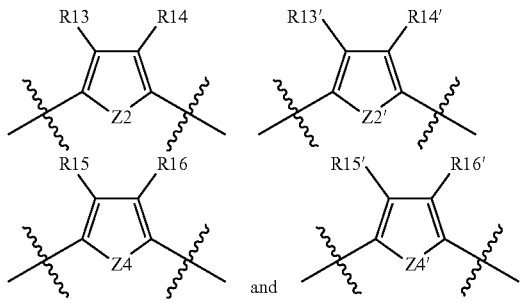

is the same as or different from each other,

X1, X2, X1', X2', Z1 to Z5, and Z1' to Z5' are the same as or different from each other, and are each independently S, O, Se, Te, NR, CRR', SiRR', PR, or GeRR', $R_a$, $R_b$, $R_c$, R, R', R1 to R4, and R11 to R18 are the same as or different from each other, and E1 is a first conjugated monomer, E2 is a second conjugated monomer different from the first conjugated monomer, R1, R4, R1', and R4' are the same as or different from each other, and are each independently deuterium; a halogen group; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heterocyclic group, R, R', R11 to R18, and R11' to R18' are the same as or different from each other, and are each independently hydrogen; deuterium; a halogen group; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heterocyclic group, R51, R51', R52, and R52' are the same as or different from each other, and are each independently a substituted or unsubstituted alkyl group; or a substituted or unsubstituted aryl group;

f is a mole fraction, and a real number of $0 < f < 1$, g is a mole fraction, and a real number of $0 < g < 1$, $f+g=1$, and n is the number of repeating units of the unit, and an integer from 1 to 10,000.

2. The copolymer of claim 1, wherein the first conjugated monomer and the second conjugated monomer each independently comprise one group of or a combination of two or more groups of a substituted or unsubstituted alkenylene group, a substituted or unsubstituted arylene group, and a substituted or unsubstituted divalent heterocyclic group.

3. The copolymer of claim 1, wherein the first conjugated monomer and the second conjugated monomer each independently comprise any one of or a combination of two or more of the following structures:

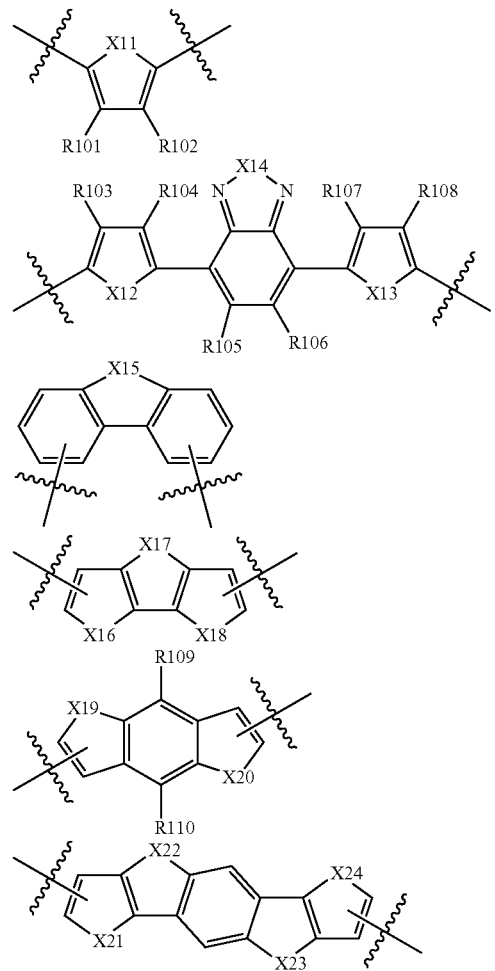

-continued

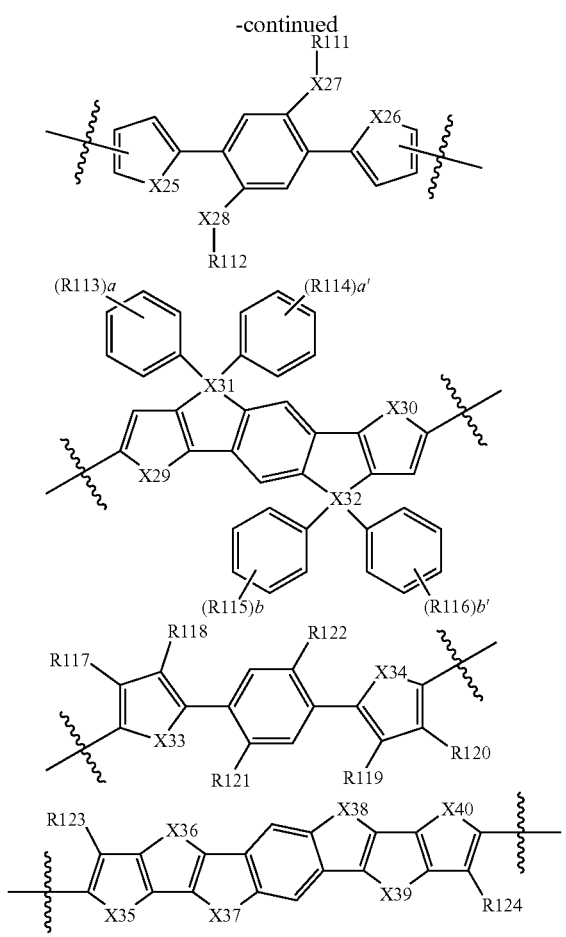

in the structures, a, a', b, and b' are each an integer from 1 to 5, when a, a', b, and b' are each 2 or more, each of R113, R114, R115 and R116 is the same as or different from each other, X11 to X30 and X33 to X40 are the same as or different from each other, and are each independently S, O, Se, Te, $NR_d$, $CR_dR_e$, $SiR_dR_e$, $PR_d$, or $GeR_dR_e$, X31 and X32 are the same as or different from each other, and are each independently C, Si, or Ge, and R101 to R124, $R_d$, and $R_e$ are the same as or different from each other, and are each independently hydrogen; deuterium; a halogen group; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heterocyclic group.

4. The copolymer of claim 1, wherein R11 to R18 are the same as or different from each other, and are each independently hydrogen; a halogen group; or a substituted or unsubstituted alkoxy group.

5. The copolymer of claim 1, wherein X1, X2, and Z1 to Z5 are each S.

6. The copolymer of claim 1, wherein the first conjugated monomer and the second conjugated monomer each independently comprise any one of or a combination of two or more of the following structures:

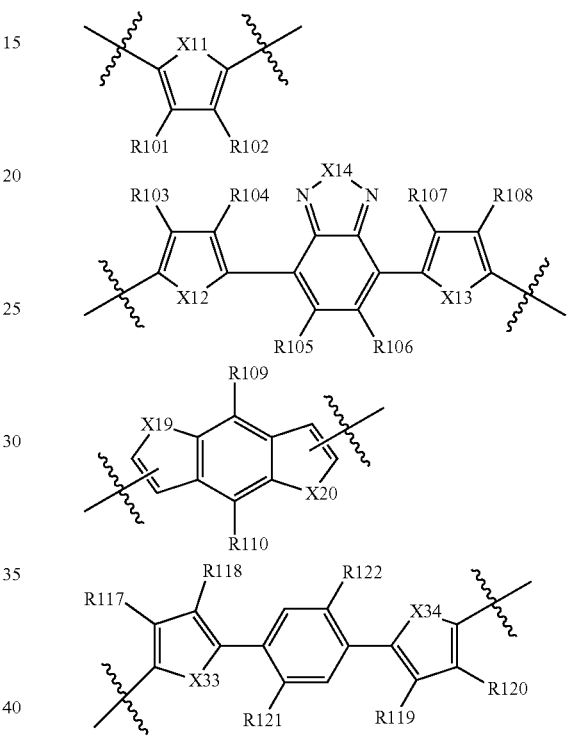

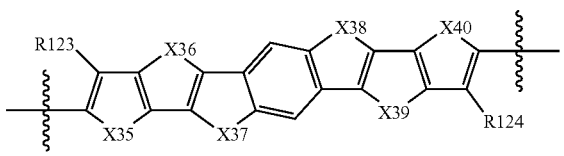

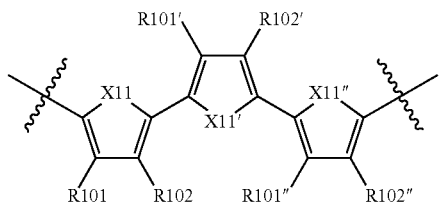

in the structures,

X11 to X14, X19, X20, X33 to X40, X11', and X11" are the same as or different from each other, and are each independently S, O, Se, Te, $NR_d$, $CR_dR_e$, $SiR_dR_e$, $PR_d$, or $GeR_dR_e$, and R101 to R110, R117 to R124, R101', R101", R102', R102", $R_d$, and $R_e$ are the same as or different from each other, and are each independently hydrogen; deuterium; a halogen group; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heterocyclic group.

7. The copolymer of claim 1, wherein the first conjugated monomer and the second conjugated monomer each independently comprise one group of or a combination of two or more of following structures:

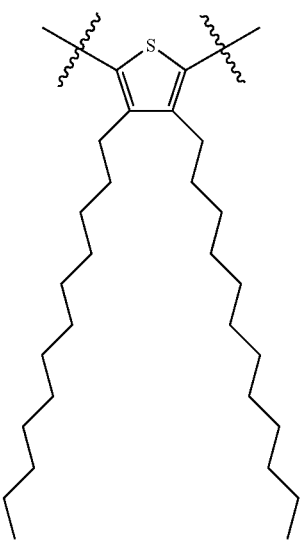

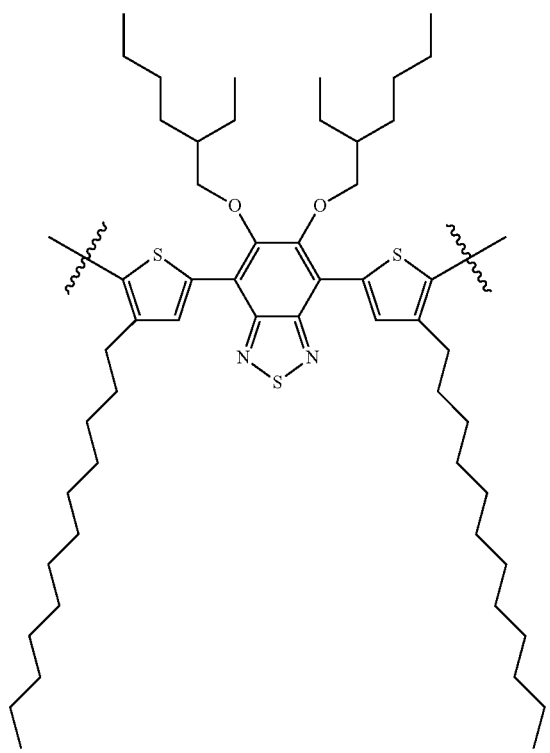

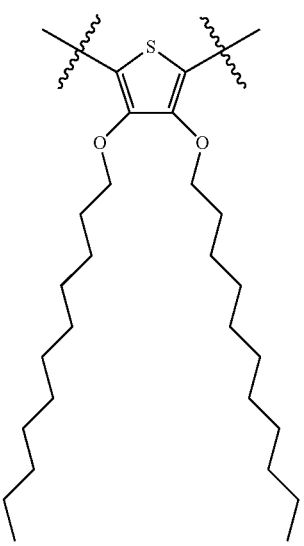

-continued

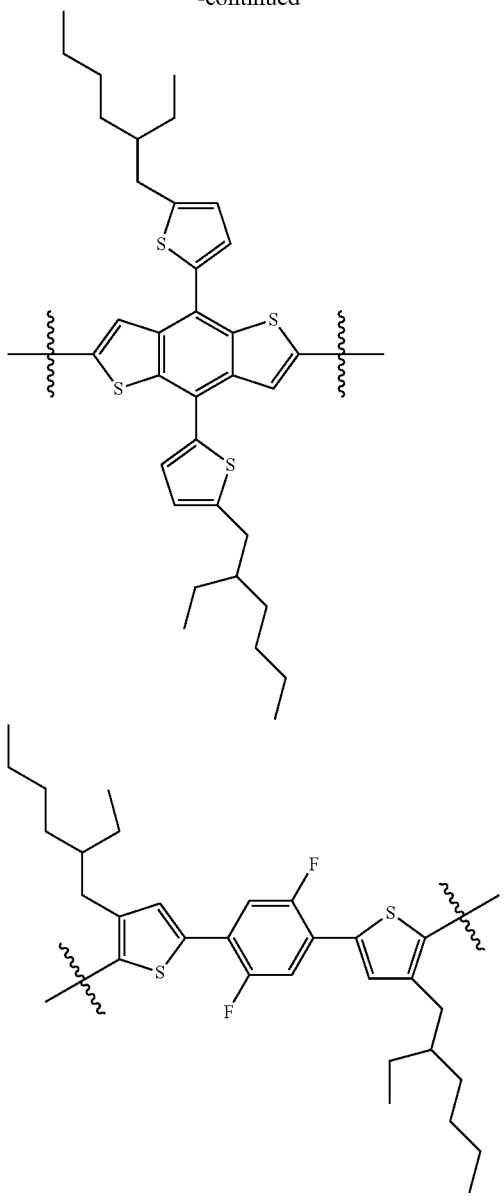

-continued

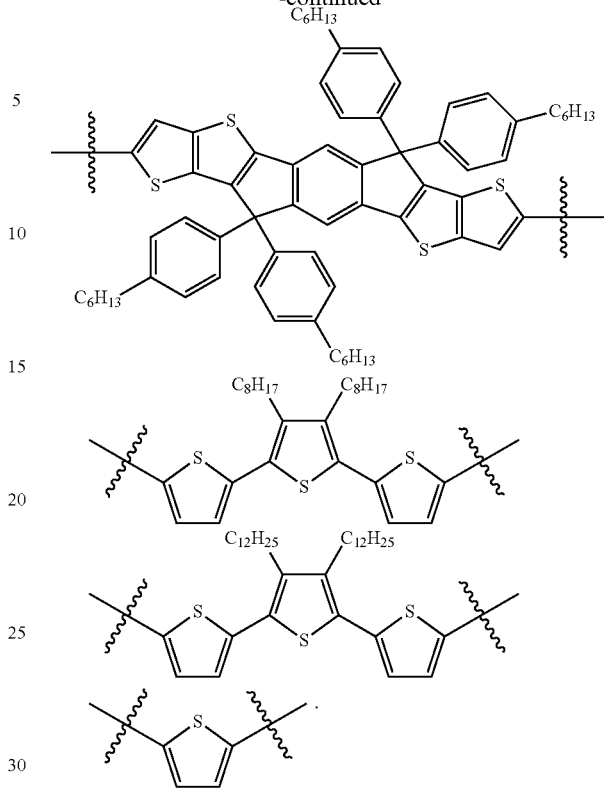

8. The copolymer of claim 1, wherein an end group of the copolymer is a substituted or unsubstituted aryl group or a substituted or unsubstituted heterocyclic group.

9. The copolymer of claim 1, wherein an end group of the copolymer is a substituted or unsubstituted phenyl group or a substituted or unsubstituted thiophene group.

10. The copolymer of claim 1, wherein R11 to R18 and R11' to R18' are the same as or different from each other, and are each independently hydrogen; a halogen group; or a substituted or unsubstituted alkoxy group.

11. The copolymer of claim 1, wherein X1, X2, X1, X2, Z1 to Z5, and Z1' to Z5' are each S.

12. The copolymer of claim 1, wherein the copolymer comprises any one of the following structures:

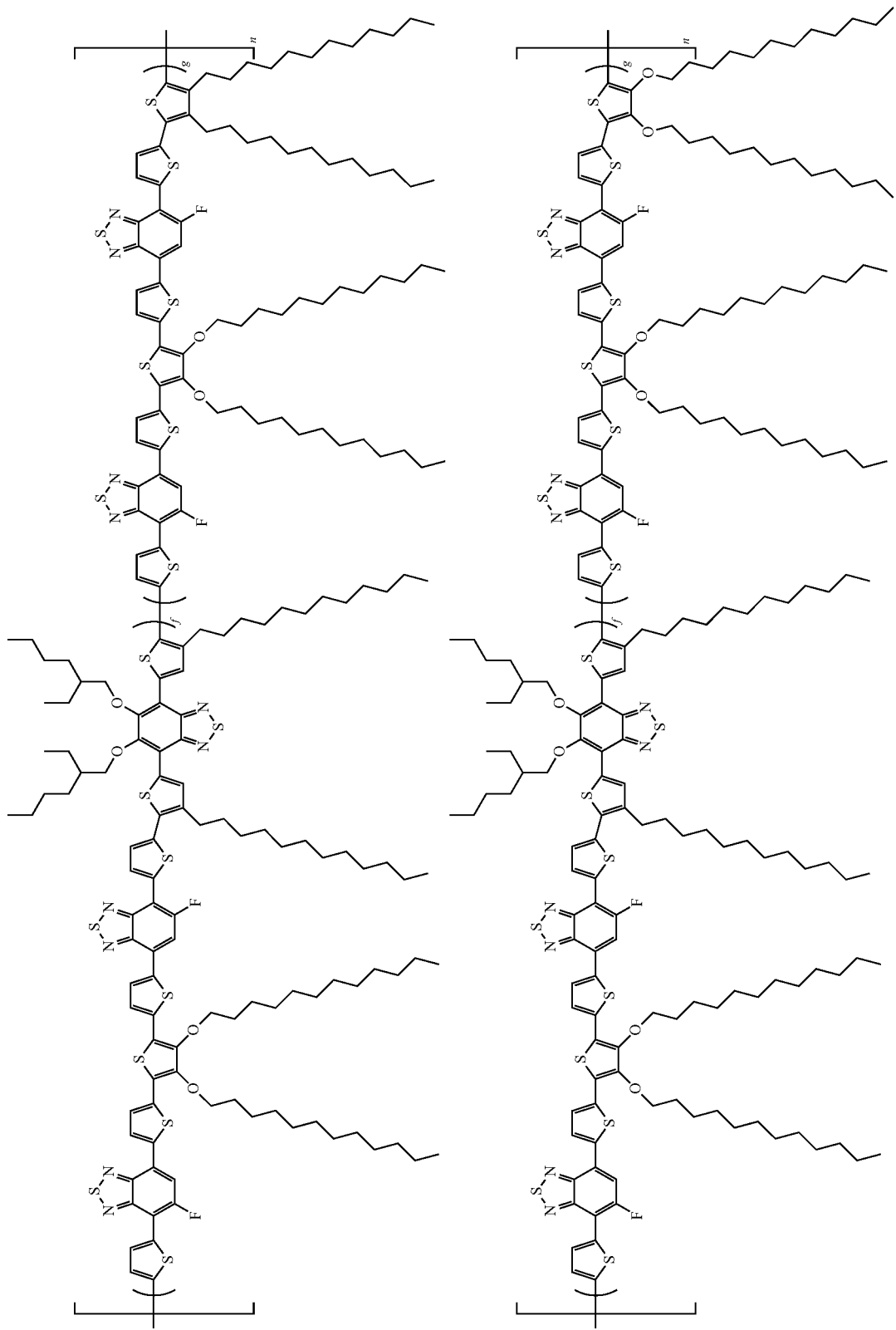

-continued
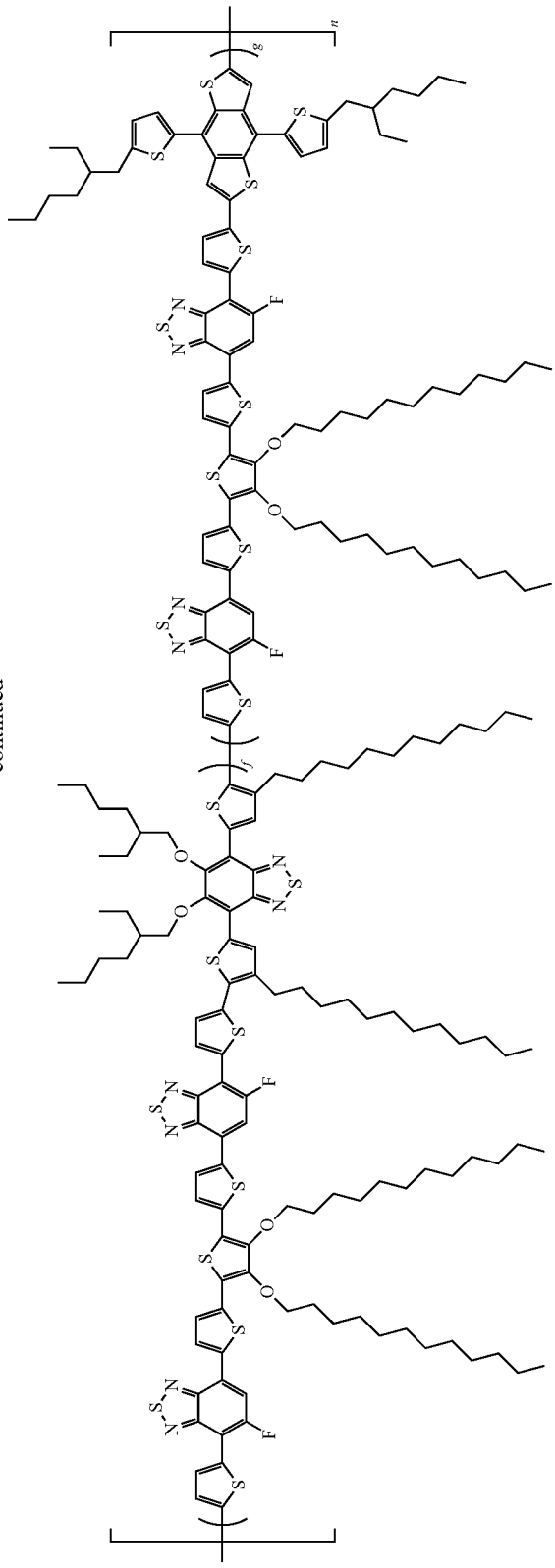
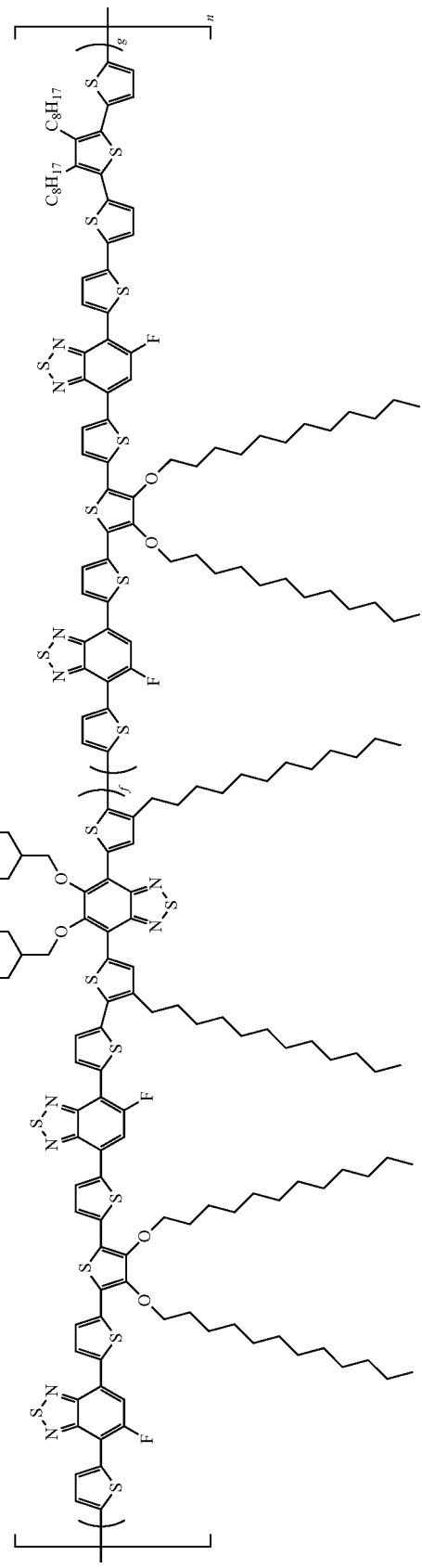

-continued
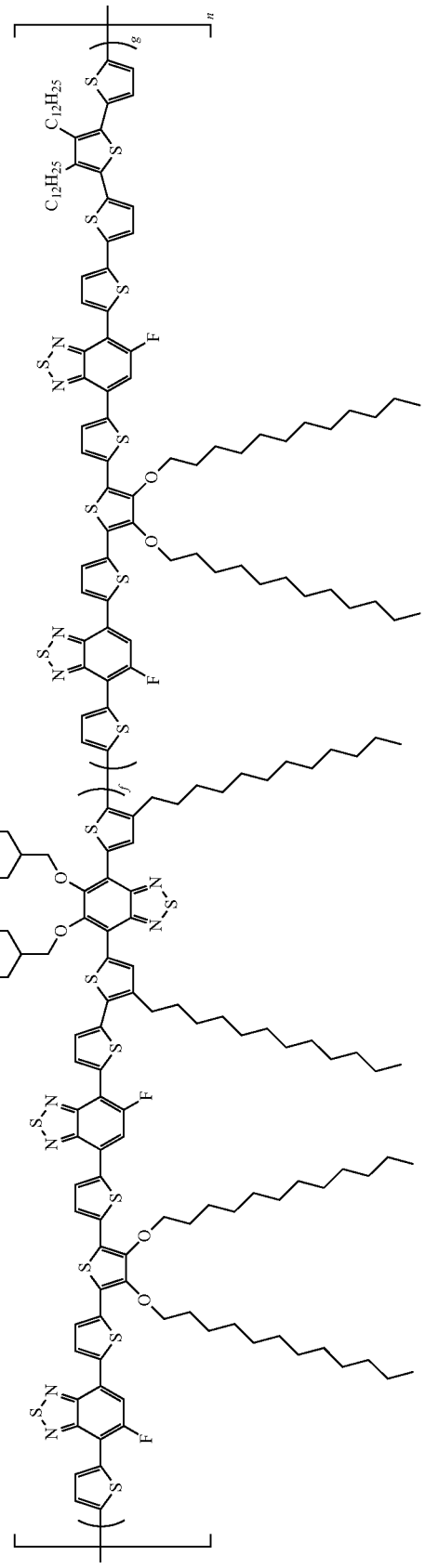
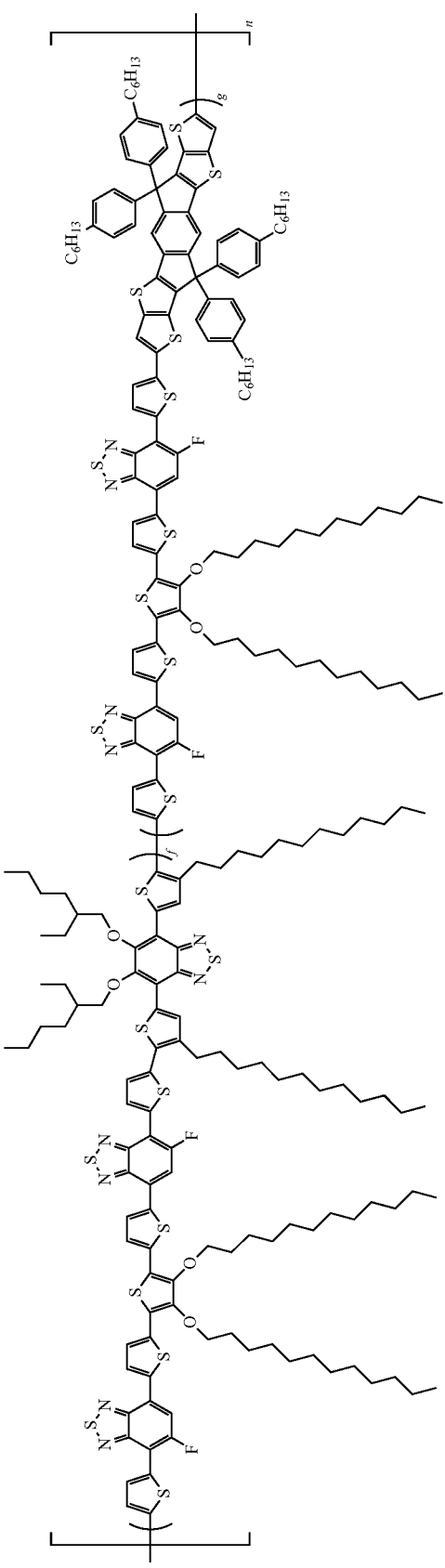

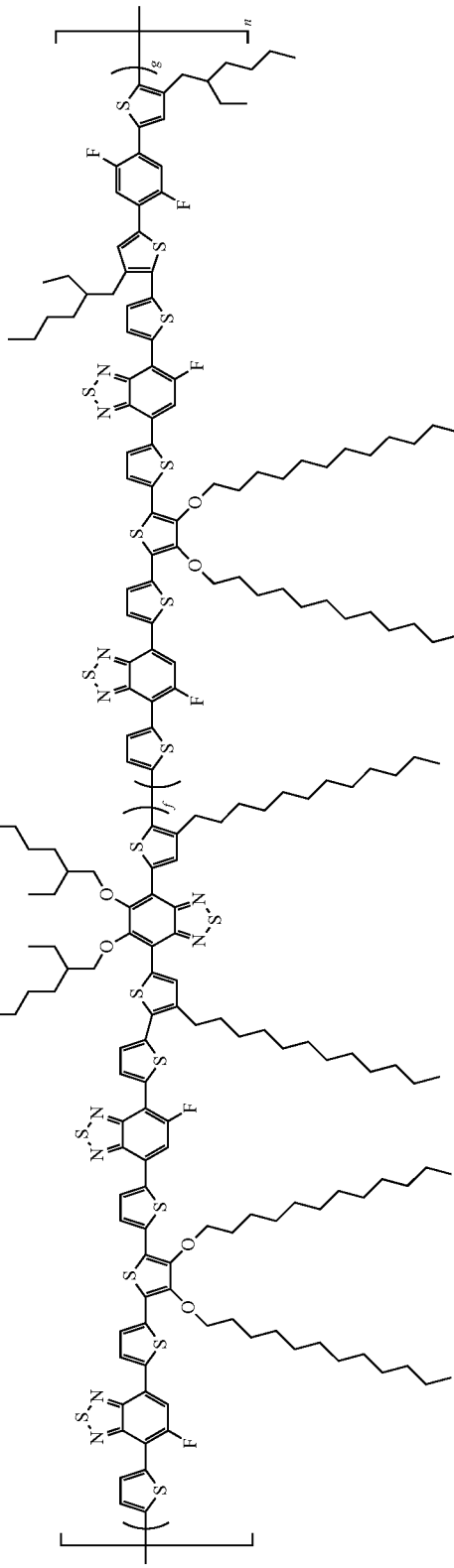
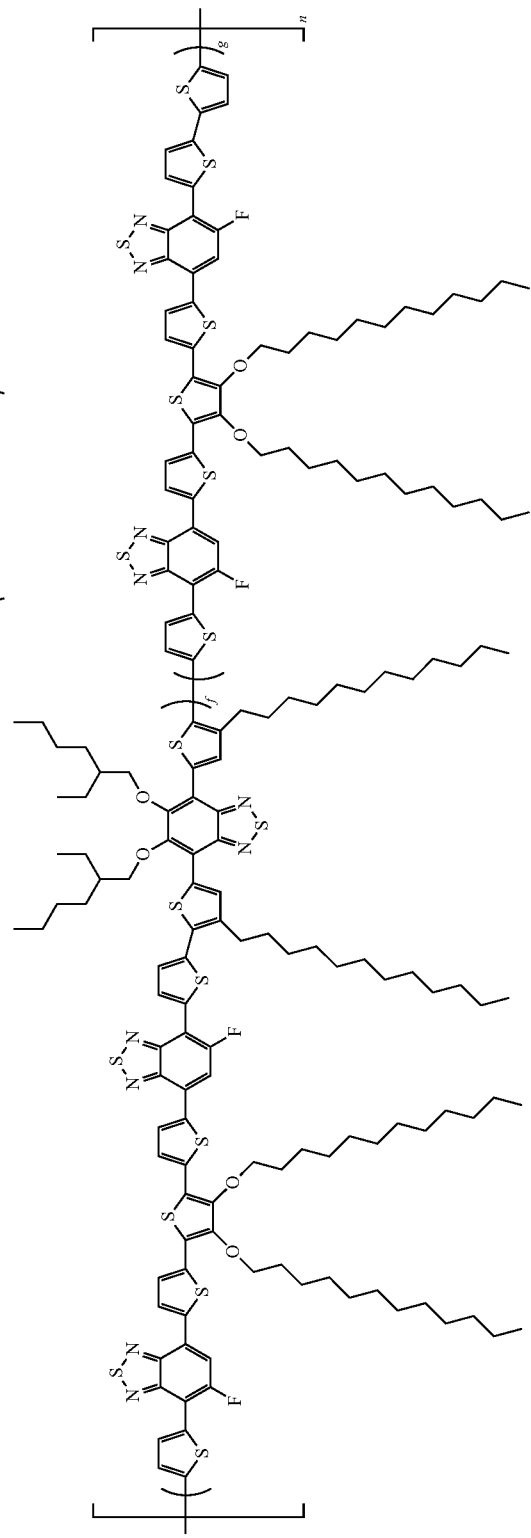

-continued
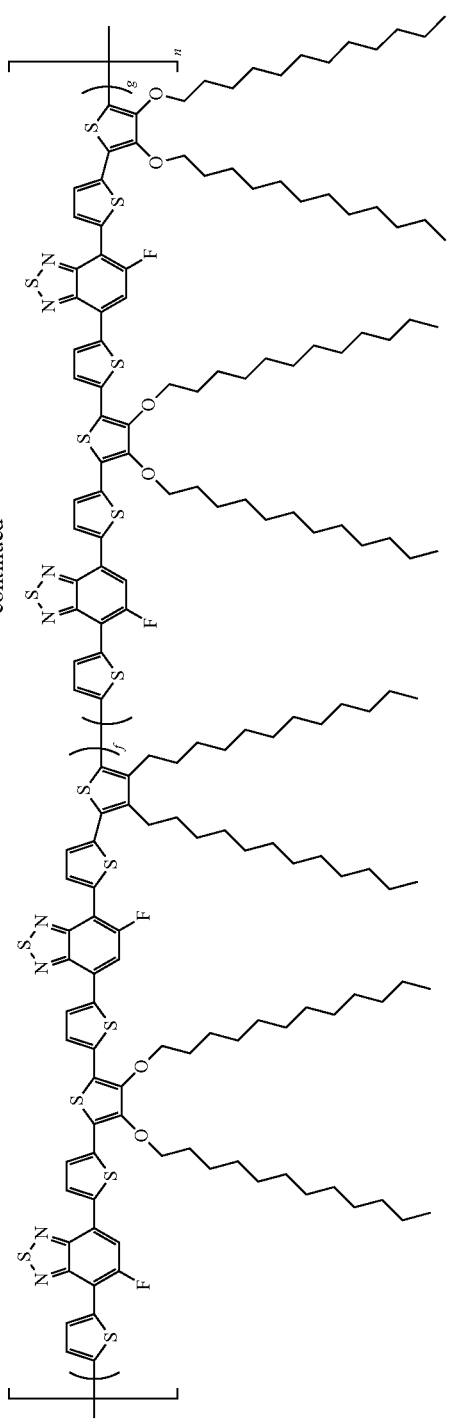
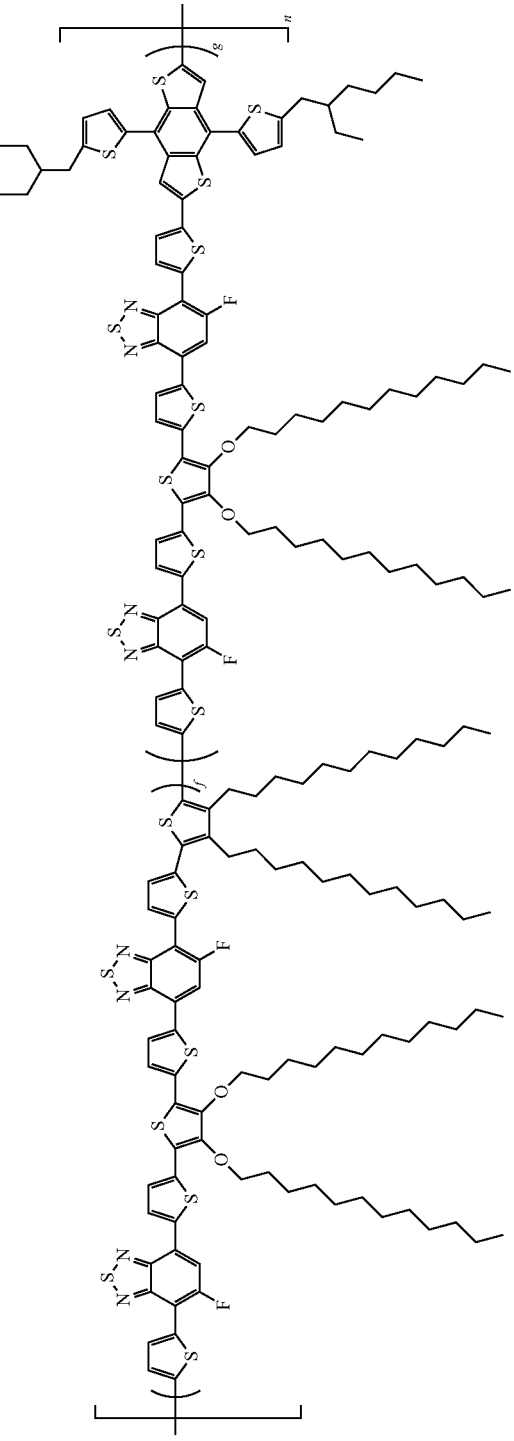

-continued
101
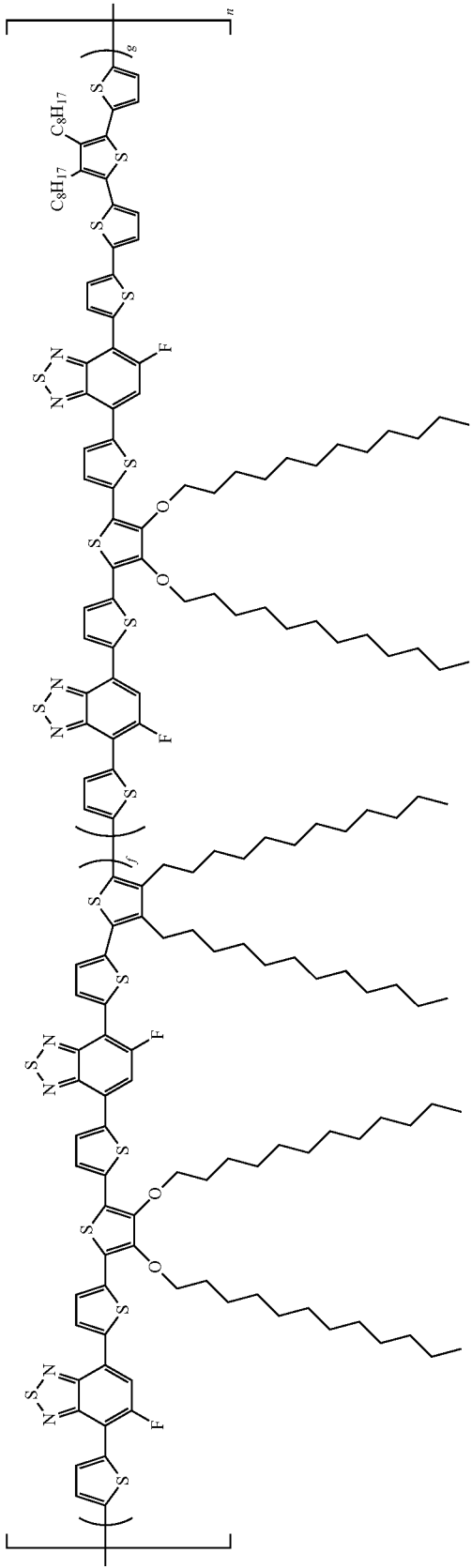
102
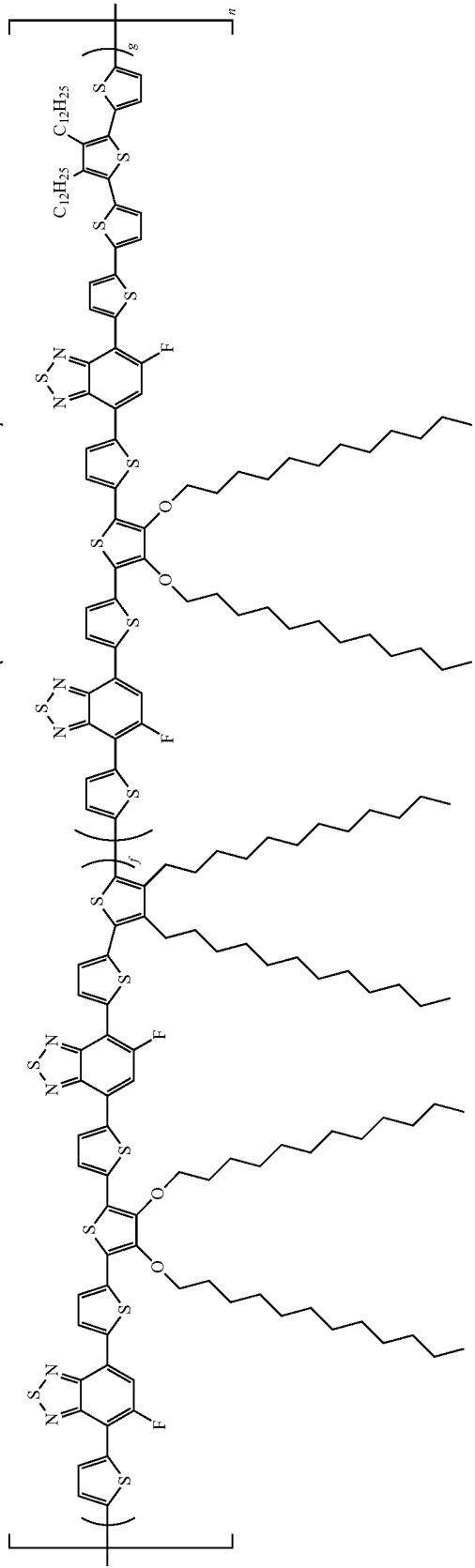

-continued
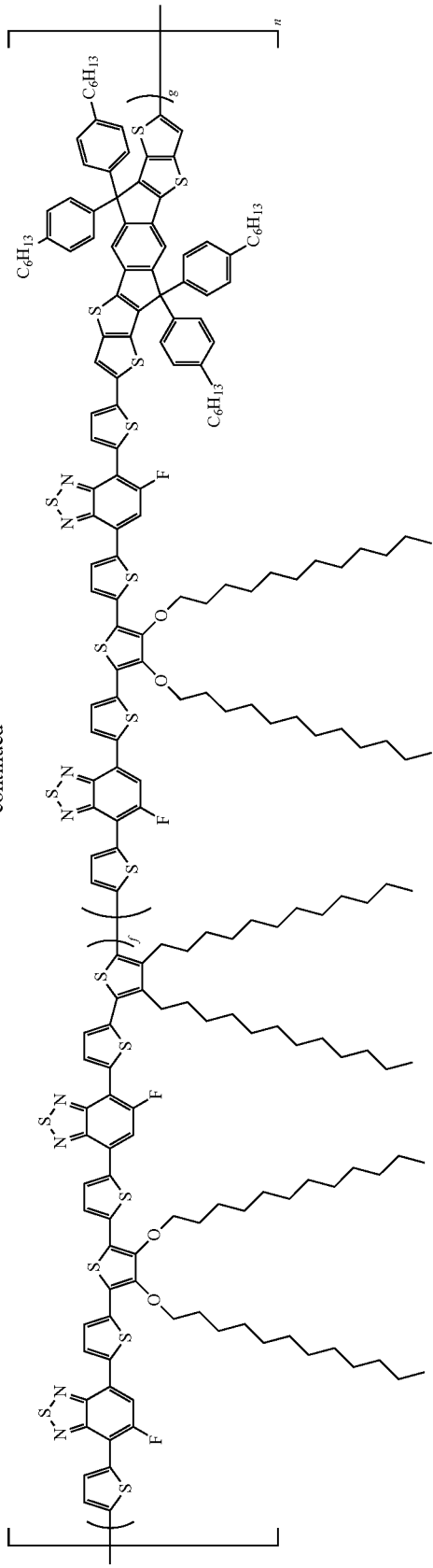
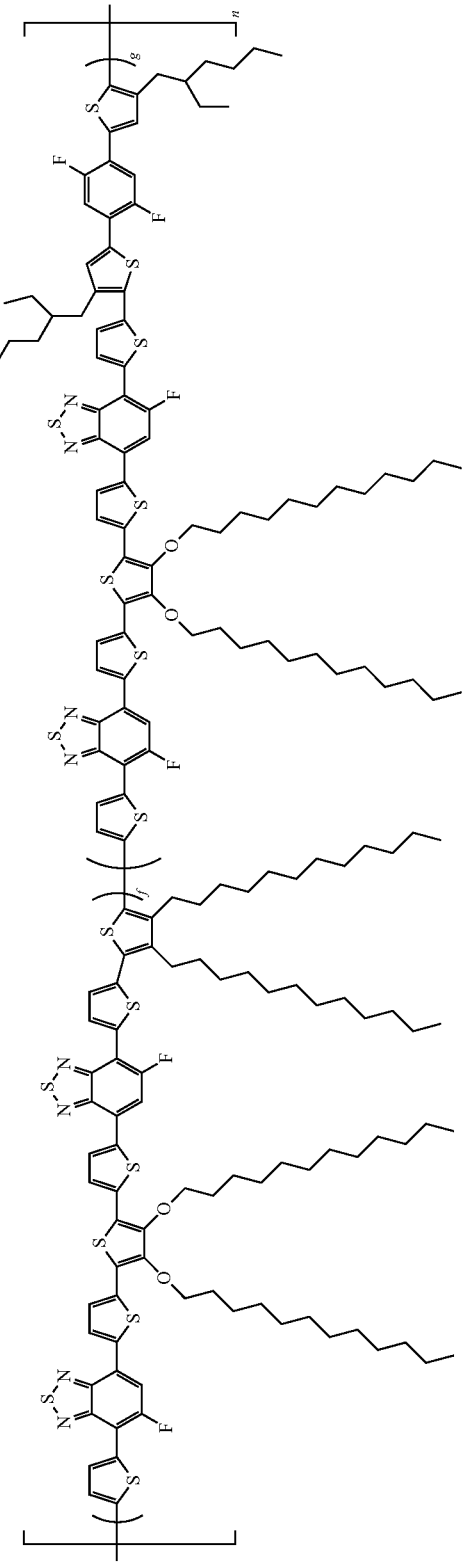

-continued
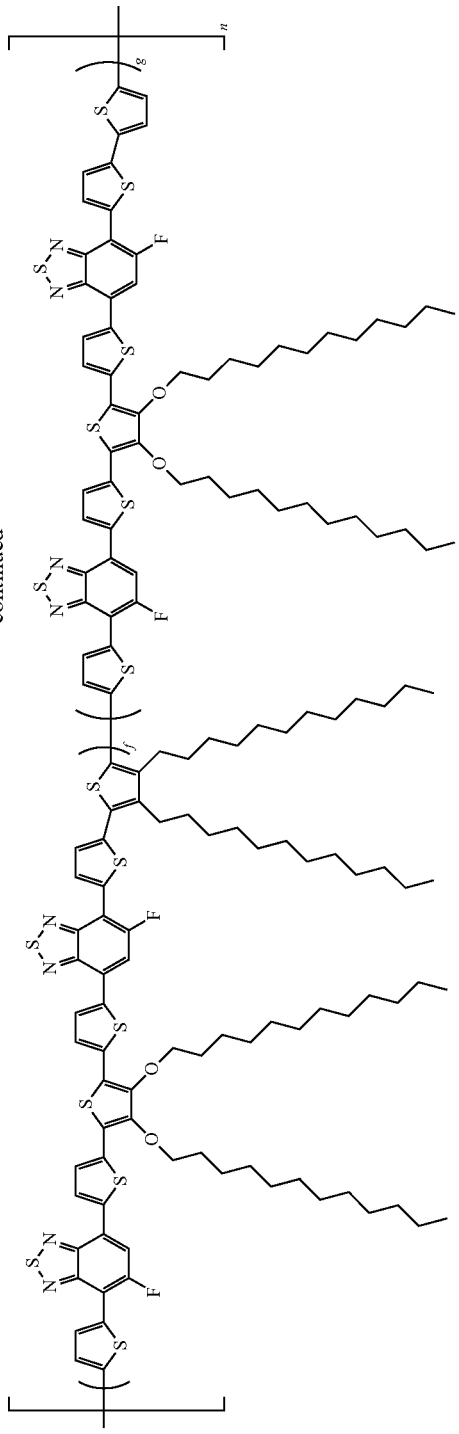
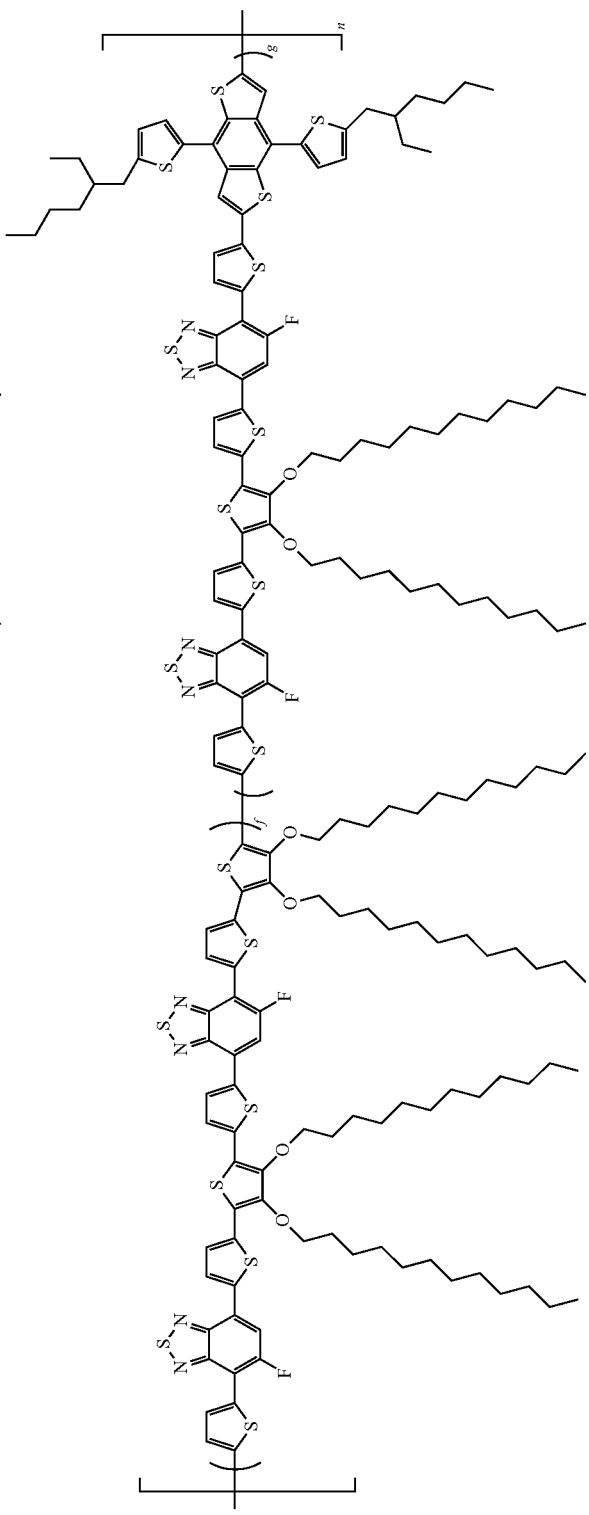

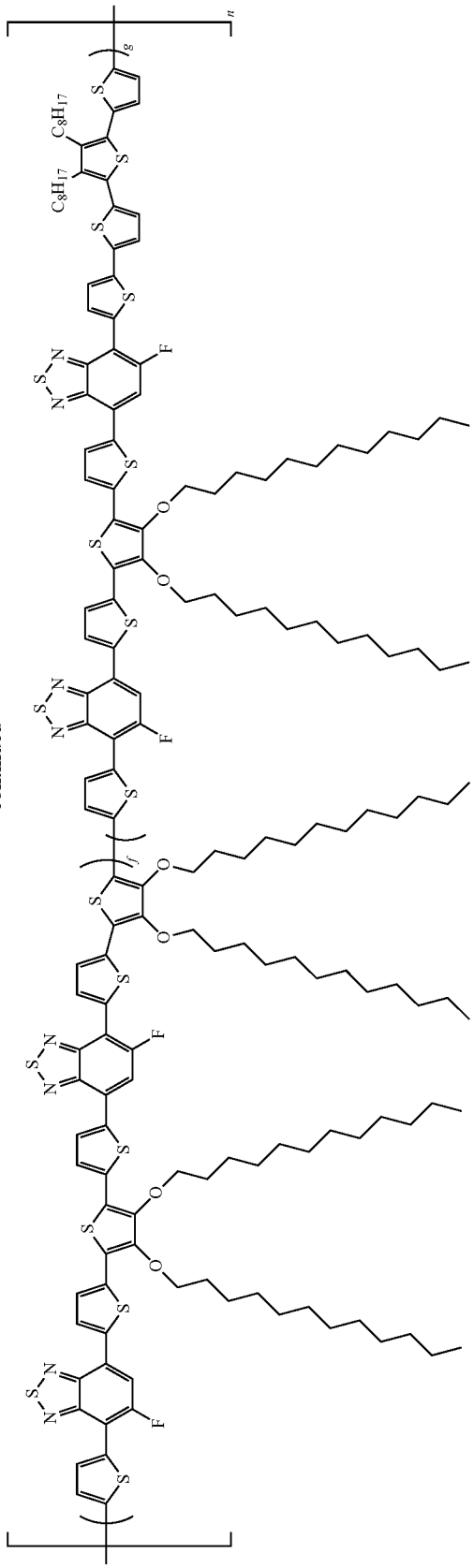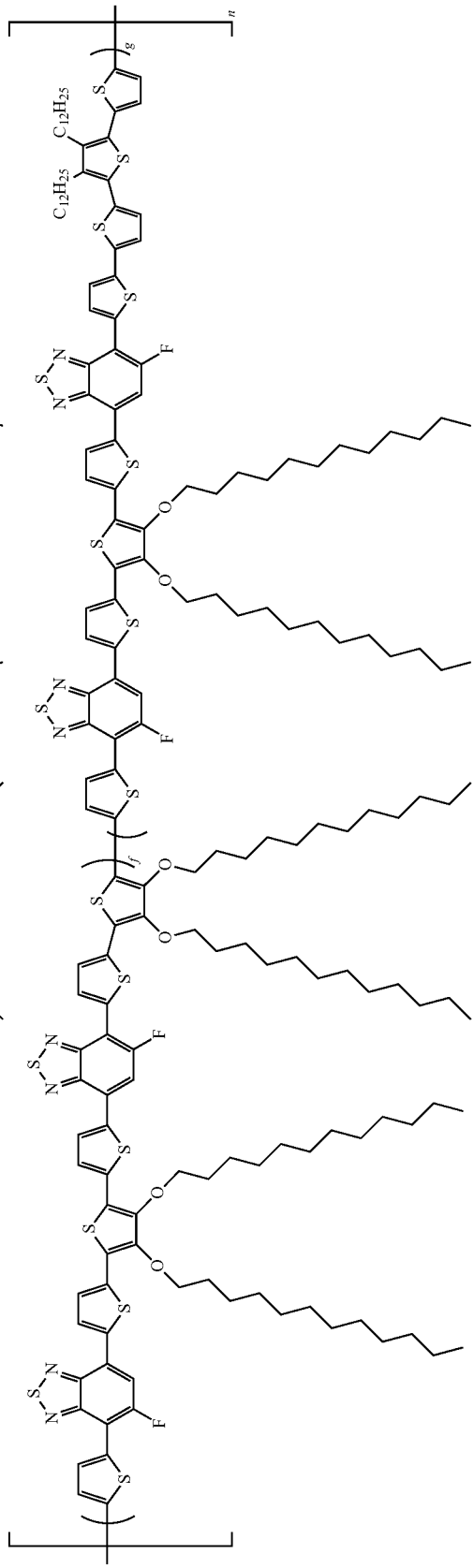

-continued
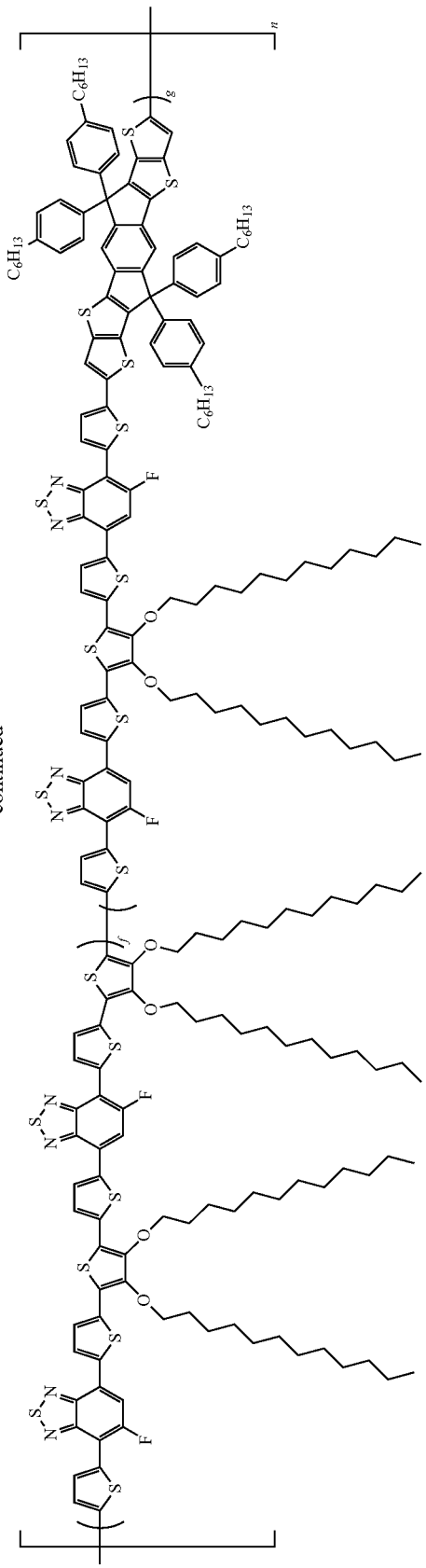
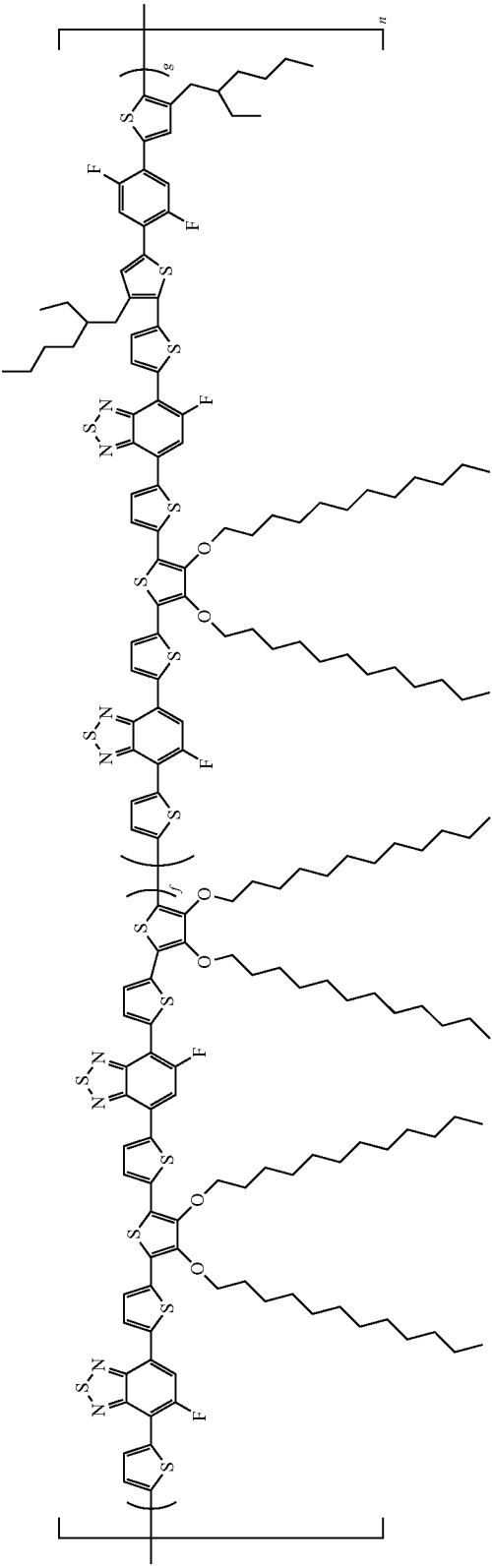

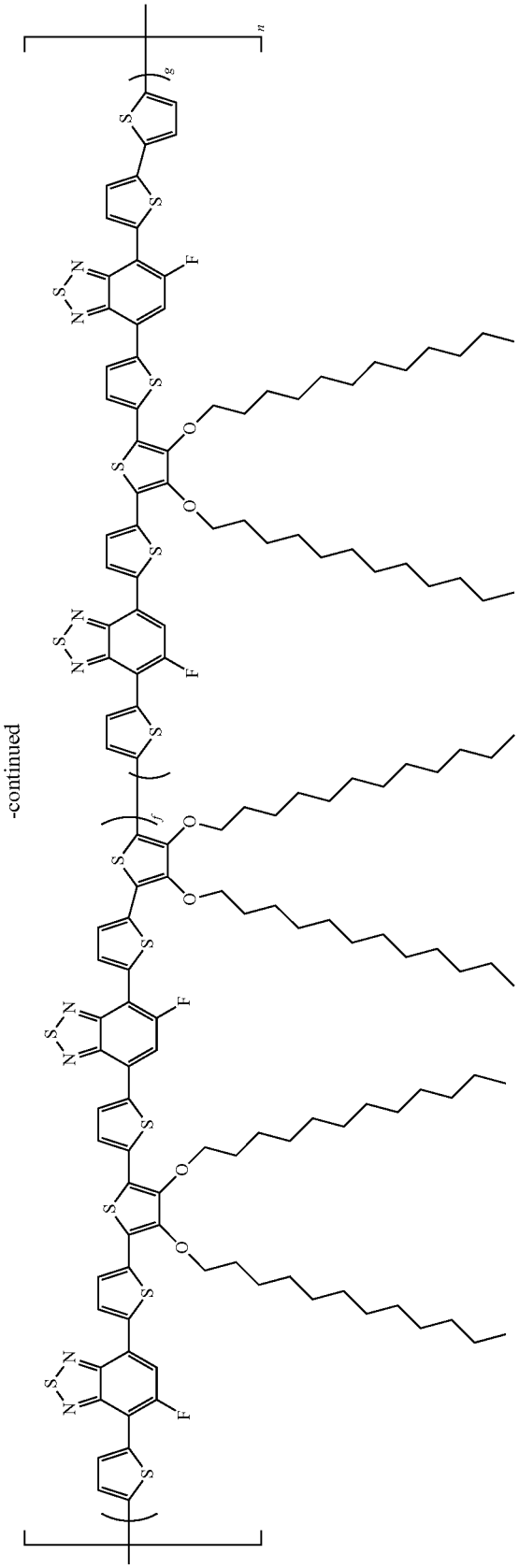

113
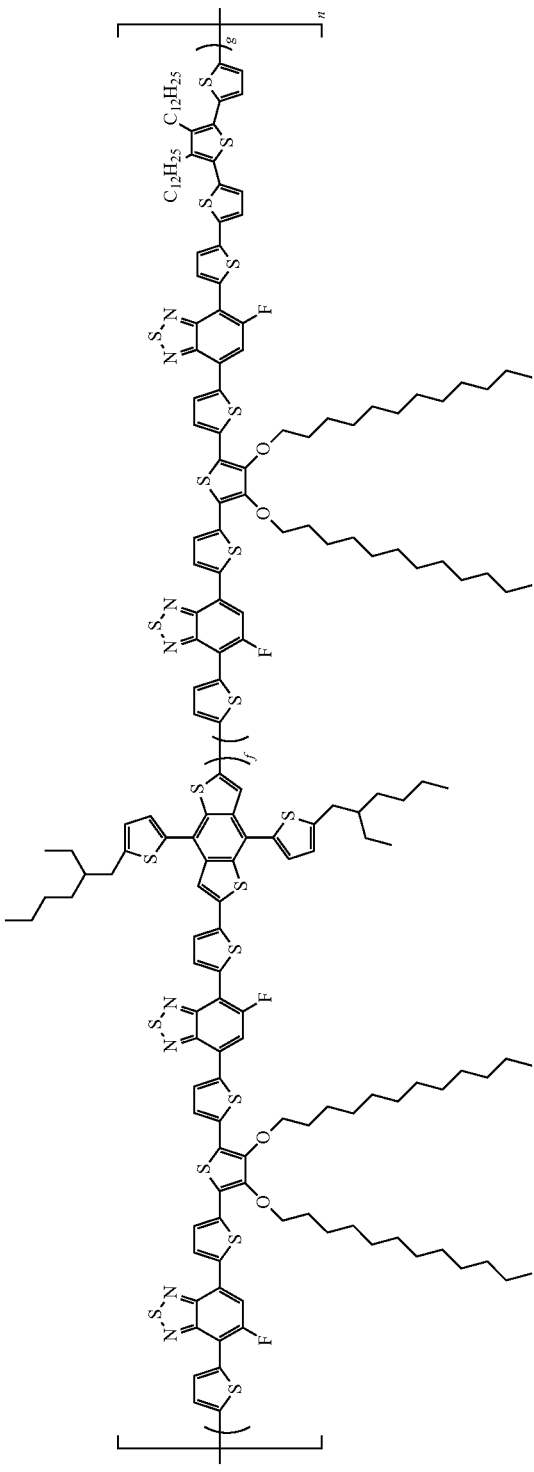
114
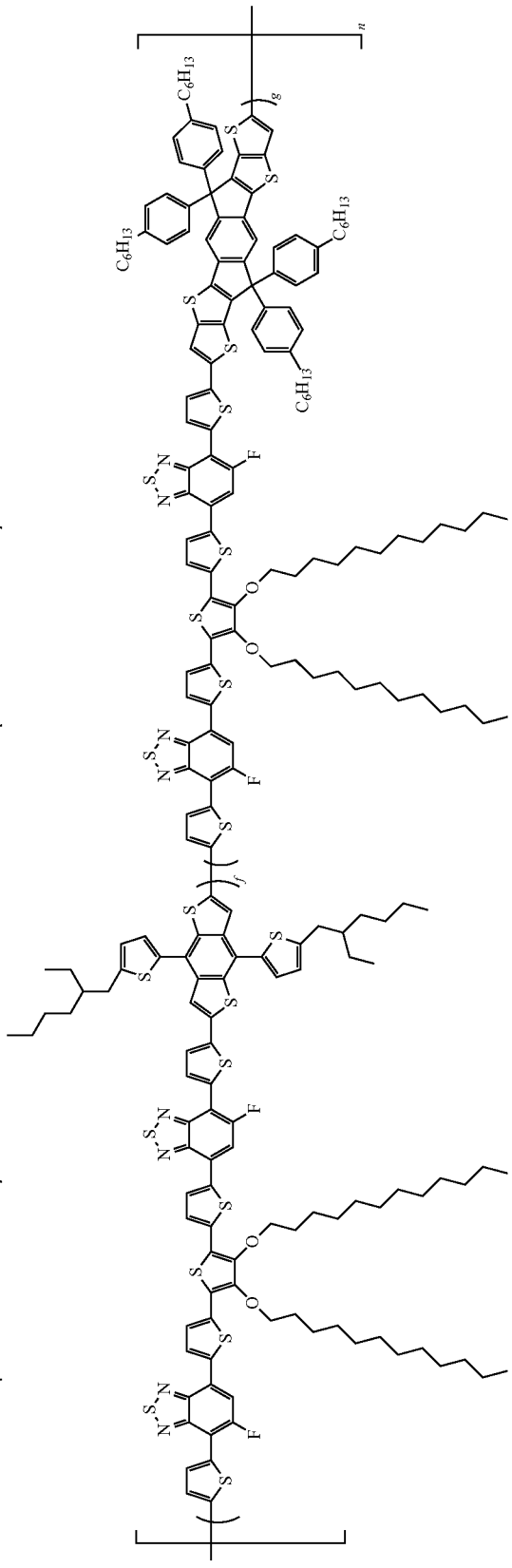

-continued
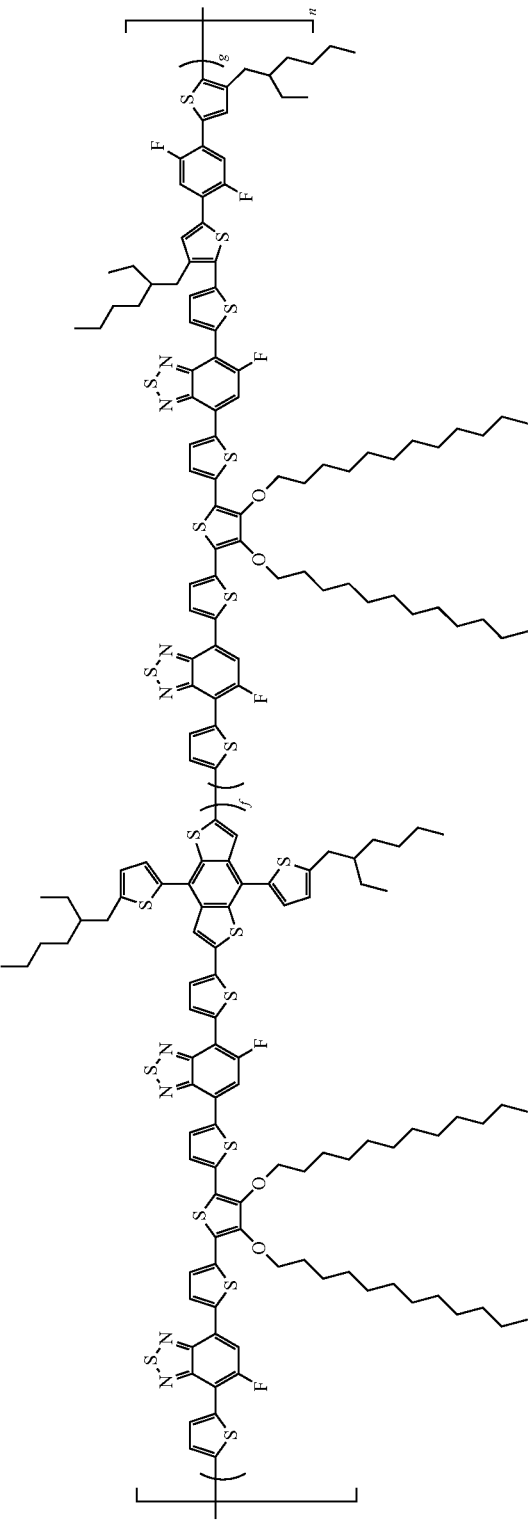
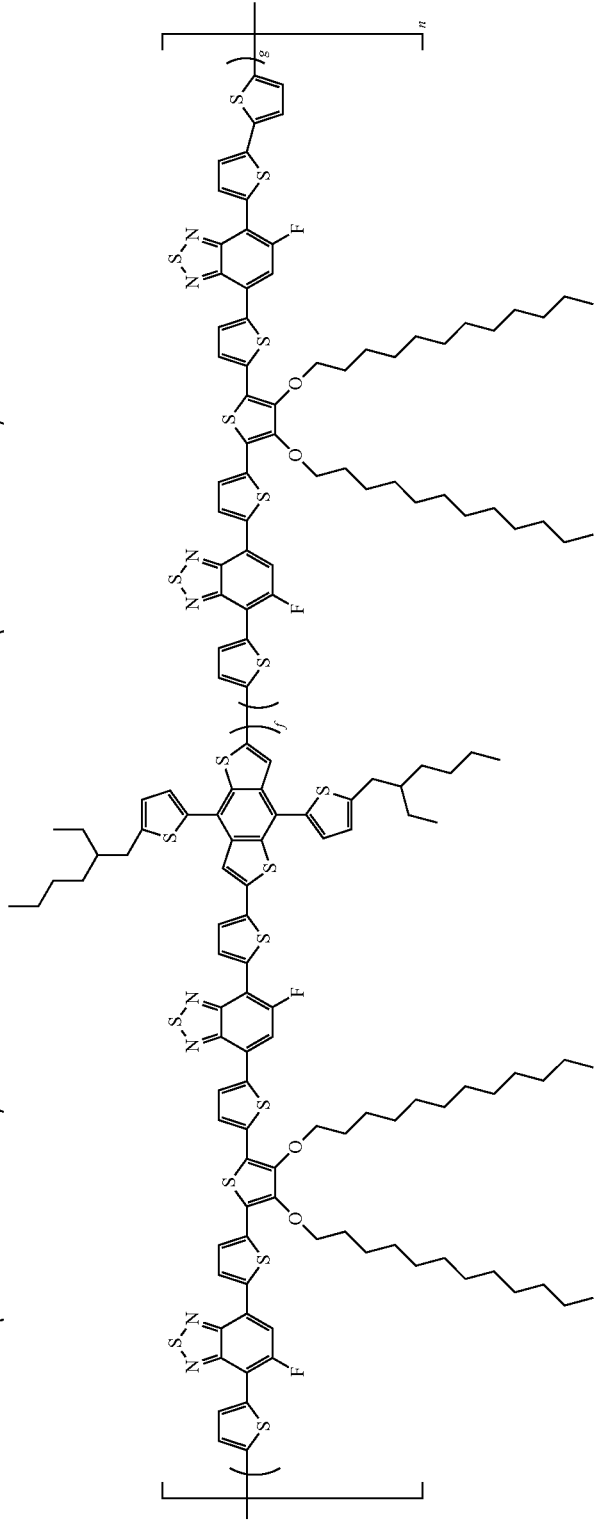

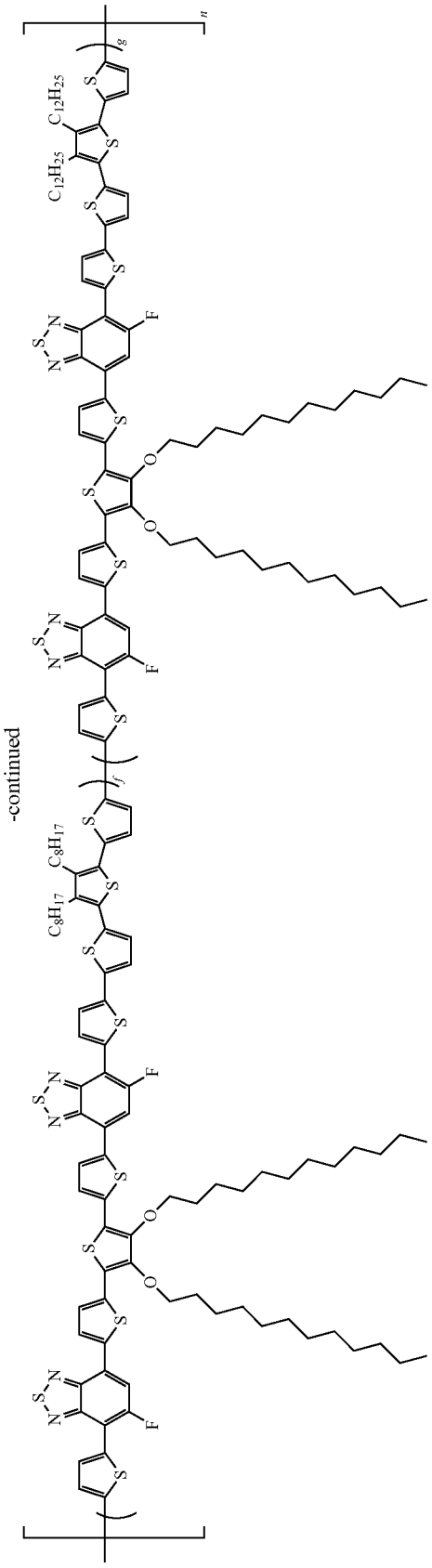
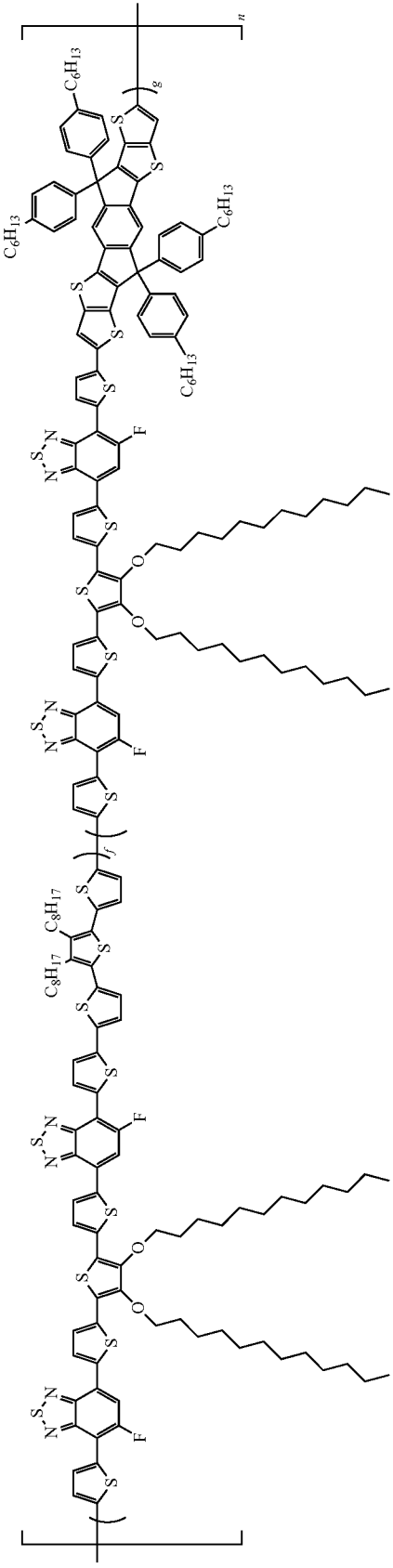

-continued
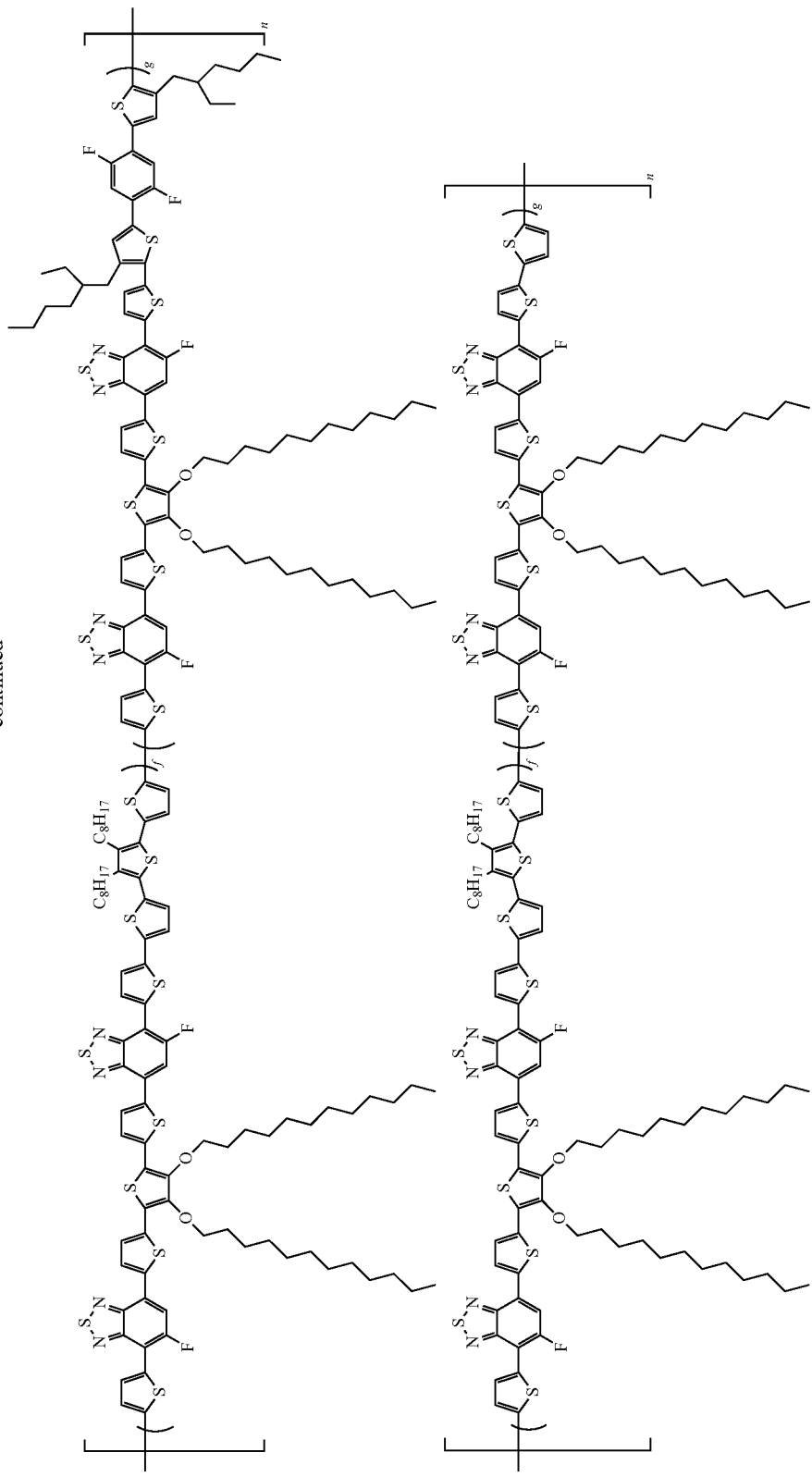

121
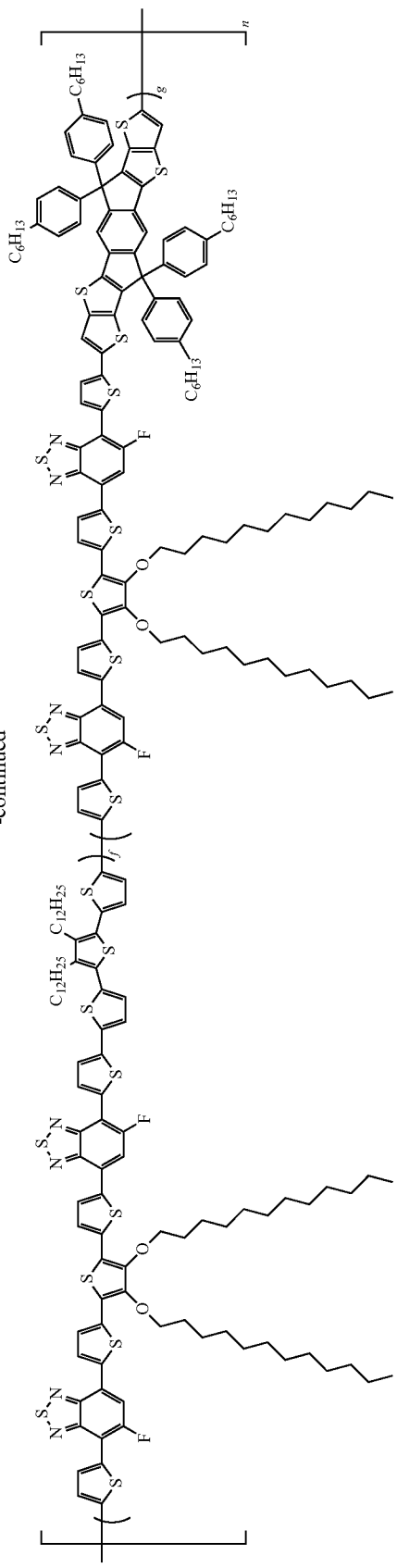
122
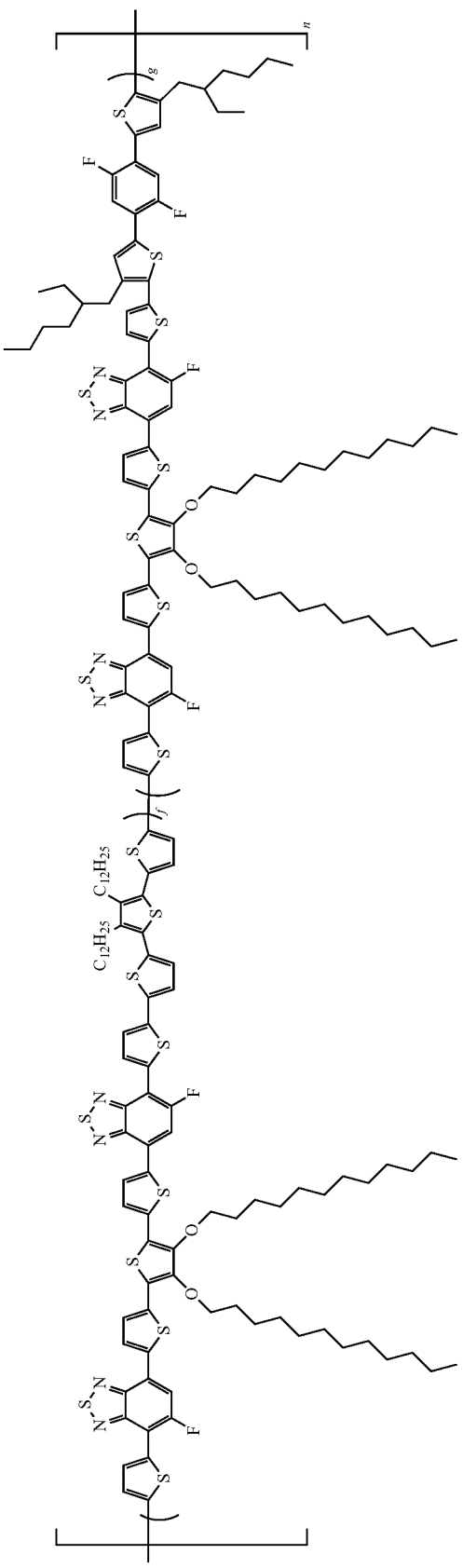

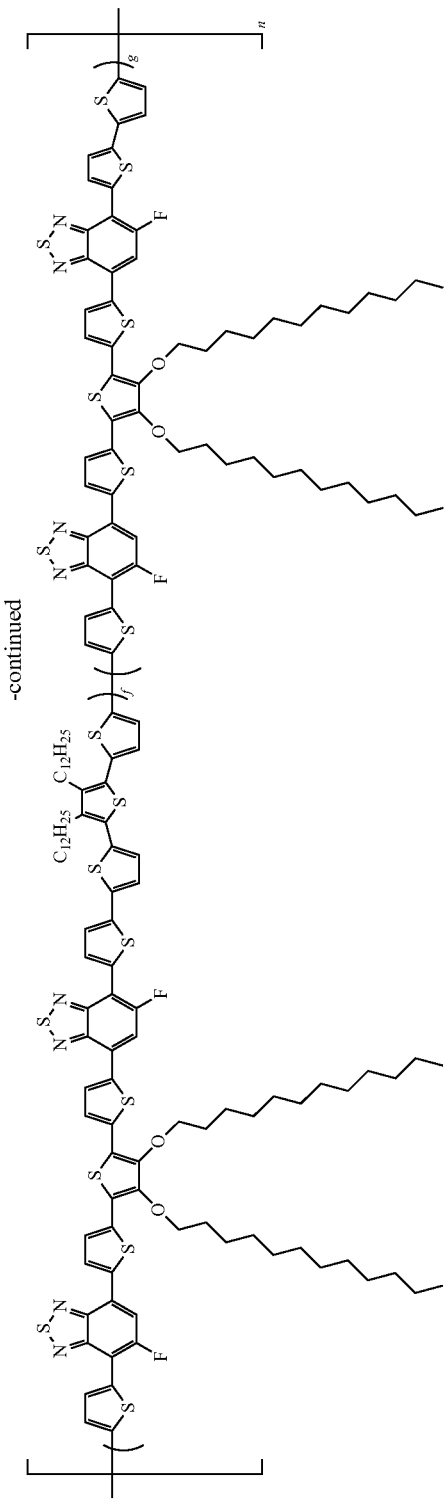
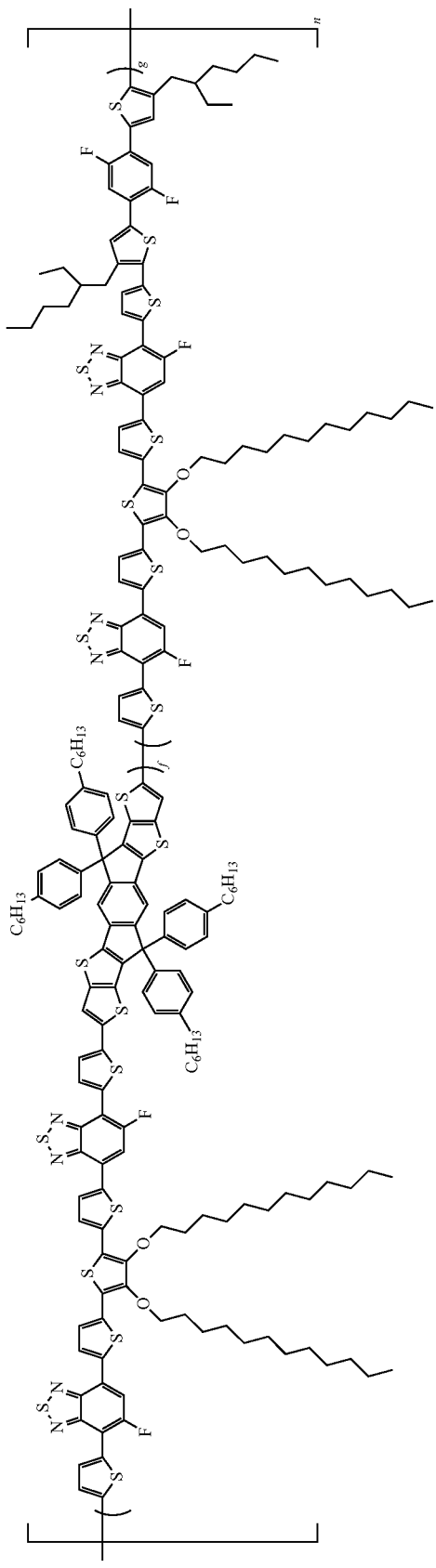

-continued
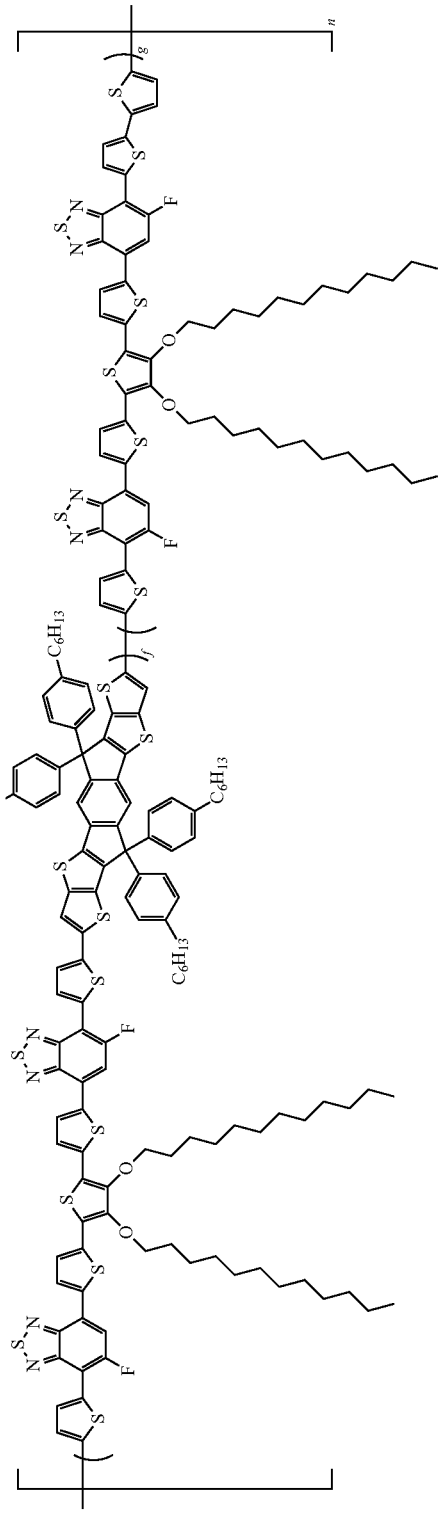
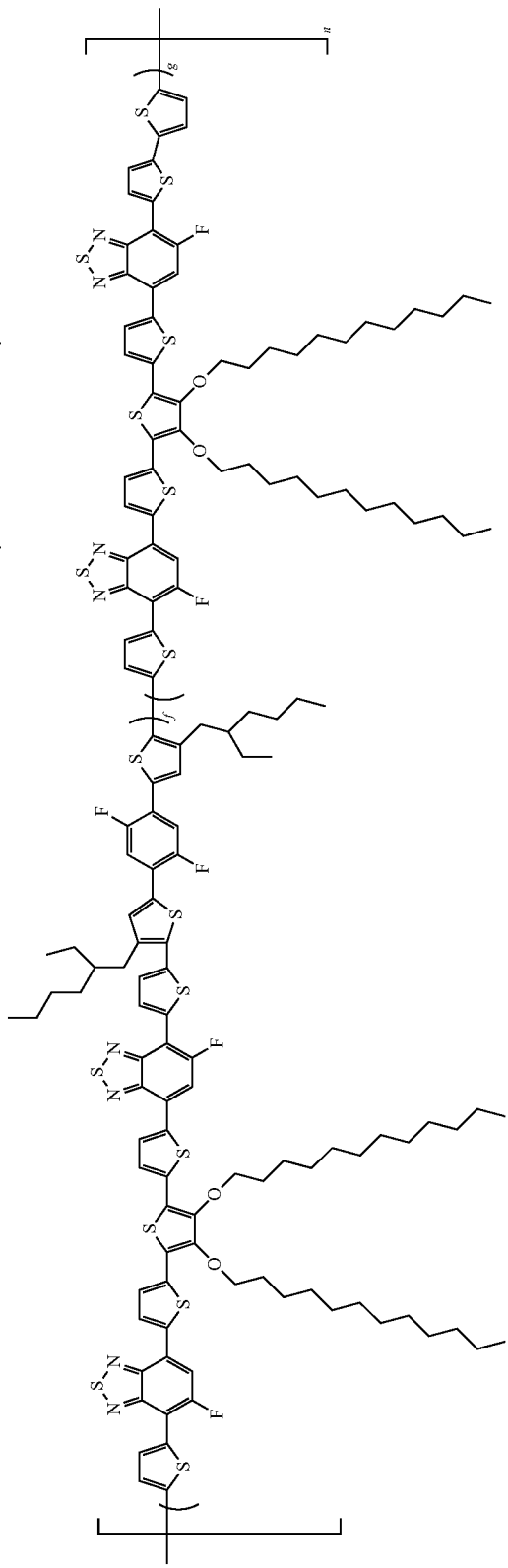

in the structures,
f is a mole fraction, and a real number of 0<f<1,
g is a mole fraction, and a real number of 0<g<1,
f+g=1, and
n is the number of repeating units in the structures, and an integer from 1 to 10,000.

13. The copolymer of claim 12, wherein f and g are the same as or different from each other, and are each a real number from 0.3 to 0.7.

14. An organic solar cell comprising:
a first electrode;
a second electrode provided to face the first electrode; and
an organic material layer having one or more layers provided between the first electrode and the second electrode and comprising a photoactive layer,
wherein one or more layers of the organic material layer comprise the copolymer of claim 1.

15. The organic solar cell of claim 14, wherein the organic material layer comprises a hole transport layer, a hole injection layer or a layer which simultaneously transports and injects holes, and
the hole transport layer, the hole injection layer, or the layer which simultaneously transports and injects holes comprises the copolymer.

16. The organic solar cell of claim 14, wherein the organic material layer comprises an electron injection layer, an electron transport layer or a layer which simultaneously injects and transports electrons, and
the electron injection layer, the electron transport layer or the layer which simultaneously injects and transports electrons comprises the copolymer.

17. The organic solar cell of claim 14, wherein the photoactive layer comprises an electron donor and an electron acceptor, and
the electron donor comprises the copolymer.

18. The organic solar cell of claim 14, wherein the organic solar cell further comprises an organic material layer having one layer or two or more layers selected from the group comprising of a hole injection layer, a hole transport layer, a hole blocking layer, a charge generation layer, an electron blocking layer, an electron injection layer, and an electron transport layer.

19. A method for preparing a copolymer, the method comprising:
allowing a first compound represented by the following Formula 1, a second compound represented by the following Formula 2, and a third compound represented by the following Formula 3 to react with one another:

in Formulae 1 to 3,
m1 and m2 are the same as or different from each other, and are each independently an integer from 1 to 5,
when m1 and m2 are each 2 or more, each of

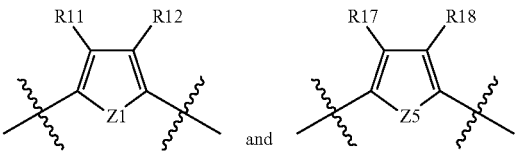

is the same as or different from each other,
q1 and q2 are the same as or different from each other, and are each independently an integer from 1 to 5,
when q1 and q2 are each 2 or more, each of

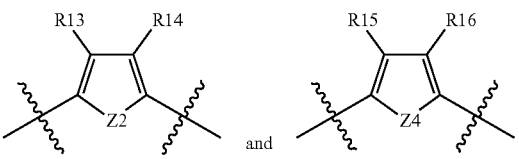

is the same as or different from each other,
A1, A1', A2, A2', A3, and A3' are the same as or different from each other, and are each independently a halogen group; a substituted or unsubstituted boron group; or —SnR$_a$R$_b$R$_c$,
E1 is a first conjugated monomer,
E2 is a second conjugated monomer different from the first conjugated monomer,
X1, X2, and Z1 to Z5 are the same as or different from each other, and are each independently S, O, Se, Te, NR, CRR', SiRR', PR, or GeRR',
R1 and R4 are the same as or different from each other, and are each independently deuterium; a halogen group; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted

[Formula 1]

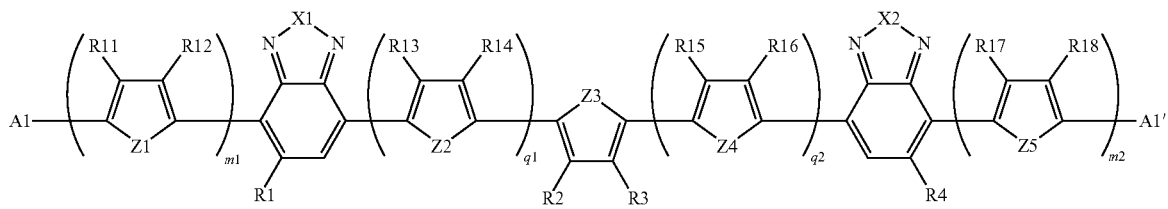

[Formula 2]

A2—E1—A2'

[Formula 3]

A3—E2—A3' alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heterocyclic group, $R_a$, $R_b$, $R_c$, R, R', and R11 to R18 are the same as or different from each other, and are each independently hydrogen; deuterium; a halogen group; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heterocyclic group, and R2 and R3 are the same as or different from each other, and are each independently a substituted or unsubstituted alkoxy group or a substituted or unsubstituted aryloxy group.

20. The method of claim 19, wherein the method comprises: dissolving a first compound, a second compound, and a third compound in a solvent.

* * * * *